US008465553B2

(12) United States Patent
Kuge et al.

(10) Patent No.: US 8,465,553 B2
(45) Date of Patent: Jun. 18, 2013

(54) PIGMENT DISPERSION COMPOSITION, COLORED CURABLE COMPOSITION, COLOR FILTER FOR SOLID-STATE IMAGE SENSOR AND METHOD OF PRODUCING THE SAME, AND SOLID-STATE IMAGE SENSOR

(75) Inventors: Toshihito Kuge, Shizuoka-ken (JP); Nobuo Seto, Shizuoka-ken (JP); Masahiro Higashi, Shizuoka-ken (JP); Keiichi Tateishi, Shizuoka-ken (JP); Hideki Takakuwa, Shizuoka-ken (JP); Kaoru Aoyagi, Shizuoka-ken (JP); Hiroshi Taguchi, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/511,955

(22) PCT Filed: Jan. 7, 2011

(86) PCT No.: PCT/JP2011/050596

§ 371 (c)(1), (2), (4) Date: May 24, 2012

(87) PCT Pub. No.: WO2011/087114

PCT Pub. Date: Jul. 21, 2011

(65) Prior Publication Data

US 2012/0286145 A1 Nov. 15, 2012

(30) Foreign Application Priority Data

Jan. 15, 2010 (JP) ................................ 2010-007490
Apr. 27, 2010 (JP) ................................ 2010-102596

(51) Int. Cl.
*C09B 67/00* (2006.01)

(52) U.S. Cl.
USPC .............. 8/637.1; 8/639; 8/688; 8/690; 8/691

(58) Field of Classification Search
USPC .......................... 8/637.1, 639, 688, 690, 691
See application file for complete search history.

(56) References Cited

FOREIGN PATENT DOCUMENTS

| | | | | |
|---|---|---|---|---|
| JP | 63-148267 | A | | 6/1988 |
| JP | 63-158561 | A | | 7/1988 |
| JP | 1-152449 | A | | 6/1989 |
| JP | 4-27959 | A | | 1/1992 |
| JP | 4-88349 | A | | 3/1992 |
| JP | 5-5067 | A | | 1/1993 |
| JP | 6-75375 | A | | 3/1994 |
| JP | 2003237240 | A | * | 8/2003 |
| WO | 2005/052074 | A1 | | 6/2005 |
| WO | 2010/008081 | A1 | | 1/2010 |

OTHER PUBLICATIONS

STIC Search Report dated Jan. 15, 2013.*

* cited by examiner

*Primary Examiner* — Eisa Elhilo
(74) *Attorney, Agent, or Firm* — Sughrue Mion, PLLC

(57) ABSTRACT

The invention provides a pigment dispersion composition including an azo pigment represented by formula (1), in which the azo pigment represented by formula (1) does not have an ionic hydrophilic group, an azo pigment derivative and a dispersant. In formula (1), G represents a hydrogen atom, an aliphatic group, an aryl group or a heterocyclic group; $R_1$ represents an amino group, an aliphatic oxy group, an aliphatic group, an aryl group or a heterocyclic group; $R_2$ represents a substituent; A represents a heterocyclic group; m represents an integer of 0 to 5; and n represents an integer of 1 to 4, wherein: when n=2, the azo pigment is a dimer formed via $R_1$, $R_2$, A or G; when n=3, the azo pigment is a a trimer formed via $R_1$, $R_2$, A or G; and when n=4, the azo pigment is a tetramer formed via $R_1$, $R_2$, A or G.

(1)

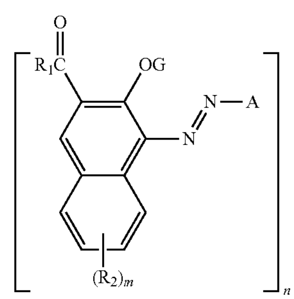

11 Claims, No Drawings

PIGMENT DISPERSION COMPOSITION, COLORED CURABLE COMPOSITION, COLOR FILTER FOR SOLID-STATE IMAGE SENSOR AND METHOD OF PRODUCING THE SAME, AND SOLID-STATE IMAGE SENSOR

TECHNICAL FIELD

The present invention relates to a pigment dispersion composition, a colored curable composition, a color filter for a solid-sate image sensor and a method of producing the same, and a solid-state image sensor.

BACKGROUND ART

As color filters used for producing solid-state image sensors or liquid display devices that display a color image, color filters having a red filter layer, a green filter layer and a blue filter layer formed on the same plane of a support such that these layers are adjacent to each other, or color filters having a yellow filter layer, a magenta filter layer and a cyan filter layer, are known. In the present specification, these colored filter layers of each color are also referred to as a color pattern.

In recent years, there has been demand for further improvement in fineness of color filters.

However, since there are problems such as difficulty in improving resolution or occurrence of color irregularity due to coarse pigment particles, the conventional pigment dispersion system is not suitable for applications such as solid-state image sensors in which formation of a micronized pattern is required. In order to address these problems, use of a dye has been proposed (for example, Japanese Patent Application Laid-Open (JP-A) No. 6-75375).

For example, it is known that a red dye is used for a red filter array in color filters (for example, JP-A No. 5-5067).

However, since color patterns formed from a dye exhibit insufficient heat fastness or light fastness, studies have been made regarding color filters using an organic pigment that exhibits excellent heat fastness or light fastness.

Methods of producing color filters using an organic pigment include photolithography in which a process of patterning, in which a composition prepared by dispersing an organic pigment in a photosensitive resin is exposed to light and developed, is repeated for a desired number of times (for example, JP-A No. 1-152449) and printing, such as offset printing or inkjet printing, in which inks containing an organic pigment are used.

As organic pigments for producing color filters, use of organic pigments that exhibit excellent heat fastness or light fastness, such as anthraquinone pigments, diketopyrrolopyrrole pigments, quinacridone pigments, isoindoline pigments, perinone pigments, perylene pigments and condensed azo pigments, have been considered.

In this regard, International Publication No. WO05/052074 proposes a red ink composition for producing a color filter, which composition includes a monoazo compound having a naphthalene ring.

However, there is growing demand for even higher dispersion stability than ever in pigment dispersion compositions and colored curable compositions that include an azo pigment. Further, it has been proved that as the dispersion stability of an azo pigment decreases, heat fastness of the color pattern decreases.

In particular, in pigment dispersion compositions and colored curable compositions used for producing a color filter of solid-state image sensors, stable coating property needs to be maintained, and therefore improvements in dispersion stability and heat fastness are highly desired.

SUMMARY OF THE INVENTION

The present invention has been made in view of the aforementioned problems, and provides a pigment dispersion composition that exhibits excellent dispersion stability; a colored curable composition that exhibits excellent dispersion stability and is capable of forming a color pattern that exhibit excellent heat fastness; a color filter for a solid-sate image sensor and a method of producing the same, the color filter exhibiting excellent heat fastness; and a solid-state image sensor including a color filter that exhibits excellent heat fastness.

MEANS FOR SOLVING THE PROBLEMS

The following are exemplary embodiments according to the invention. However, the invention is not limited to these exemplary embodiments.

1. A pigment dispersion composition comprising an azo pigment represented by formula (1), in which the azo pigment represented by formula (1) does not have an ionic hydrophilic group, an azo pigment derivative and a dispersant:

(1)

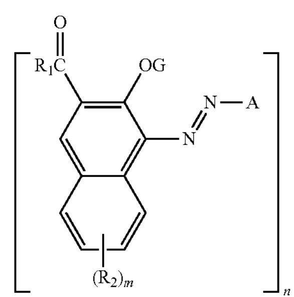

wherein in formula (1), G represents a hydrogen atom, an aliphatic group, an aryl group or a heterocyclic group; $R_1$ represents an amino group, an aliphatic oxy group, an aliphatic group, an aryl group or a heterocyclic group; $R_2$ represents a substituent; A represents any one of the following formulae (A-1) to (A-32); m represents an integer of 0 to 5; and n represents an integer of 1 to 4, wherein:

when n=2, the azo pigment is a dimer formed via $R_1$, $R_2$, A or G; when n=3, the azo pigment is a a trimer formed via $R_1$, $R_2$, A or G; and when n=4, the azo pigment is a tetramer formed via $R_1$, $R_2$, A or G:

(A-1)

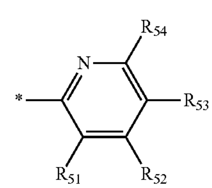

-continued
(A-2)
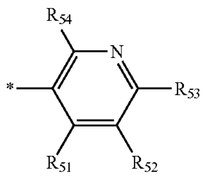
(A-3)
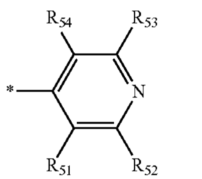
(A-4)
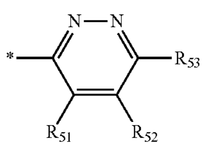
(A-5)
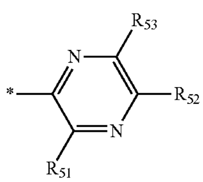
(A-6)
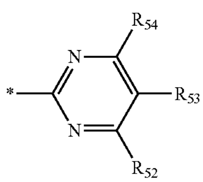
(A-7)
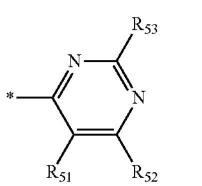
(A-8)
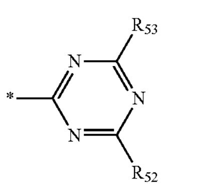
(A-9)
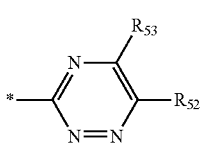
(A-10)
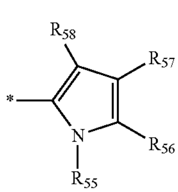
-continued
(A-11)
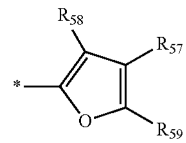
(A-12)
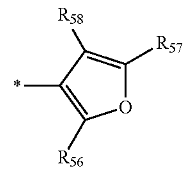
(A-13)
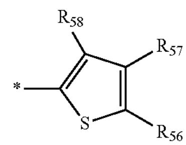
(A-14)
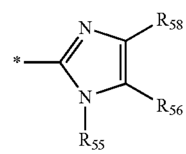
(A-15)
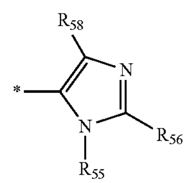
(A-16)
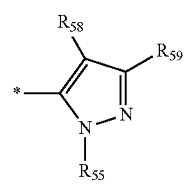
(A-17)
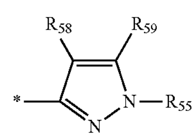
(A-18)
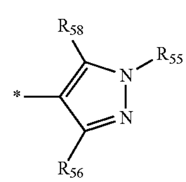
(A-19)
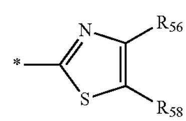
(A-20)
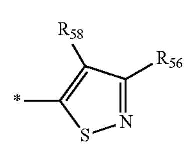

-continued (A-21)

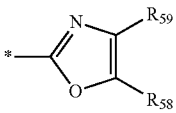

(A-22)

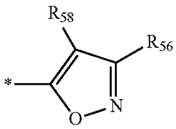

(A-23)

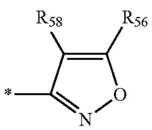

(A-24)

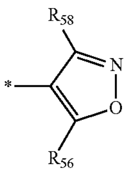

(A-25)

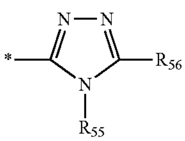

(A-26)

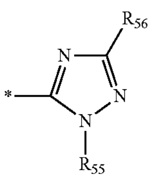

(A-27)

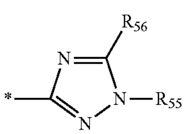

(A-28)

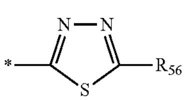

(A-29)

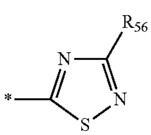

(A-30)

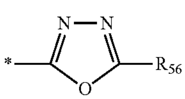

(A-31)

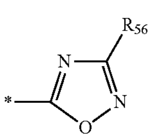

-continued (A-32)

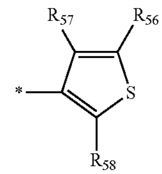

wherein in formulae (A-1) to (A-32), $R_{51}$ to $R_{59}$ each independently represents a hydrogen atom or a substituent that may be bonded to an adjacent substituent to form a 5- or 6-membered ring, and * represents a position to be bonded to the azo group in formula (1).

2. The pigment dispersion composition according to <1>, wherein the azo pigment represented by formula (1) comprises an azo pigment represented by formula (2), in which the azo pigment represented by formula (2) does not have an ionic hydrophilic group:

(2)

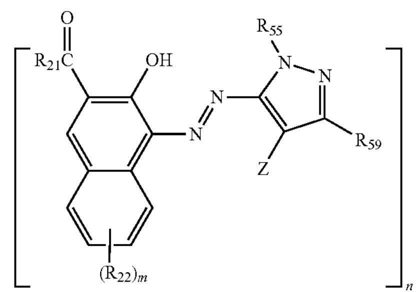

wherein in formula (2), $R_{21}$ represents an amino group, an aliphatic oxy group, an aliphatic group, an aryl group or a heterocyclic group; $R_{22}$ represents a substituent; $R_{55}$ and $R_{59}$ each independently represents a hydrogen atom or a substituent; m represents an integer of 0 to 5; n represents an integer of 1 to 4; and Z represents an electron-withdrawing group having a Hammett's up value of 0.2 or more, wherein:

when n=2, the azo pigment is a dimer formed via $R_{21}$, $R_{22}$, $R_{55}$, $R_{59}$ or Z; when n=3, the azo pigment is a trimer formed via $R_{21}$, $R_{22}$, $R_{55}$, $R_{59}$ or Z; and when n=4, the azo pigment is a tetramer formed via $R_{21}$, $R_{22}$, $R_{55}$, $R_{59}$ or Z.

3. The pigment dispersion composition according to <1>, wherein the dispersant comprises a polymer compound including at least one selected from repeating units represented by formula (I) or formula (II):

(I)

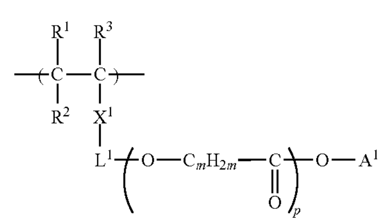

-continued (II)

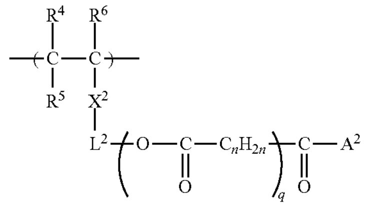

wherein in formula (I) and formula (II), $R^1$ to $R^6$ each independently represents a hydrogen atom or a monovalent organic group; $X^1$ and $X^2$ each independently represents —CO—, —C(═O)O—, —CONH—, —OC(═O)— or a phenylene group; $L^1$ and $L^2$ each independently represents a single bond or a divalent organic linking group; $A^1$ and $A^2$ each independently represents a monovalent organic group; m and n each independently represents an integer of 2 to 8; and p and q each independently represents an integer of 1 to 100.

4. The pigment dispersion composition according to <3>, wherein the polymer compound has an acid value of from 50 mgKOH/g to 200 mgKOH/g.

5. The pigment dispersion composition according to <1>, wherein the azo pigment represented by formula (1) is micronized by solvent salt milling.

6. The pigment dispersion composition according to <1>, further comprising a pigment having a color hue selected from red, yellow, orange or violet.

7. A colored curable composition comprising the pigment dispersion composition according to <1>, a photopolymerization initiator and a polymerizable compound.

8. The colored curable composition according to <7>, wherein the photopolymerization initiator comprises an oxime photopolymerization initiator.

9. A method of producing a color filter for a solid-state image sensor, the method comprising;

forming a colored curable composition layer by applying the colored curable composition according to <7> to a support;

exposing the colored curable composition layer to light via a mask; and forming a color pattern by developing the exposed colored curable composition layer.

10. A color filter for a solid-state image sensor produced by the method according to <9>.

11. A solid-state image sensor comprising the color filter according to <10>.

DETAILED DESCRIPTION OF THE INVENTION

<Pigment Dispersion Composition>

The pigment dispersion composition of the present invention contains an azo pigment represented by the following formula (1), an azo pigment derivative, and a dispersant.

In the pigment dispersion composition of the present invention, dispersion stability of the azo pigment represented by formula (1) may be improved by using an azo pigment derivative and a dispersant in combination.

First, the aliphatic group, the aryl group, the heterocyclic group and the substituent in the present invention are described.

In the aliphatic group in the present invention, the aliphatic portion thereof may be any of linear, branched or cyclic. The aliphatic group may be saturated or unsaturated. Specific examples of the aliphatic group include an alkyl group, an alkenyl group, a cycloalkyl group, and a cycloalkenyl group. The aliphatic group may be unsubstituted or may have a substituent.

The aryl group may be a monocyclic ring or a condensed ring. The aryl group may be unsubstituted or may have a substituent. In the heterocyclic group, the heterocyclic portion may be any one having a hetero atom (for example, a nitrogen atom, a sulfur atom or an oxygen atom) in the ring, and may be a saturated ring or an unsaturated ring. The heterocyclic group may be a monocyclic ring or a fused ring, and may be unsubstituted or may have a substituent.

The acyl group may be an aliphatic carbonyl group, an arylcarbonyl group or a heterocyclic carbonyl group, and may have a substituent. The group which may be substituted may be any group described in the following section regarding the substituent, as long as it is capable of being substituted. Examples of the acyl group include acetyl, propanoyl, benzoyl and 3-pyridinecarbonyl.

The substituent in the present invention may be any group capable of being substituted, and examples thereof include an aliphatic group, an aryl group, a heterocyclic group, an acyl group, an acyloxy group, an acylamino group, an aliphatic oxy group, an aryloxy group, a heterocyclic oxy group, an aliphatic oxycarbonyl group, an aryloxycarbonyl group, a heterocyclic oxycarbonyl group, a carbamoyl group, an aliphatic sulfonyl group, an arylsulfonyl group, a heterocyclic sulfonyl group, an aliphatic sulfonyloxy group, an arylsulfonyloxy group, a heterocyclic sulfonyloxy group, a sulfamoyl group, an aliphatic sulfonamide group, an aryl sulfonamide group, a heterocyclic sulfonamide group, an amino group, an aliphatic amino group, an arylamino group, a heterocyclic amino group, an aliphatic oxycarbonylamino group, an aryloxycarbonylamino group, a heterocyclic oxycarbonylamino group, an aliphatic sulfinyl group, an arylsulfinyl group, an aliphatic thio group, an arylthio group, a hydroxy group, a cyano group, a sulfo group, a carboxy group, an aliphatic oxyamino group, an aryloxyamino group, a carbamoylamino group, a sulfamoylamino group, a halogen atom, a sulfamoylcarbamoyl group, a carbamoylsulfamoyl group, a di-aliphatic oxyphosphinyl group, and a diaryloxyphosphinyl group. These groups may be further substituted, and the further substituent may be selected from the substituents as mentioned above.

From the viewpoint of solubility, the azo pigment of the present invention does not contain an ionic hydrophilic group (for example, a carboxy group, a sulfo group, a phosphono group or a quaternary ammonium group) as a substituent. When the azo pigment of the present invention contains an ionic hydrophilic group as a substituent, it is preferably a salt formed with a polyvalent metal cation (for example, magnesium, calcium or barium), and more preferably a lake pigment.

The term "Hammett's substituent constant (σp value)" used herein will be briefly described.

Hammett's rule is an empirical rule proposed by L. P. Hammett in 1935 aimed at quantitatively describing the effect of substituents on the reaction or equilibrium of benzene derivatives, and the validity thereof is now widely acknowledged. The substituent constants determined according to Hammett's rule include a σp value and a σm value, and these values are found in many literatures. For example, these values are described in detail in J. A. Dean Ed., Lange's Handbook of Chemistry, 12th Ed., 1979, published by McGraw-Hill; or in The Realm of Chemistry (Kagaku no Ryoiki) (extra issue) Vol. 122, pp. 96-103, 1979, published by Nankodo. In the present specification, each substituent will be defined or explained with reference to a specific Hammett's substituent constant up: however, it is not intended to limit the substituent to those having a known value found in these literatures, such as the above textbooks, and any substituent with a value that is not known but is presumed to be in the above range when measured according to Hammett's rule also falls within the scope of the present invention. Although the azo pigment represented by the formula (1) used in the present invention is not a benzene derivative, the σp value is be used as a scale for the electron effect of the substituent, regardless of its position. Hereinafter in the present invention, the σp value is used for this purpose.

<Azo Pigment>

Pigment refers to a state in which colorant molecules are firmly bonded to each other by cohesion energy through strong interaction between the molecules. In order to form this state, intermolecular van der Waals force or intermolecular hydrogen bonding is necessary, as described in, for example, the Journal of the Imaging Society of Japan, Vol. 43, p. 10 (2004), or the like.

The intermolecular van der Waals force can be increased by, for example, introducing an aromatic group, a polar group and/or a hetero atom into the molecules. The intermolecular hydrogen bonding can be formed by, for example, introducing a substituent having a hydrogen atom bonded to a hetero atom, and/or introducing an electron-donating substituent, into the molecules. Further, it is considered that the polarity of the entire molecule is preferably higher. For this purpose, for example, it is considered that a linear group, such as an alkyl group, is preferably shorter, and a value of molecular weight/azo group is preferably smaller.

From this point of view, a pigment molecule preferably includes an amide bond, a sulfonamide bond, an ether bond, a sulfone group, an oxycarbonyl group, an imide group, a carbamoylamino group, a heterocyclic ring, a benzene ring, or the like.

<Azo Pigment Represented by the Formula (1)>

The azo pigment according to the present invention is represented by the following formula (1).

Due to its specific structure, the compound represented by the formula (1) readily forms intermolecular interaction between the colorant molecules, exhibits low solubility with respect to water or an organic solvent, thereby making it possible to form an azo pigment.

Unlike dyes, which are used by dissolving in water, an organic solvent or the like such that molecules are dispersed therein, pigments are used by dispersing in a solvent in the form of fine solid particles such as a molecule aggregate.

By having a specific structure represented by the following formula (1), the azo pigment exhibits excellent characteristics in terms of coloring properties or color hue, as well as excellent properties in terms of durability such as light fastness or ozone fastness.

Specifically, a red pattern of a color filter formed from a pigment dispersion composition of the present invention, containing the azo pigment represented by the formula (1), exhibits favorable spectral properties as a red color.

In the present specification, the term "favorable spectral properties as a red color" refers to, for example, at least one of the following properties. Spectral properties that satisfy all of the following three properties are most ideal.

- High transmissivity in a wavelength region of from 650 nm to 750 nm.
- Sharp rise in the transmissivity curve in a wavelength region of 540 nm or longer.
- Low transmissivity in a wavelength region of less than 540 nm (especially, from 350 nm to 400 nm).

Hereinafter, the azo pigment represented by the formula (1) will be described.

(1)

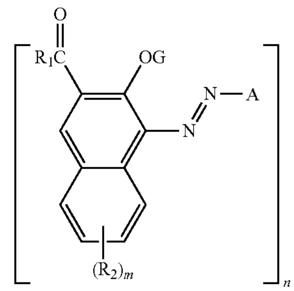

In the formula (1), G represents a hydrogen atom, an aliphatic group, an aryl group or a heterocyclic group, $R_1$ represents an amino group, an aliphatic oxy group, an aliphatic group, an aryl group or a heterocyclic group, and $R_2$ represents a substituent.

A represents any one of the following formulae (A-1) to (A-32).

m represents an integer of 0 to 5, and n represents an integer of 1 to 4.

When n=2, the compound represented by the formula (1) represents a dimer formed via $R_1$, $R_2$, A or G.

When n=3, the compound represented by the formula (1) represents a trimer formed via $R_1$, $R_2$, A or G.

When n=4, the compound represented by the formula (1) represents a tetramer formed via $R_1$, $R_2$, A or G.

The compound represented by the formula (1) does not have an ionic hydrophilic group.

(A-1)

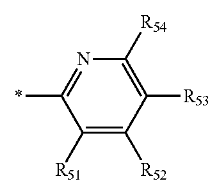

(A-2)

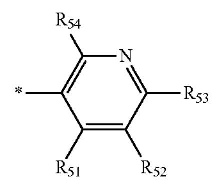

(A-3)

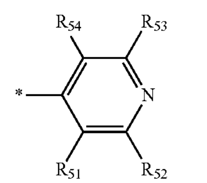

(A-4)

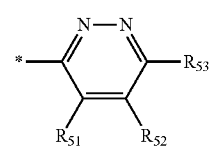

-continued
(A-5)
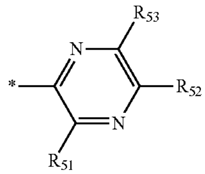
(A-6)
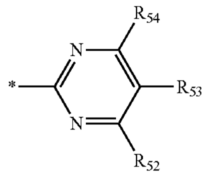
(A-7)
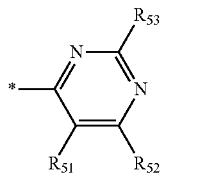
(A-8)
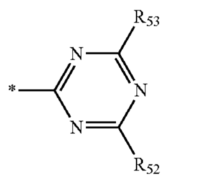
(A-9)
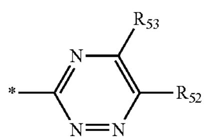
(A-10)
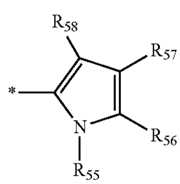
(A-11)
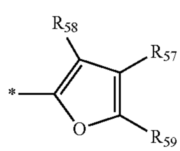
(A-12)
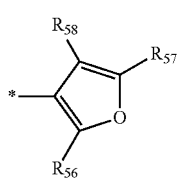
(A-13)
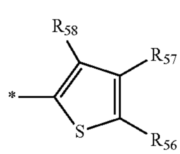
-continued
(A-14)
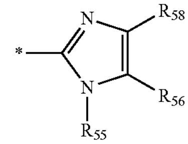
(A-15)
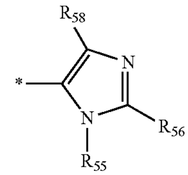
(A-16)
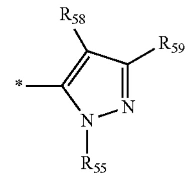
(A-17)
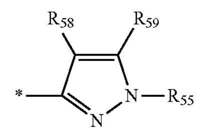
(A-18)
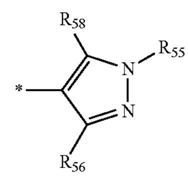
(A-19)
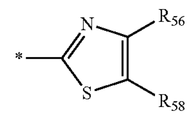
(A-20)
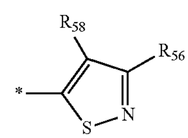
(A-21)
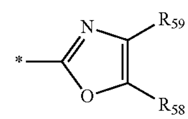
(A-22)
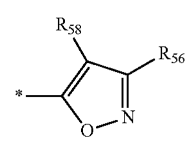
(A-23)
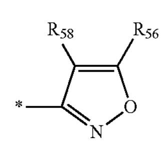

-continued (A-24)

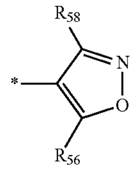

(A-25)

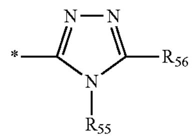

(A-26)

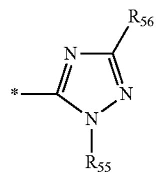

(A-27)

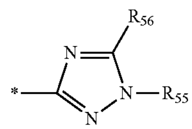

(A-28)

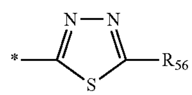

(A-29)

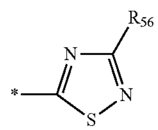

(A-30)

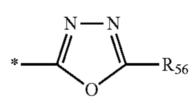

(A-31)

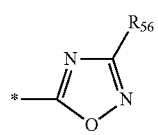

(A-32)

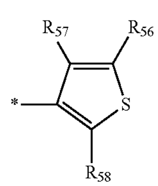

In the formulae (A-1) to (A-32), $R_{51}$ to $R_{59}$ each independently represents a hydrogen atom or a substituent that may be bonded to an adjacent substituents to form a 5- or 6-membered ring. * represents a position to be bonded to the azo group in the formula (1).

The aliphatic group represented by G may be any group which may be saturated or unsaturated, and may have a substituent. The substituent may be any group as long as it is a substitutable group stated in the aforementioned substituent section. Preferred examples of the substituent include a hydroxy group, an aliphatic oxy group, a carbamoyl group, an aliphatic oxycarbonyl group, an aliphatic thio group, an amino group, an aliphatic amino group, an acylamino group or a carbamoylamino group. The aliphatic group represented by G is preferably an aliphatic group having 1 to 8 carbon atoms in total, and more preferably an alkyl group having 1 to 4 carbon atoms in total, and examples thereof include methyl, ethyl, vinyl, cyclohexyl, and carbamoylmethyl.

In the formula (1), the aryl group represented by G may be any one which may be fused to form a ring, and may have a substituent. The substituent may be any group as long as it is a substitutable group stated in the aforementioned substituent section. Preferred examples of the substituent include a nitro group, a halogen atom, an aliphatic oxy group, a carbamoyl group, an aliphatic oxycarbonyl group, an aliphatic thio group, an amino group, an aliphatic amino group, an acylamino group or a carbamoylamino group. The aryl group represented by G is preferably an aryl group having 6 to 12 carbon atoms, more preferably an aryl group having 6 to 10 carbon atoms in total, and examples thereof include phenyl, 4-nitrophenyl, 4-acetylaminophenyl, and 4-methanesulfonylphenyl.

In the formula (1), the heterocyclic group represented by G may have a substituent, may be saturated or unsaturated, and may be fused to form a ring. The substituent may be any group as long as it is a substitutable group stated in the aforementioned substituent section. Preferred examples of the substituent include a halogen atom, a hydroxy group, an aliphatic oxy group, a carbamoyl group, an aliphatic oxycarbonyl group, an aliphatic thio group, an amino group, an aliphatic amino group, an acylamino group or a carbamoylamino group. The heterocyclic group represented by G is preferably a heterocyclic group having 2 to 12 carbon atoms in total that is connected via a carbon atom, more preferably a 5- or 6-membered heterocyclic ring having 2 to 10 carbon atoms in total that is connected via a carbon atom, and examples thereof include 2-tetrahydrofuryl and 2-pyrimidyl.

G preferably represents a hydrogen atom in view of ease of forming an intramolecular hydrogen bond or an intramolecular crosslinking hydrogen bond.

The amino group represented by $R_1$ may be any group which may have a substituent, and the substituent may be any group as long as it is a substitutable group stated in the aforementioned substituent section. Preferred examples of the substituent include an aliphatic group, an aryl group, and a heterocyclic group.

These substituents may further have a substituent which is preferably a substituent having an aliphatic group, a hydroxy group, an amide bond, an ether bond, an oxycarbonyl bond, a thioether bond, or the like. A substituent in which a hetero atom is bonded to a hydrogen atom is more preferable from the viewpoint of ease of forming intermolecular interaction (such as intermolecular hydrogen bonding).

Examples of the amino group which may have a substituent represented by $R_1$ preferably include an unsubstituted amino group, an alkylamino group having 1 to 10 carbon atoms in total, a dialkylamino group (dialkyl groups may be bonded to each other form a 5- or 6-membered ring) having 2 to 10 carbon atoms in total, an arylamino group having 6 to 12 carbon atoms in total, a saturated or unsaturated heterocyclic amino group having 2 to 12 carbon atoms in total; more preferably, an unsubstituted amino group, an alkylamino group having 1 to 8 carbon atoms in total, a dialkylamino group having 2 to 8 carbon atoms in total, an arylamino group having 6 to 10 carbon atoms in total, a saturated or unsaturated heterocyclic amino group having 2 to 12 carbon atoms in total, for example, methylamino, N,N-dimethylamino, N-phenylamino, and N-(2-pyrimidyl)amino.

More preferable examples are an arylamino group having a total of 6 to 13 carbon atoms which may have a substituent, and a saturated or unsaturated heterocyclic amino group having a total of 2 to 12 carbon atoms which may have a substituent.

When $R_1$ represents an arylamino group, the substituent on the aryl group is preferably at the para position from the position to be bonded to the amino group, and most preferably only at the para position. The substituent may be any group, as long as it is a substitutable group stated in the aforementioned substituent section. Examples thereof include an aliphatic group preferably having a total of 1 to 7 carbon atoms, more preferably having a total of 1 to 4 carbon atoms which may have a substituent (for example, methyl, ethyl, allyl, (i)-propyl, or (t)-butyl), an aliphatic oxy group having a total of 1 to 7 carbon atoms which may have a substituent (for example, methoxy, ethoxy, (i)-propyloxy, or allyloxy), a halogen atom (for example, fluorine, chlorine, or bromine), a carbamoyl group having a total of 1 to 7 carbon atoms which may have a substituent (for example, carbamoyl, N-phenylcarbamoyl, or N-methylcarbamoyl), an ureido group having a total of 1 to 7 carbon atoms, more preferably having a total of 1 to 4 carbon atoms, which may have a substituent (for example, ureido, N-methylureido, N,N-dimethylureido, N-4-pyridylureido, or N-phenylureido), a nitro group, a heterocyclic ring fused with an aryl group having a total of 1 to 7 carbon atoms (for example, imidazolone), a hydroxy group, an aliphatic thio group having a total of 1 to 7 carbon atoms, more preferably having a total of 1 to 4 carbon atoms, which may have a substituent (for example, methylthio, ethylthio, (i)-propylthio, allylthio, or (t)-butylthio), an acylamino group having a total of 2 to 7 carbon atoms, more preferably having a total of 2 to 4 carbon atoms, which may have a substituent (for example, acetamino, propionylamino, pivaloylamino, or benzoylamino), an aliphatic oxycarbonylamino group having a total of 2 to 7 carbon atoms, more preferably having a total of 2 to 4 carbon atoms, which may have a substituent (for example, methoxycarbonylamino, or propyloxycarbonylamino), an aliphatic oxycarbonyl group having a total of 2 to 7 carbon atoms, more preferably having a total of 2 to 4 carbon atoms, which may have a substituent (for example, methoxycarbonyl, or ethoxycarbonyl), an acyl group having a total of 2 to 7 carbon atoms, more preferably having a total of 2 to 4 carbon atoms, which may have a substituent (the group may be an aliphatic carbonyl group, an arylcarbonyl group or a heterocyclic carbonyl group, and may have a substituent that may be any group as long as it is a substitutable group stated in the aforementioned substituent section. Preferred examples include an acyl group having a total of 2 to 7 carbon atoms, and an acyl group having a total of 2 to 4 carbon atoms is more preferable and examples thereof include acetyl, propanoyl, benzoyl, or 3-pyridinecarbonyl), and the like.

When a substituent on the aryl group of the arylamino group is substituted at the para position with respect to the position to be bonded to the amino group, the substituent is present at the end of the molecule. Therefore, intermolecular interaction such as intermolecular hydrogen bonding is readily formed and thereby achieving a sharp color hue. When the substituent on the aryl group further has a substituent, the substituent preferably has an aliphatic group, a hydroxy group, an amide bond, an ether bond, an oxycarbonyl bond, a thioether bond, or the like. A substituent having a structure in which a hetero atom is bonded to a hydrogen atom is more preferable, from the viewpoint of ease of forming intermolecular interaction (such as intermolecular hydrogen bonding).

When $R_1$ represents a heterocyclic amino group, the substituent thereof may be any group as long as it is a substitutable group stated in the aforementioned substituent section. Although the same substituents as that described in connection with the arylamino group are preferable, when the substituent on the heterocyclic group further has a substituent, the substituent preferably has an aliphatic group, a hydroxy group, an amide bond, an ether bond, an oxycarbonyl bond, a thioether bond, or the like. A substituent having a structure in which a hetero atom is bonded to a hydrogen atom is more preferable from the viewpoint of ease of forming intermolecular interaction (such as intermolecular hydrogen bonding).

When $R_1$ represents an arylamino group or a heterocyclic amino group, the substituent thereof is more preferably an aliphatic group, an aliphatic oxy group, a halogen atom, a carbamoyl group, a heterocyclic ring fused with the aryl group, or an aliphatic oxycarbonyl group. The substituent is more preferably an aliphatic group having a total of 1 to 4 carbon atoms, an aliphatic oxy group having a total of 1 to 4 carbon atoms, a halogen atom, a nitro group, a carbamoyl group having a total of 1 to 4 carbon atoms, or an aliphatic oxycarbonyl group having a total of 2 to 4 carbon atoms.

The aliphatic oxy group represented by $R_1$ may have a substituent. The substituent may be any group, as long as it is a substitutable group stated in the aforementioned substituent section. Preferred examples of the substituent include a hydroxy group, an aliphatic oxy group, a carbamoyl group, an aliphatic oxycarbonyl group, an aliphatic thio group, an amino group, an aliphatic amino group, an acylamino group or a carbamoylamino group. The aliphatic oxy group represented by $R_1$ is preferably an alkoxy group having a total of 1 to 8 carbon atoms, and more preferably an alkoxy group having a total of 1 to 4 carbon atoms, and examples thereof include methoxy, ethoxy, (t)-butoxy, methoxyethoxy, and carbamoylmethoxy.

The aliphatic group represented by $R_1$ may have a substituent. The substituent may be any group, as long as it is a substitutable group stated in the aforementioned substituent section. Preferred examples of the substituent include a hydroxy group, an aliphatic oxy group, a carbamoyl group, an aliphatic oxycarbonyl group, an aliphatic thio group, an amino group, an aliphatic amino group, an acylamino group or a carbamoylamino group. The aliphatic group represented by $R_1$ is preferably an alkyl group having a total of 1 to 8 carbon atoms, more preferably an alkyl group having a total of 1 to 4 carbon atoms, and examples thereof include methyl, ethyl, (s)-butyl, methoxyethyl, and carbamoylmethyl.

The aryl group represented by $R_1$ may have a substituent. The substituent may be any group, as long as it is a substitutable group stated in the aforementioned substituent section. Preferred examples of the substituent include an aliphatic group, an aliphatic oxy group, a halogen atom, a carbamoyl group, a heterocyclic ring fused with the aryl group, or an aliphatic oxycarbonyl group. The aryl group represented by $R_1$ is preferably an aryl group having a total of 6 to 12 carbon atoms, more preferably an aryl group having a total of 6 to 10 carbon atoms, and examples thereof include phenyl, 4-methylphenyl, and 3-chlorophenyl.

The heterocyclic group represented by $R_1$ may be a saturated heterocyclic ring or an unsaturated heterocyclic group, and may have a substituent or may not. The substituent may be any group, as long as it is a substitutable group stated in the aforementioned substituent section. Preferred examples of the substituent include an aliphatic group, an aliphatic oxy group, a carbamoyl group, a heterocyclic ring fused with the heterocyclic group, or an aliphatic oxycarbonyl group. The heterocyclic group represented by $R_1$ is preferably a heterocyclic group having a total of 2 to 10 carbon atoms, more preferably a 5- or 6-membered non-aromatic heterocyclic group having a total of 2 to 8 carbon atoms that is connected via a nitrogen atom, and examples thereof include 1-piperidyl, 4-morpholinyl, 1-quinoyl, 2-pyrimidyl, and 4-pyridyl.

$R_1$ preferably represents an amino group which may have a substituent, an aliphatic oxy group, or a 5- or 6-membered non-aromatic heterocyclic group connected via a nitrogen atom, more preferably an amino group which may have a substituent, an aliphatic oxy group, and still more preferably an amino group which may have a substituent.

$R_1$ preferably represents an amino group which may have a substituent.

The substituent represented by $R_2$ may be any group, as long as it is a substitutable group stated in the aforementioned substituent section. The substituent represented by $R_2$ is preferably an aliphatic group, an aryl group, a heterocyclic group, an aliphatic oxycarbonyl group, a carboxy group, a carbamoyl group which may have a substituent, an acylamino group, a sulfonamide group, a carbamoylamino group which may have a substituent, a sulfamoyl group which may have a substituent, an aliphatic oxy group, an aliphatic thio group, a cyano group or a halogen atom; more preferably an aliphatic oxycarbonyl group, a carbamoyl group which may have a substituent, an acylamino group, a carbamoylamino group which may have a substituent, an aliphatic oxy group or a halogen atom; and most preferably an aliphatic oxy group.

When these substituents further have a substituent, a substituent having an aliphatic group, a hydroxy group, an amide bond, an ether bond, an oxycarbonyl bond, a thioether bond, or the like is preferable. A substituent having a structure in which a hetero atom is bonded to a hydrogen atom is more preferable from the viewpoint of ease of forming intermolecular interaction (such as intermolecular hydrogen bonding).

m preferably represents 0 to 3, more preferably 0 to 1, and still more preferably 0.

n preferably represents 1 or 2.

The aliphatic group represented by $R_2$ may be any group which may have a substituent, and may be saturated or unsaturated. The substituent may be any group as long as it is a substitutable group stated in the aforementioned substituent section. The aliphatic group represented by $R_2$ is preferably an alkyl group having a total of 1 to 8 carbon atoms, more preferably an alkyl group having a total of 1 to 6 carbon atoms, and examples thereof include methyl, ethyl, i-propyl, cyclohexyl, and t-butyl.

The aryl group represented by $R_2$ may be any group which may have a substituent, and the substituent may be any group as long as it is a substitutable group stated in the aforementioned substituent section. The aryl group represented by $R_2$ is preferably an aryl group having a total of 6 to 12 carbon atoms, more preferably an aryl group having a total of 6 to 10 carbon atoms, and examples thereof include phenyl, 3-methoxyphenyl, and 4-carbamoylphenyl.

The heterocyclic group represented by $R_2$ may be any group which may have a substituent, may be saturated or unsaturated, and may be fused to form a ring. The substituent may be any group as long as it is a substitutable group stated in the aforementioned substituent section. The heterocyclic group represented by $R_2$ is preferably a heterocyclic group having a total of 2 to 16 carbon atoms, more preferably a 5- or 6-membered heterocyclic group having a total of 2 to 12 carbon atoms, and examples thereof include 1-pyrrolidinyl, 4-morpholinyl, 2-pyridyl, 1-pyrrolyl, 1-imidazolyl, and 1-benzimidazolyl.

The aliphatic oxycarbonyl group represented by $R_2$ may be any group which may have a substituent, and may be saturated or unsaturated. The substituent may be any group, as long as it is a substitutable group stated in the aforementioned substituent section. The aliphatic oxycarbonyl group represented by $R_2$ is preferably an alkoxycarbonyl group having a total of 1 to 8 carbon atoms, more preferably an alkoxycarbonyl group having a total of 1 to 6 carbon atoms, and examples thereof include methoxycarbonyl, i-propyloxycarbonyl, and carbamoylmethoxycarbonyl.

The carbamoyl group represented by $R_2$ may be any group which may have a substituent, and the substituent may be any group as long as it is a substitutable group stated in the aforementioned substituent section. The carbamoyl group represented by $R_2$ is preferably an aliphatic group, an aryl group, a heterocyclic group, or the like. The carbamoyl group represented by $R_2$ which may have a substituent is preferably a carbamoyl group, an alkylcarbamoyl group having a total of 2 to 9 carbon atoms, a dialkylcarbamoyl group having a total of 3 to 10 carbon atoms, an arylcarbamoyl group having a total of 7 to 13 carbon atoms, a heterocyclic carbamoyl group having a total of 3 to 12 carbon atoms; more preferably a carbamoyl group, an alkylcarbamoyl group having a total of 2 to 7 carbon atoms, a dialkylcarbamoyl group having a total of 3 to 6 carbon atoms, an arylcarbamoyl group having a total of 7 to 11 carbon atoms, a heterocyclic carbamoyl group having a total of 3 to 10 carbon atoms; and examples thereof include carbamoyl, methylcarbamoyl, dimethylcarbamoyl, phenylcarbamoyl, and 4-pyridinecarbamoyl.

The acylamino group represented by $R_2$ may be any group which may have a substituent, and may be aliphatic, aromatic or heterocyclic. The substituent may be any group, as long as it is a substitutable group stated in the aforementioned substituent section. The acylamino group represented by $R_2$ is preferably an acylamino group having a total of 1 to 12 carbon atoms, more preferably an acylamino group having a total of 1 to 8 carbon atoms, still more preferably an alkylcarbonylamino group having a total of 1 to 8 carbon atoms, and examples thereof include acetylamino, benzoylamino, 2-pyridinecarbonylamino, and propanoylamino.

The sulfonamide group represented by $R_2$ may be any group which may have a substituent, and may be aliphatic, aromatic or heterocyclic. The substituent may be any group, as long as it is a substitutable group stated in the aforementioned substituent section. The sulfonamide group represented by $R_2$ is preferably a sulfonamide group having a total of 1 to 12 carbon atoms, more preferably a sulfonamide group having a total of 1 to 8 carbon atoms, still more preferably an alkylsulfonamide group having a total of 1 to 8 carbon atoms, and examples thereof include methanesulfonamide, benzenesulfonamide, and 2-pyridinesulfonamide.

The carbamoylamino group represented by $R_2$ may be any group which may have a substituent or may be substituted, and the substituent may be any group as long as it is a substitutable group stated in the aforementioned substituent section, preferably an aliphatic group, an aryl group, and a heterocyclic group. The carbamoylamino group represented by $R_2$ which may have a substituent is preferably a carbamoylamino group, an alkylcarbamoylamino group having a total of 2 to 9 carbon atoms, a dialkylcarbamoylamino group having a total of 3 to 10 carbon atoms, an arylcarbamoylamino group having a total of 7 to 13 carbon atoms, or a heterocyclic carbamoylamino group having a total of 3 to 12 carbon atoms; more preferably a carbamoylamino group, an alkylcarbamoylamino group having a total of 2 to 7 carbon atoms, a dialkylcarbamoylamino group having a total of 3 to 6 carbon atoms, an arylcarbamoylamino group having a total of 7 to 11 carbon atoms, or a heterocyclic carbamoylamino group having a total of 3 to 10 carbon atoms; and examples thereof include carbamoylamino, methylcarbamoylamino, N,N-dimethylcarbamoylamino, phenylcarbamoylamino, and 4-pyridinecarbamoylamino.

The sulfamoyl group represented by $R_2$ may be any group which may have a substituent or may be substituted, and the substituent may be any group as long as it is a substitutable group stated in the aforementioned substituent section, preferably an aliphatic group, an aryl group, and a heterocyclic group. The sulfamoyl group represented by $R_2$ which may have a substituent is preferably a sulfamoyl group, an alkylsulfamoyl group having a total of 1 to 9 carbon atoms, a dialkylsulfamoyl group having a total of 2 to 10 carbon atoms, an arylsulfamoyl group having a total of 7 to 13 carbon atoms, or a heterocyclic sulfamoyl group having a total of 2 to 12 carbon atoms; more preferably a sulfamoyl group, an alkylsulfamoyl group having a total of 1 to 7 carbon atoms, a dialkylsulfamoyl group having a total of 3 to 6 carbon atoms, an arylsulfamoyl group having a total of 6 to 11 carbon atoms, or a heterocyclic sulfamoyl group having a total of 2 to 10 carbon atoms; and examples thereof include sulfamoyl, methylsulfamoyl, N,N-dimethylsulfamoyl, phenylsulfamoyl, and 4-pyridinesulfamoyl.

The aliphatic oxy group represented by $R_2$ may be any group which may have a substituent, and may be saturated or unsaturated. The substituent may be any group as long as it is a substitutable group stated in the aforementioned substituent section. The aliphatic oxy group of $R_2$ is preferably an alkoxy group having a total of 1 to 8 carbon atoms, more preferably an alkoxy group having a total of 1 to 6 carbon atoms, and examples thereof include methoxy, ethoxy, i-propyloxy, cyclohexyloxy, and methoxyethoxy.

The aliphatic thio group represented by $R_2$ may be any group which may have a substituent, and may be saturated or unsaturated. The substituent may be any group as long as it is a substitutable group stated in the aforementioned substituent section. The aliphatic thio group represented by $R_2$ is preferably an alkylthio group having a total of 1 to 8 carbon atoms, more preferably an alkylthio group having a total of 1 to 6 carbon atoms, and examples thereof include methylthio, ethylthio, carbamoylmethylthio, and t-butylthio.

The halogen atom represented by $R_2$ is preferably a fluorine atom, a chlorine atom or a bromine atom, more preferably a chlorine atom.

From the viewpoint of the effect of the present invention, $R_2$ is preferably an aliphatic oxycarbonyl group, or a carbamoyl group which may have a substituent. From the viewpoint of the effect of the present invention, m preferably represents 0 or 1; more preferably 0.

Formulae (A-1) to (A-32) represented by A will be described. The portion represented by the formulae (A-1) to (A-32) preferably has a total of 2 to 15 carbon atoms; more preferably a total of 2 to 12 carbon atoms.

The substituent represented by $R_{51}$ to $R_{54}$ may be any group, as long as it is a substitutable group stated in the aforementioned substituent section. The substituent represented by $R_{51}$ to $R_{54}$ is preferably an aliphatic group, an aryl group, a heterocyclic group, an aliphatic oxycarbonyl group, a carbamoyl group which may have a substituent, an acylamino group, a sulfonamide group, an aliphatic oxy group, an aliphatic thio group, a cyano group, or the like; more preferably an aliphatic group, an aliphatic oxycarbonyl group, a carbamoyl group which may have a substituent, an aliphatic oxy group, a cyano group, or the like.

From the viewpoint of the effect of the present invention, each of $R_{51}$ to $R_{54}$ preferably represents a hydrogen atom, an aliphatic group, an aryl group, a heterocyclic group, an aliphatic oxycarbonyl group, a carbamoyl group which may have a substituent, an acylamino group, a sulfonamide group, an aliphatic oxy group, an aliphatic thio group, a cyano group, or the like; more preferably a hydrogen atom, an aliphatic group, an aliphatic oxycarbonyl group, a carbamoyl group which may have a substituent, an aliphatic oxy group or a cyano group.

The substituent represented by $R_{55}$ may be any group, as long as it is a substitutable group stated in the aforementioned substituent section. The substituent represented by $R_{55}$ is preferably an aliphatic group, an aryl group, a heterocyclic group, or the like; more preferably an aliphatic group, an aryl group, or an aromatic 5- or 6-membered heterocyclic group containing a nitrogen atom at the position adjacent to a position to be bonded to the nitrogen atom.

From the viewpoint of the effect of the present invention, $R_{55}$ preferably represents an aliphatic group, an aryl group or a heterocyclic group; more preferably an aliphatic group, an aryl group, or an aromatic 5- or 6-membered heterocyclic group containing a nitrogen atom at a position adjacent to a position to be bonded to the nitrogen atom, and still more preferably an aromatic 5- or 6-membered heterocyclic group containing a nitrogen atom at a position adjacent to a position to be bonded to the nitrogen atom. When $R_{55}$ represents an aromatic 5- or 6-membered heterocyclic group containing a nitrogen atom at a position adjacent to a position to be bonded to the nitrogen atom, not only intermolecular interactions between colorant molecules but also intramolecular interaction among the colorant molecules may be firmly formed. As a result, a pigment having a stable molecular arrangement is readily obtained, and favorable color hue and high fastness (fastness with respect to light, gas, heat, water etc.) can be achieved.

From the viewpoint of the effect of the present invention, the aromatic 5- or 6-membered heterocyclic group containing a nitrogen atom at a position adjacent to a position to be bonded to the nitrogen atom, which is a preferable structure represented by $R_{55}$, may be any group which may have a substituent, and the substituent may be any group as long as it is a substitutable group stated in the aforementioned substituent section. Preferred examples of the substituent include a hydroxy group, an aliphatic oxy group, a carbamoyl group, an aliphatic oxycarbonyl group, an aliphatic thio group, an amino group, an aliphatic amino group, an acylamino group or a carbamoylamino group. The aromatic 5- or 6-membered heterocyclic group may be a saturated heterocyclic ring, an unsaturated heterocyclic ring or a fused heterocyclic ring, but is preferably an aromatic 5- or 6-membered heterocyclic group having a total of 2 to 12 carbon atoms and containing a nitrogen atom at a position adjacent to a position to be bonded to the nitrogen atom, and more preferably an aromatic 5- or 6-membered heterocyclic group having a total of 2 to 10 carbon atoms and containing a nitrogen atom at a position adjacent to a position to be bonded to the nitrogen atom. Examples of the aromatic 5- or 6-membered heterocyclic group containing a nitrogen atom at a position adjacent to a position to be bonded to the nitrogen atom include 2-thiazolyl, 2-benzothiazolyl, 2-oxazolyl, 2-benzoxazolyl, 2-pyridyl, 2-pyrazinyl, 3-pyridazinyl, 2-pyrimidinyl, 4-pyrimidinyl, 2-imidazolyl, 2-benzimidazolyl, 2-triazinyl, and the like. These heterocyclic groups may form a tautomer structure with a substituent.

From the viewpoint of the effect of the present invention, an aryl group, which is preferable as $R_{55}$, may be any group which may have a substituent, and the substituent may be any group as long as it is a substitutable group stated in the aforementioned substituent section. Preferred examples of the substituent include a hydroxy group, a nitro group, an aliphatic group, an aliphatic oxy group, a carbamoyl group, an aliphatic oxycarbonyl group, an aliphatic thio group, an amino group, an aliphatic amino group, an acylamino group and a carbamoylamino group. The aryl group represented by $R_{55}$ is preferably an aryl group having a total of 6 to 12 carbon atoms, more preferably an aryl group having a total of 6 to 10 carbon atoms, and examples thereof include phenyl, 3-methoxyphenyl, and 4-carbamoylphenyl. Among these, a phenyl group is preferable.

From the viewpoint of the effect of the present invention, an aliphatic group, which is preferable as $R_{55}$, may be any group which may have a substituent, and the substituent may be any group as long as it is a substitutable group stated in the aforementioned substituent section. Preferred examples of the substituent include a hydroxy group, a nitro group, an aliphatic oxy group, a carbamoyl group, an aliphatic oxycarbonyl group, an aliphatic thio group, an amino group, an aliphatic amino group, an acylamino group and a carbamoylamino group. The aliphatic group represented by $R_{55}$ is preferably an alkyl group having a total of 1 to 6 carbon atoms, more preferably an aliphatic group having a total of 1 to 4 carbon atoms, and examples thereof include methyl, ethyl, methoxyethyl, and carbamoylmethyl. Among these, a methyl group is preferable.

In the formula (1), $R_{55}$ preferably represents any one of the following (Y-1) to (Y-13). In order to obtain a structure that readily forms an intramolecular hydrogen bond structure, any one of the following (Y-1) to (Y-6), which are 6-membered rings, is more preferable; any one of (Y-1), (Y-3), (Y-4) and (Y-6) is still more preferable; and (Y-1) or (Y-4) is particularly preferable. The asterisk (*) in the formulae (Y-1) to (Y-13) represents a site at which $R_{55}$ is bonded to the N atom in the pyrazol ring. $Y_1$ to $Y_{11}$ each independently represents a hydrogen atom or a substituent. $G_{11}$ in (Y-13) represents a non-metal atomic group which can form a 5- or 6-membered heterocyclic ring, and the heterocyclic ring represented by $G_{11}$ may be unsubstituted or may have a substituent. The heterocyclic ring may be a monocyclic ring or a fused ring. Formulae (Y-1) to (Y-13) may have a tautomer structure with substituent(s).

(Y-1)

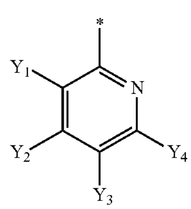

(Y-2)

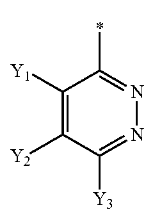

-continued (Y-3)

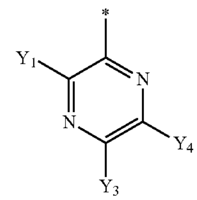

(Y-4)

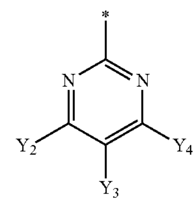

(Y-5)

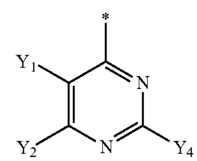

(Y-6)

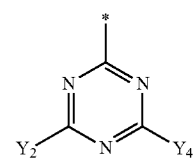

(Y-7)

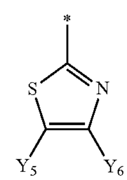

(Y-8)

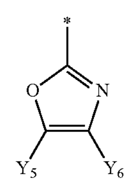

(Y-9)

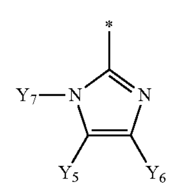

(Y-10)

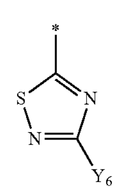

-continued (Y-11)

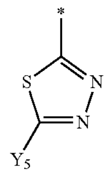

(Y-12)

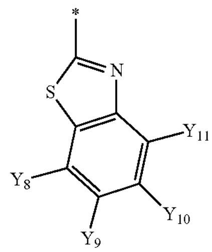

(Y-13)

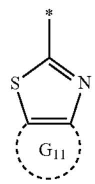

The substituent represented by $Y_1$ to $Y_{11}$ may be any group, as long as it is a substitutable group stated in the aforementioned substituent section. The substituent represented by $Y_1$ to $Y_{11}$ is preferably an aliphatic group, an aryl group, a heterocyclic group, an aliphatic oxycarbonyl group, a carbamoyl group which may have a substituent, an acylamino group, a sulfonamide group, an aliphatic oxy group, an aliphatic thio group, a cyano group, or the like; more preferably an aliphatic group, an aliphatic oxy group, an aliphatic thio group, a cyano group, or the like. Two adjacent substituents among $Y_1$ to $Y_{11}$ may form a 5- or 6-membered ring.

From the viewpoint of the effect of the present invention, each of $Y_1$ to $Y_{11}$ preferably represents a hydrogen atom, an aliphatic group, an aryl group, a heterocyclic group, an aliphatic oxycarbonyl group, a carbamoyl group which may have a substituent, an acylamino group, a sulfonamide group, an aliphatic oxy group, an aliphatic thio group, a cyano group, or the like; more preferably a hydrogen atom, an aliphatic group, an aliphatic oxycarbonyl group, a carbamoyl group which may have a substituent, an aliphatic oxy group or a cyano group.

From the viewpoint of the effect of the present invention, A preferably represents a 5-membered heterocyclic ring in terms of color hue, more preferably a nitrogen-containing or sulfur-containing 5-membered heterocyclic ring, and still more preferably a 5-membered heterocyclic ring containing two or more hetero atoms.

The substituent represented by $R_{56}$, $R_{57}$ and $R_{59}$ may be any group, as long as it is a substitutable group stated in the aforementioned substituent section. The substituent represented by $R_{56}$, $R_{57}$ and $R_{59}$ is preferably an aliphatic group, an aryl group, a heterocyclic group, an aliphatic oxycarbonyl group, a carbamoyl group which may have a substituent, an acylamino group, a sulfonamide group, an aliphatic oxy group, an aliphatic thio group, a cyano group, or the like; more preferably an aliphatic group, an aliphatic oxy group, an aliphatic thio group, a cyano group, or the like.

From the viewpoint of the effect of the present invention, each of $R_{56}$, $R_{57}$ and $R_{59}$ preferably represents an aliphatic group, an aryl group, a heterocyclic group, an aliphatic oxycarbonyl group, a carbamoyl group which may have a substituent, an acylamino group, a sulfonamide group, an aliphatic oxy group, an aliphatic thio group, a cyano group, or the like; more preferably an aliphatic group, an aliphatic oxy group, an aliphatic thio group or a cyano group.

The substituent represented by $R_{58}$ may be any group, as long as it is a substitutable group stated in the aforementioned substituent section. From the viewpoint of the effect of the present invention, $R_{58}$ is preferably a heterocyclic group, or an electron-withdrawing group having a Hammett's substituent constant (σp value) of 0.2 or more; preferably an electron-withdrawing group having a σp value of 0.3 or more. The upper limit of the σp value of the electron-withdrawing group is 1.0 or less.

Specific examples of $R_{58}$, which is an electron-withdrawing group having a σp value of 0.2 or more, include an acyl group, an acyloxy group, a carbamoyl group, an alkyloxycarbonyl group, an aryloxycarbonyl group, a cyano group, a nitro group, a dialkylphosphono group, a diarylphosphono group, a diarylphosphinyl group, an alkylsulfinyl group, an arylsulfinyl group, an alkylsulfonyl group; an arylsulfonyl group, a sulfonyloxy group, an acylthio group, a sulfamoyl group, a thiocyanate group, a thiocarbonyl group, a halogenated alkyl group, a halogenated alkoxy group, a halogenated aryloxy group, a halogenated alkylamino group, a halogenated alkylthio group, an aryl group substituted by an electron-withdrawing group having a σp value of 0.20 or more, a heterocyclic group, a halogen atom, an azo group, and a selenocyanate group.

Further, from the viewpoint of the effect of the present invention, $R_{58}$ is also preferably (Y-1) to (Y-13). In order to achieve a structure which readily forms an intramolecular hydrogen bonded structure, any one of (Y-1) to (Y-6) having a 6-membered ring is more preferable, any one of (Y-1), (Y-3), (Y-4) and (Y-6) is still more preferable, and (Y-1) or (Y-4) is particularly preferable.

Among the heterocyclic rings of (A-1) to (A-32), which are represented by A, if an atom adjacent to the carbon atom bonded to an azo group is a hetero atom, light fastness and heat fastness tend to be high. Use of a pigment having these structural characteristics is preferred, since a color filter that exhibits high contrast can be obtained.

From the viewpoint of the effect of the present invention, the azo pigment represented by the formula (1) preferably has a structure in which G represents a hydrogen atom, $R_1$ represents an amino group which may have a substituent or a saturated heterocyclic group connected via a nitrogen atom, m represents 0 or 1, wherein when m represents 1, $R_2$ represents an aliphatic oxycarbonyl group, a carbamoyl group which may have a substituent, or an aliphatic oxy group, A represents any one of (A-1), (A-10) to (A-17), (A-20) to (A-23), (A-27), (A-28) and (A-30) to (A-32), and n represents 1 or 2;

more preferably a structure in which G represents a hydrogen atom, $R_1$ represents an amino group which may have a substituent or a saturated heterocyclic group connected via a nitrogen atom, m represents 0 or 1, wherein when m represents 1, $R_2$ represents an aliphatic oxycarbonyl group, a carbamoyl group which may have a substituent, or an aliphatic oxy group, A represents any one of (A-1), (A-10), (A-11), (A-13) to (A-17), (A-20), (A-22) to (A-23), (A-27), (A-28) and (A-30) to (A-32), and n represents 1 or 2;

still more preferably a structure in which G represents a hydrogen atom, $R_1$ represents an amino group which may have a substituent, or a saturated heterocyclic group connected via a nitrogen atom, m represents 0, A represents any one of (A-10), (A-11), (A-13) to (A-17), (A-20), (A-22) to (A-23), (A-27), (A-28) and (A-30) to (A-32), and n represents 1 or 2;

particularly preferably a structure in which G represents a hydrogen atom, $R_1$ represents an amino group which may have a substituent, m represents 0, A represents any one of (A-16) to (A-17), (A-20), (A-28) and (A-32), and n represents 1 or 2; and most preferably a structure in which G represents a hydrogen atom, $R_1$ represents an amino group which may have a substituent, m represents 0, A represents (A-16) and n represents 1 or 2.

From the viewpoint of the effect of the present invention, the azo pigment represented by the formula (1) is preferably an azo pigment represented by the following formula (2).

The reason why the azo pigment represented by the formula (2) is preferred is that a crosslinking hydrogen bond is formed by either Z or $R_{55}$ and the hydroxy group of the naphthalene ring with the azo group, whereby the planarity of the pigment structure is enhanced and the intramolecular/intermolecular interaction is improved, and whereby light fastness, heat fastness, solvent resistance or the like are markedly improved.

Hereinafter, an azo pigment represented by the formula (2), a tautomer of the azo pigment, and a salt or a hydrate thereof will be described in more detail.

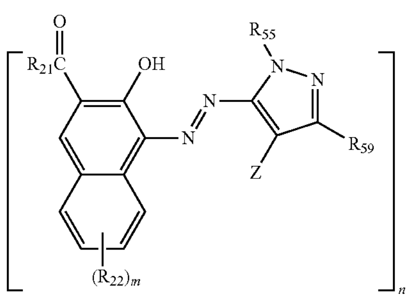

(2)

In the formula (2), $R_{21}$, $R_{22}$, $R_{55}$, $R_{59}$, m, and n have the same definitions as $R_1$, $R_2$, $R_{55}$, $R_{59}$, m, and n in the formula (1), respectively. Z represents an electron-withdrawing group having a Hammett's σp value of 0.2 or more. When n=2, the compound of the formula (2) represents a dimer formed via $R_{21}$, $R_{22}$, $R_{55}$, $R_{59}$ or Z. When n=3, the compound of the formula (2) represents a trimer formed via $R_{21}$, $R_{22}$, $R_{55}$, $R_{59}$ or Z. When n=4, the compound of the formula (2) represents a tetramer formed via $R_{21}$, $R_{22}$, $R_{55}$, $R_{59}$ or Z. The structure represented by the formula (2) does not include an ionic hydrophilic group.

Examples of the substituent represented by Z and having a Hammett's σp value of 0.2 or more include the groups as described in the explanation of $R_{58}$ of the formula (1).

Preferred examples or the range of the substituent of $R_{21}$, $R_{22}$, $R_{55}$, $R_{59}$, m and n in the azo pigment represented by the formula (2) are the same as that of $R_1$, $R_2$, $R_{55}$, $R_{59}$, m and n in the formula (1).

From the viewpoint of the effect of the present invention, Z preferably represents an acyl group, a carbamoyl group, an alkyloxycarbonyl group, a cyano group, an alkylsulfonyl group or a sulfamoyl group, more preferably a carbamoyl group, an alkyloxycarbonyl group or a cyano group, and most preferably a cyano group.

From the viewpoint of the effect of the present invention, the azo pigment represented by the formula (2) preferably has a structure in which $R_{21}$ represents an amino group which may have a substituent, m represents 0 or 1, wherein when m represents 1, $R_{22}$ represents an aliphatic oxycarbonyl group, a carbamoyl group which may have a substituent or an aliphatic oxy group, $R_{55}$ represents an aromatic 5- or 6-membered heterocyclic group containing a nitrogen atom at a position adjacent to the binding site thereof, $R_{59}$ represents a hydrogen atom or an aliphatic group, Z represents an acyl group, a carbamoyl group, an alkyloxycarbonyl group, a cyano group, an alkylsulfonyl group or a sulfamoyl group, and n represents 1 or 2;

more preferably a structure in which $R_{21}$ represents an amino group which may have a substituent, m represents 0, $R_{55}$ represents any one of (Y-1) to (Y-13), $R_{59}$ represents a hydrogen atom or an aliphatic group, Z represents a carbamoyl group, an alkyloxycarbonyl group or a cyano group, and n represents 1 or 2;

still more preferably a structure in which $R_{21}$ represents an amino group which may have a substituent, m represents 0, $R_{55}$ represents any one of (Y-1) to (Y-6), $R_{59}$ represents a hydrogen atom or an aliphatic group, Z represents a carbamoyl group, an alkyloxycarbonyl group or a cyano group, and n represents 1 or 2; and most preferably a structure in which $R_{21}$ represents an amino group which may have a substituent, m represents 0, $R_{55}$ represents (Y-1), (Y-4) or (Y-6), $R_{59}$ represents a hydrogen atom, Z represents a cyano group, and n represents 1 or 2.

From the viewpoint of the effect of the present invention, in the azo pigment represented by the formula (1) or (2), the value expressed by "number of total carbon atoms/number of azo groups" is preferably 40 or less, and more preferably 30 or less. From the viewpoint of the effect of the present invention, in the azo pigment represented by the formula (1) or (2), the value expressed by "molecular weight/number of azo groups" is preferably 700 or less. From the viewpoint of the effect of the present invention, it is preferred that the azo pigment represented by the formula (1) or (2) is not substituted by an ionic substituent such as a sulfo group or a carboxyl group.

In other embodiments of the azo compound represented by the formula (1), A preferably represents (A-1) to (A-9), (A-11) to (A-13), (A-17), (A-20) to (A-23), (A-27), (A-28) and (A-30) to (A-32); more preferably (A-11) to (A-13), (A-17), (A-20) to (A-23), (A-27), (A-28) and (A-30) to (A-32); still more preferably (A-17), (A-20), (A-22) to (A-23), (A-27), (A-28), (A-31) and (A-32); even more preferably (A-20), (A-28) or (A-32); and most preferably (A-20). In particular, A is preferably (A-20) in which $R_{56}$ is $R_{59}$.

The present invention also includes in its scope tautomers of the azo pigments represented by the formula (1) or (2). Although the formula (1) or (2) is expressed by a limited structure among plural possible tautomers in terms of chemical structure, the azo pigment may be a tautomer of other structures than the ones described herein, and the azo pigment may be used as a mixture of plural tautomers.

For example, one possible tautomer with regard to the azo pigment represented by the formula (1) is an azo-hydrazone tautomer represented by the following formula (1').

The present invention also includes in its scope a pigment represented by the formula (1'), which is a tautomer of an azo pigment represented by the formula (1).

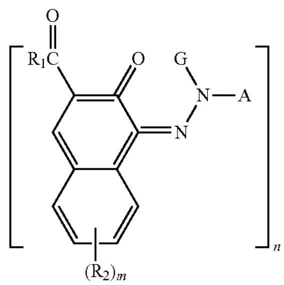

In the formula (1'), G, $R_1$, $R_2$, m, n and A have the same definitions as that in the formula (1), respectively.

Among the azo pigments represented by the formula (1), exemplary formulae of particularly preferred azo pigments include, as described above, azo pigments represented by the following formula (3-1) to the formula (3-4). The azo pigment represented by the formula (1) is preferably an azo pigment represented by the following formula (3-1) to the formula (3-4).

Hereinafter, an azo pigment represented by the formula (3-1) to formula (3-4), a tautomer thereof, and a salt or a hydrate thereof will be described in more detail.

(3-1)

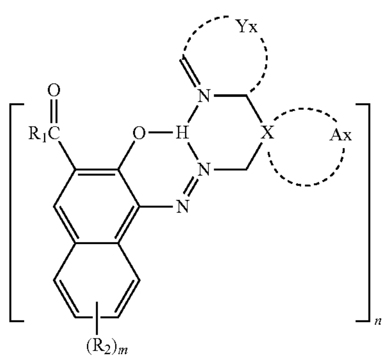

(3-2)

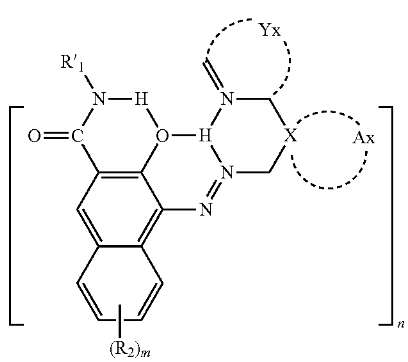

-continued (3-3)

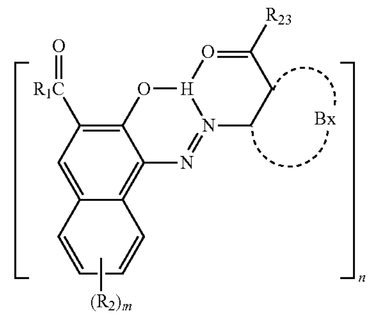

3-4)

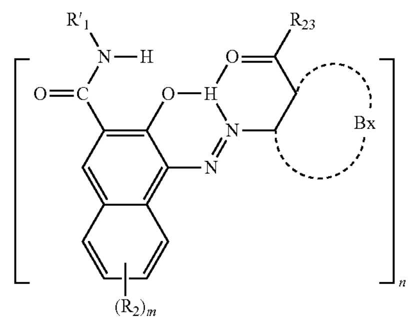

In the formula (3-1) to formula (3-4), $R_1$, $R_2$, m and n have the same definitions as that in the formulae (1) and (2), respectively. X represents a carbon atom or a nitrogen atom, Ax and Bx each independently represents an aromatic 5- or 6-membered heterocyclic group formed together with X and the carbon atom, which specifically represents one corresponding any one of (A-1) to (A-32) defined by A of the formula (1). Yx represents a corresponding one of the heterocyclic groups defined by $R_{55}$ of the formula (1) formed together with the nitrogen atom and the carbon atom. $R_{23}$ represents a substituent corresponding to a group formed by removing a carbonyl group from a corresponding substituent, which substituent is selected from the substituents represented by $R_{51}$, $R_{54}$, $R_{57}$, $R_{58}$ and the like as defined in the formula (1). $R'_1$ represents a substituent corresponding to a group formed by removing —NH— from the amino group of $R_1$ as defined in the formula (1).

There are a number of possible tautomers for the azo pigments represented by the formulae (1), (2) and (3-1) to (3-4).

Further, in the present invention, the azo pigment represented by the formula (1) preferably has a substituent which forms an intramolecular hydrogen bond or an intramolecular crosslinking hydrogen bond; more preferably a substituent which forms at least one or more intramolecular hydrogen bonds; and particularly preferably a substituent which forms at least one or more intramolecular crosslinking hydrogen bonds.

The reason why the above structure is preferred is, as shown in the formulae (3-1) to (3-4), that it is easy to form intramolecular crosslinking hydrogen bond(s) by the nitrogen atom(s) constituting the heterocyclic group contained in the azo pigment structure, a hydrogen atom and an oxygen atom of the hydroxyl group of the naphthalene substituent, and a nitrogen atom of an azo group or a hydrazone group which is a tautomer of the azo group, or a carbonyl group that substitutes an azo component contained in the azo pigment structure, a hydrogen atom and an oxygen atom of the hydroxy group of the naphthalene substituent, and a nitrogen atom of an azo group or a hydrazone group which is a tautomer of the azo group.

As a result, planarity of the molecule is enhanced, the intramolecular and intermolecular interaction is thus further improved, crystallinity of the azo pigment represented by the formula (3-1) or formula (3-4) is enhanced (a higher order structures of the pigment is readily formed), and therefore performance characteristics necessary for pigments, for example, light fastness, heat stability, humidity stability, water resistance, gas resistance, and/or solvent resistance, can be markedly improved.

From these viewpoints, the azo pigment represented by the formula (1) is preferably a pigment represented by the formulae (2) and (3-1) to (3-4), more preferably a pigment represented by the formula (2), (3-1) or (3-2), and particularly preferably an azo pigment represented by the formula (2).

The following are specific examples of the azo pigment and the azo compound represented by the formula (1). However, the present invention is not limited to these examples. Further, although the structures of these specific examples are described in the form of a limited structure from among plural possible tautomers in terms of chemical structure, it should be acknowledged that other structures of tautomers other than the structures described herein are included in the scope of the invention.

D-1

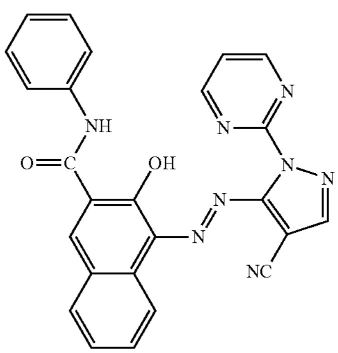

D-2

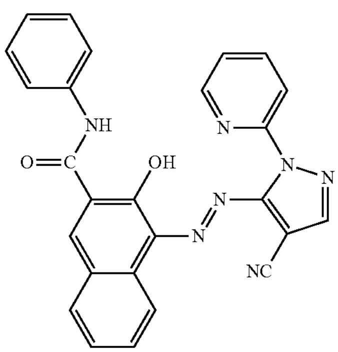

D-3

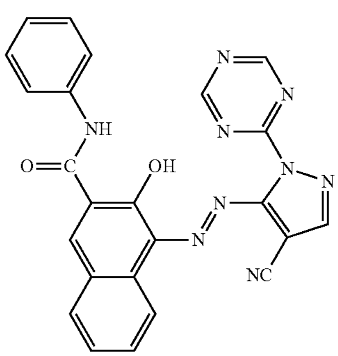

-continued

D-4

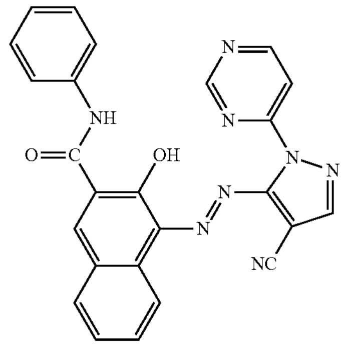

D-5

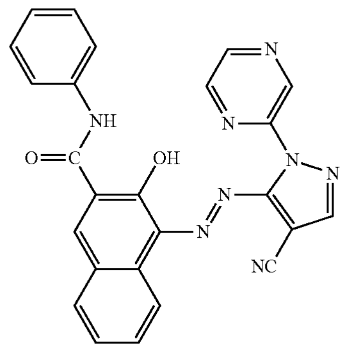

D-6

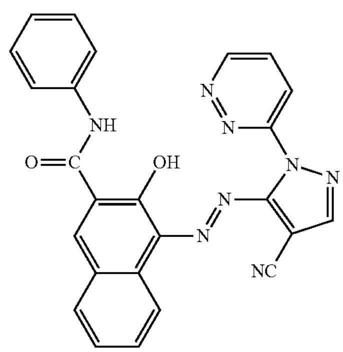

D-7

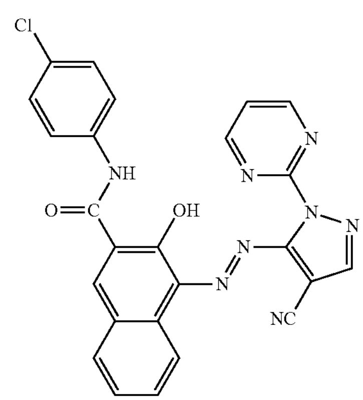

-continued
D-8
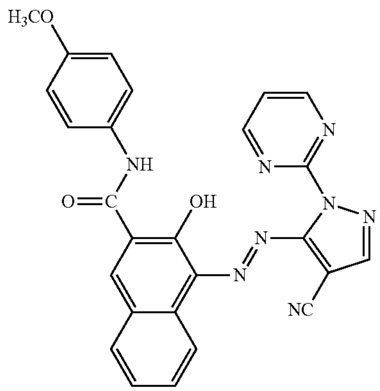
D-9
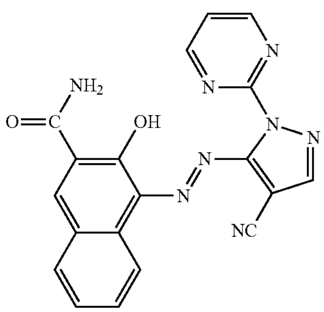
D-10
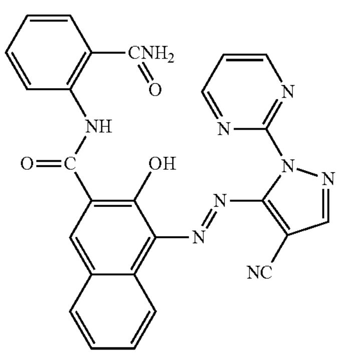
D-11
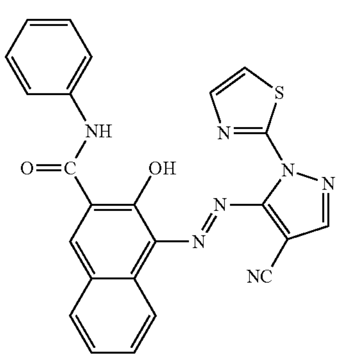
-continued
D-12
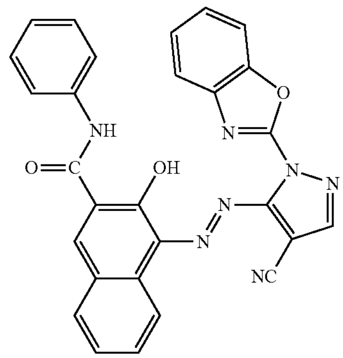
D-13
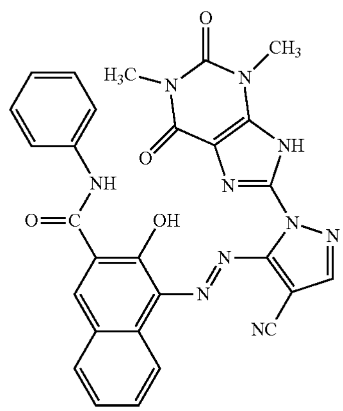
D-14
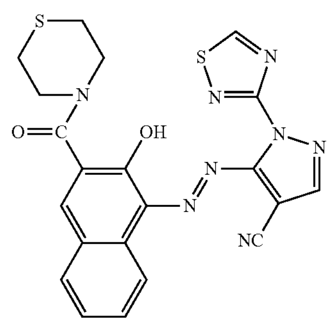
D-15
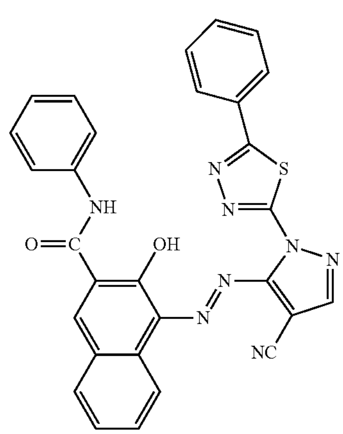

D-16
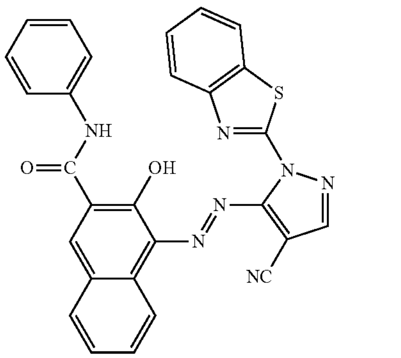
D-17
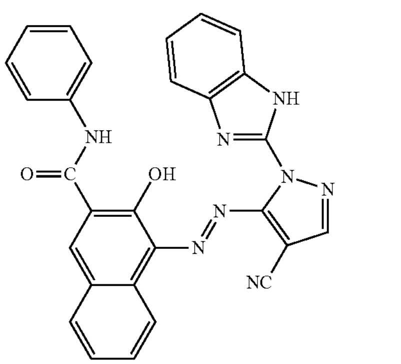
D-18
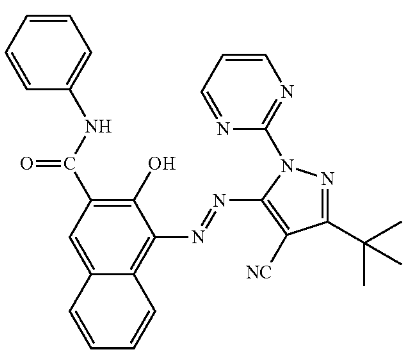
D-19
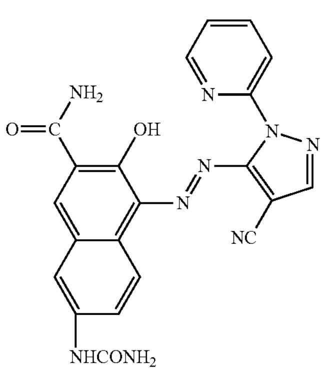
D-20
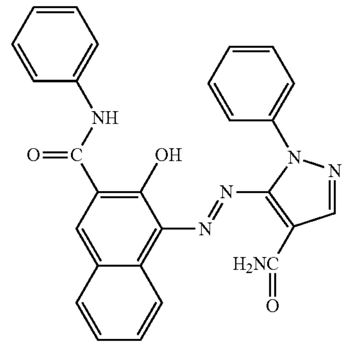
D-21
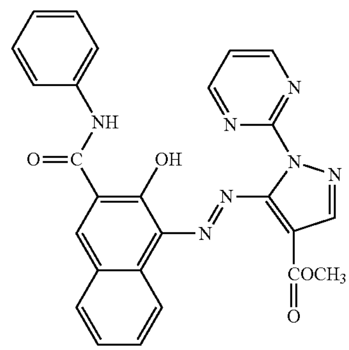
D-22
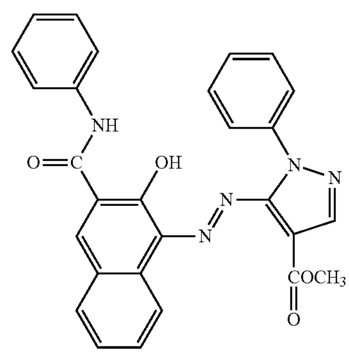
D-23
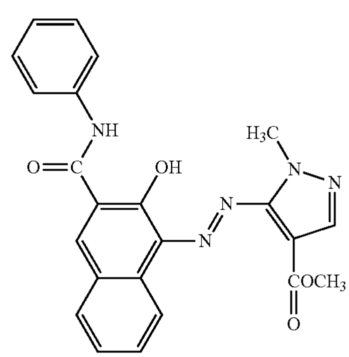

-continued
D-24
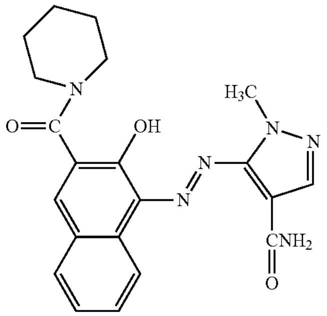
D-25
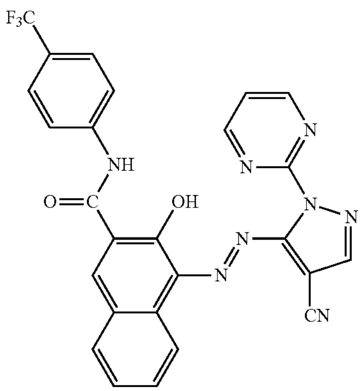
D-26
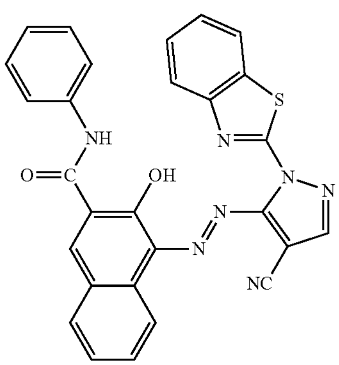
D-27
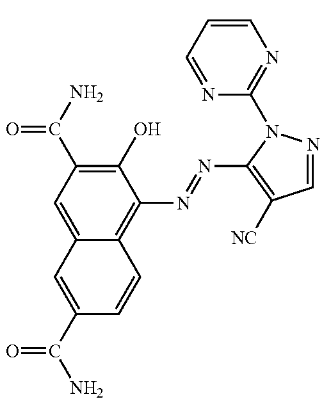
-continued
D-28
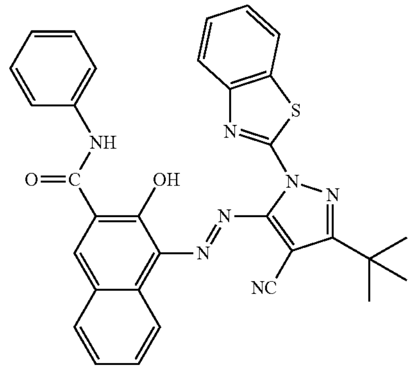
D-29
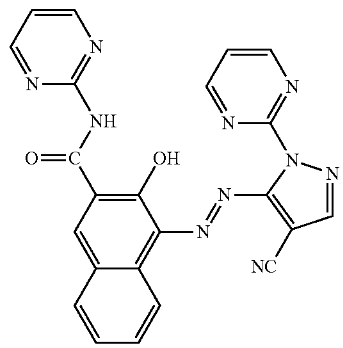
D-30
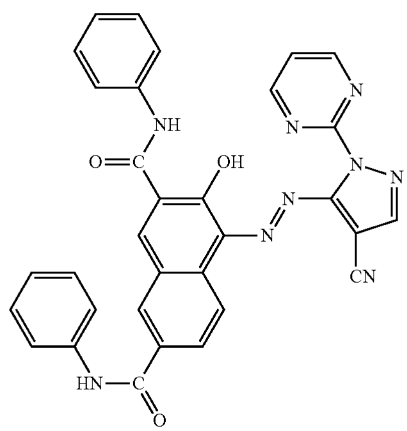
D-31
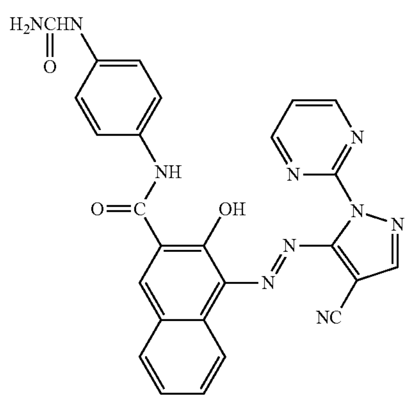

-continued
D-32
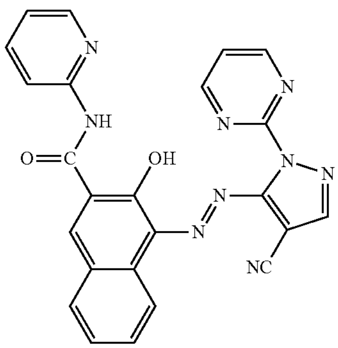
D-33
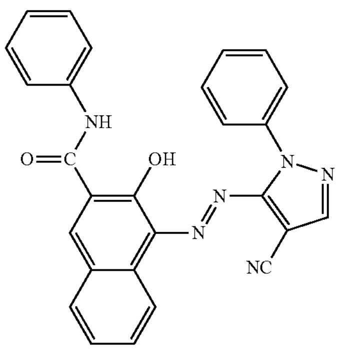
D-34
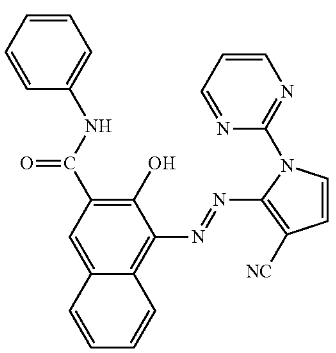
D-35
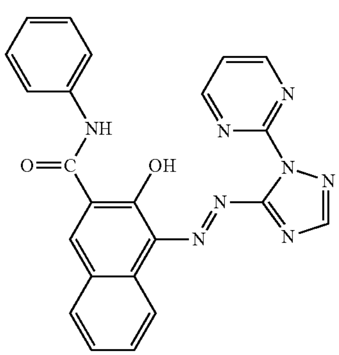
-continued
D-36
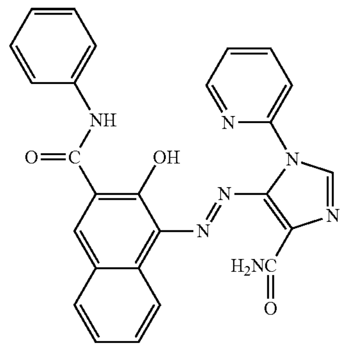
D-37
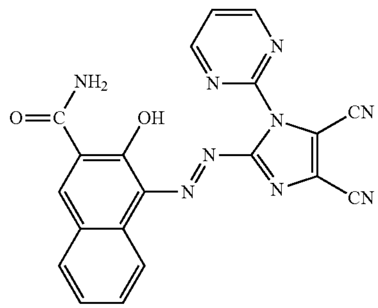
D-38
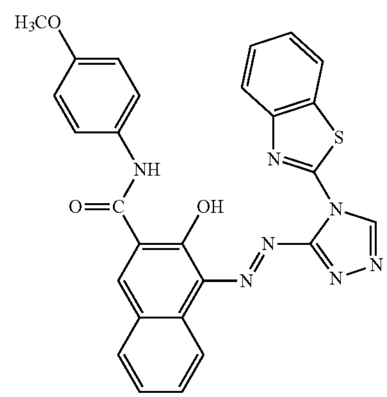
D-39
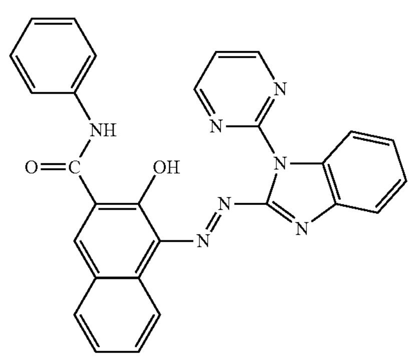

-continued
D-40
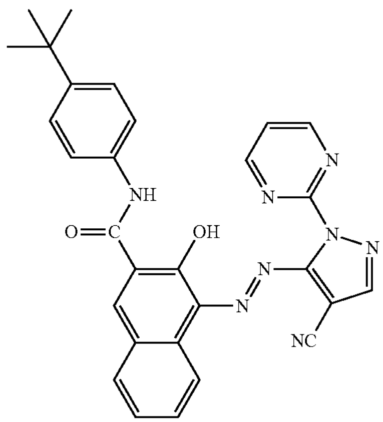
D-41
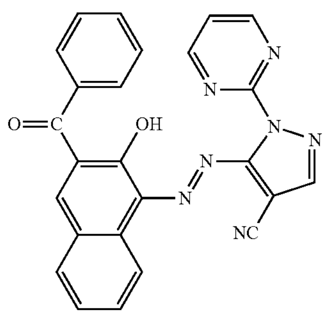
D-42
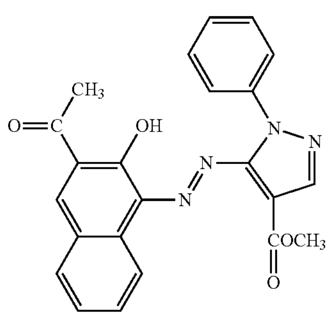
D-43
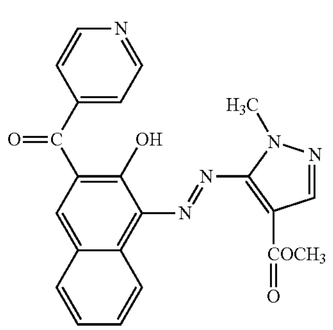
-continued
D-44
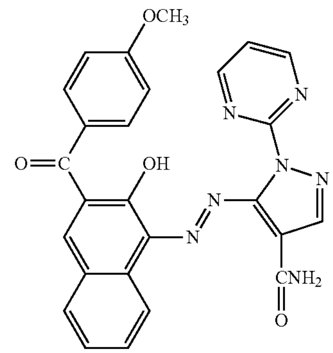
D-45
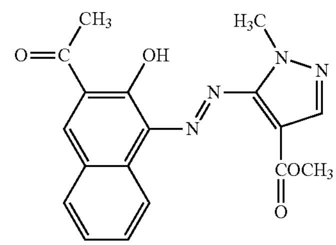
D-71
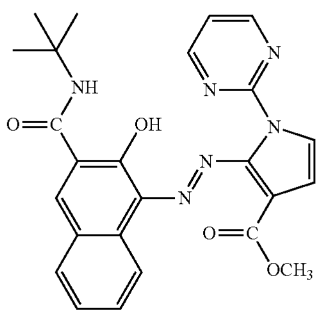
D-72
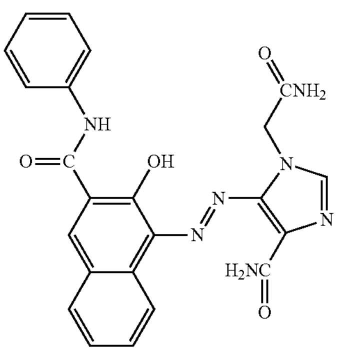
D-73
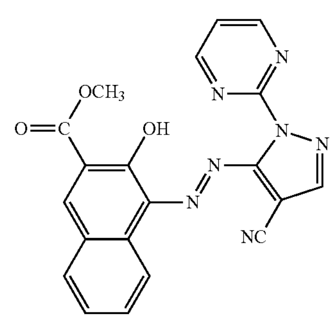

D-74
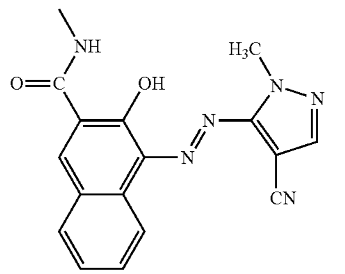
D-75
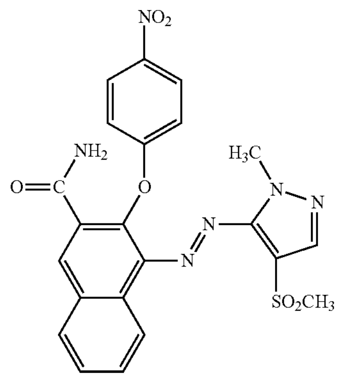
D-76
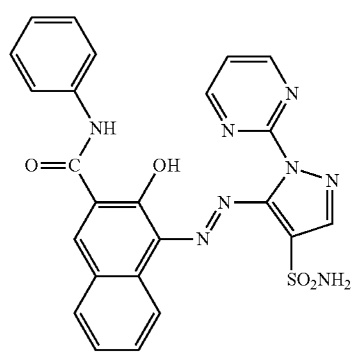
D-77
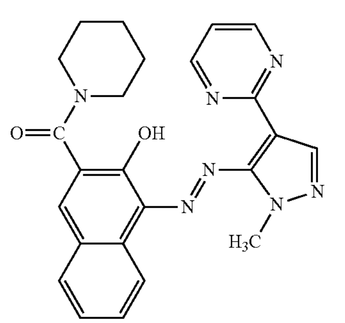
D-78
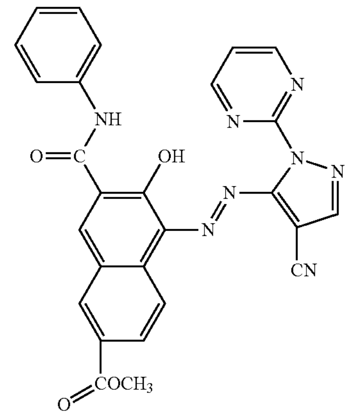
D-79
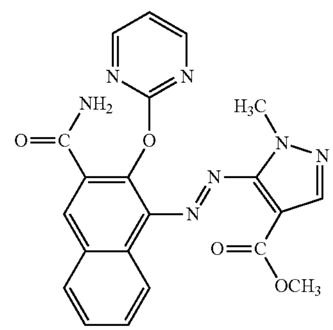
D-80
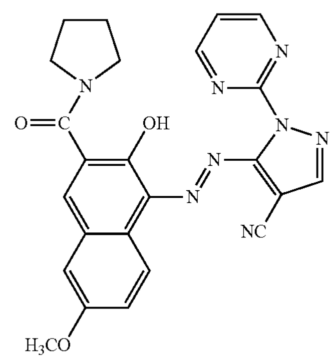
D-81
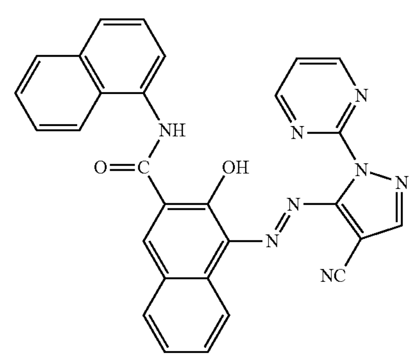

-continued
D-82
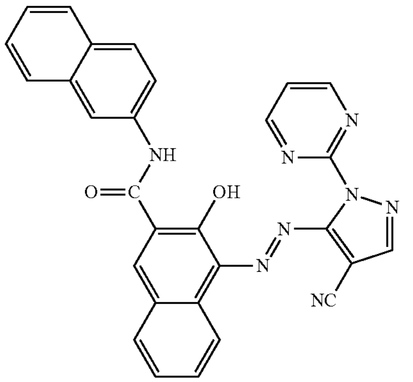
D-83
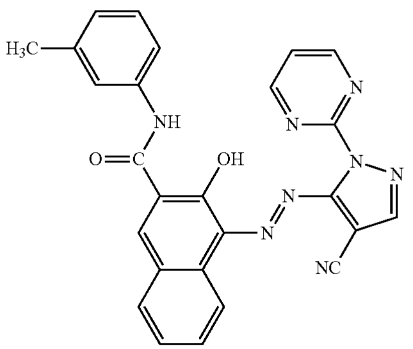
D-84
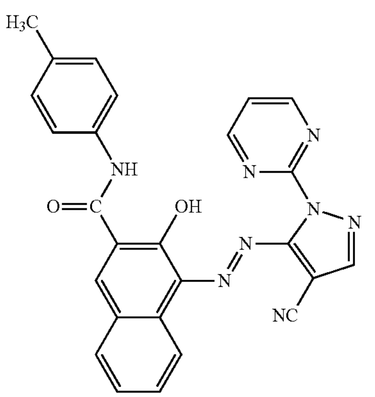
D-85
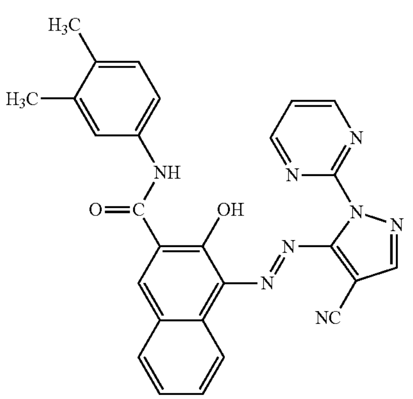
-continued
D-86
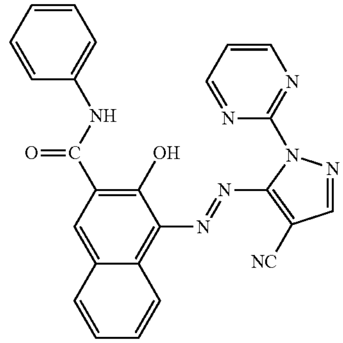
D-87
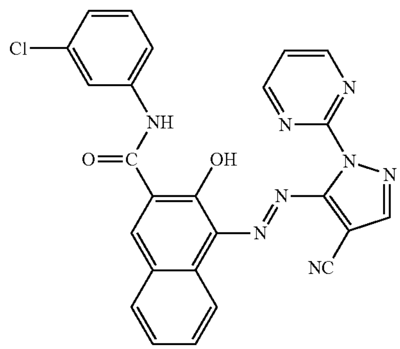
D-88
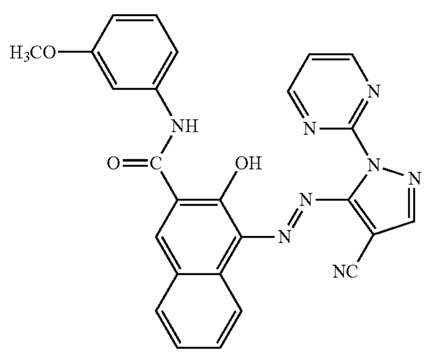
D-89
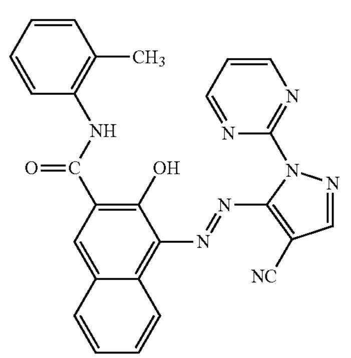

-continued
D-90
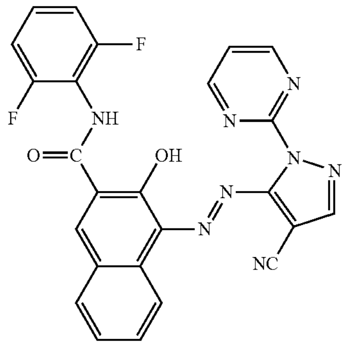
D-91
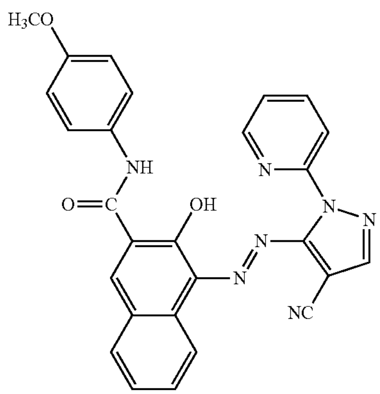
D-92
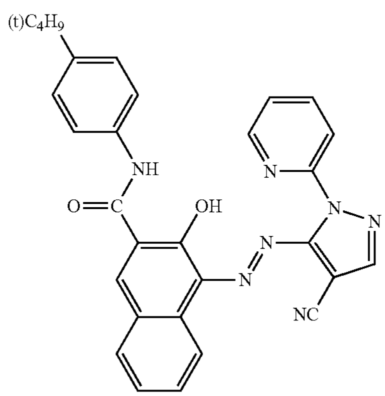
D-93
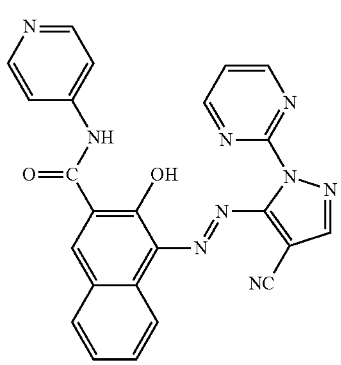
-continued
D-94
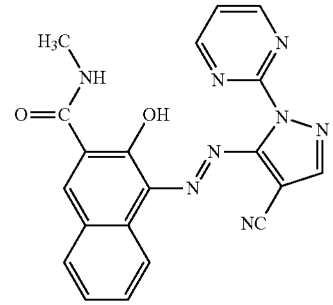
D-95
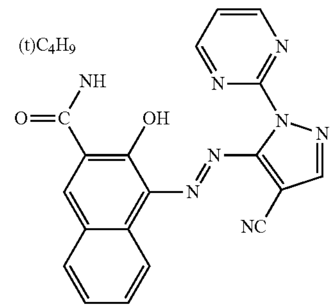
D-96
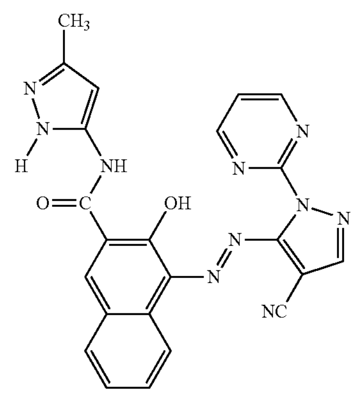
D-97
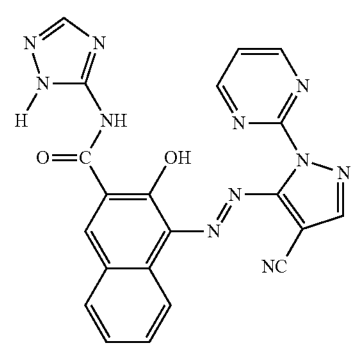

-continued
D-98
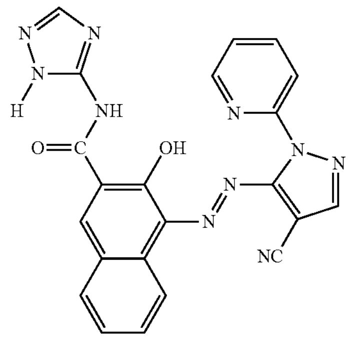
D-99
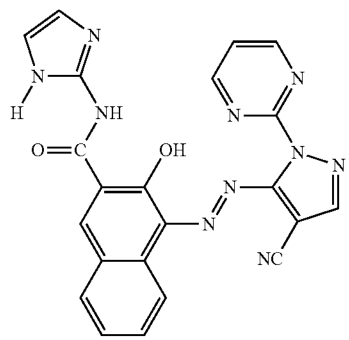
D-100
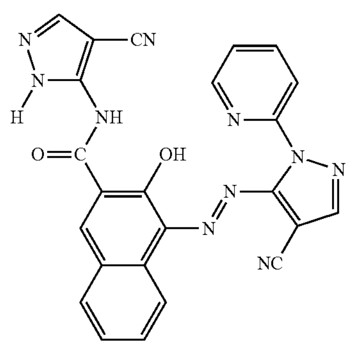
D-151
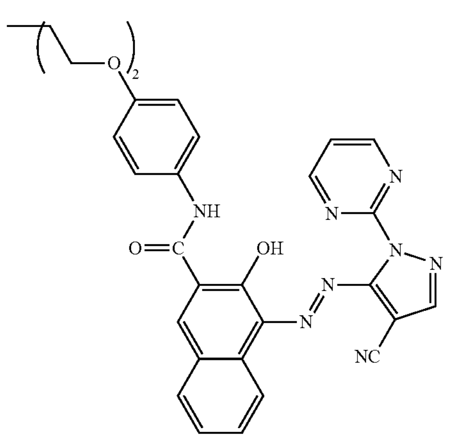
-continued
D-152
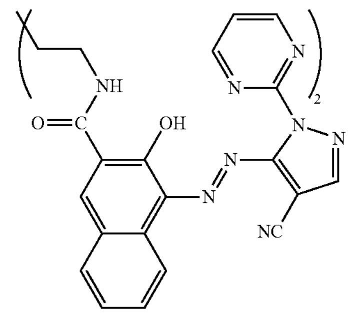
D-153
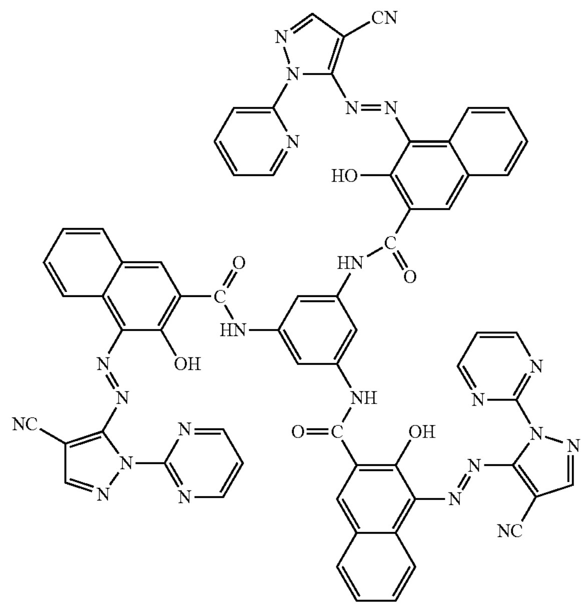
D-154
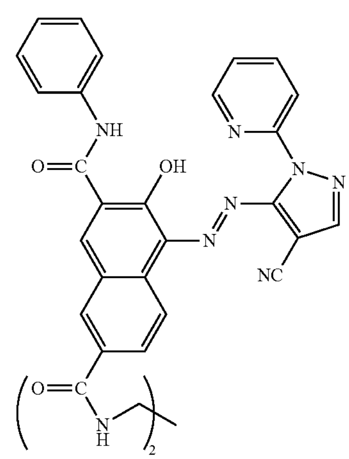

-continued
D-155
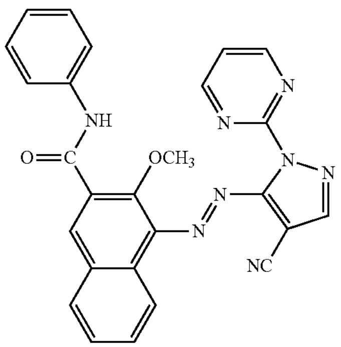
D-156
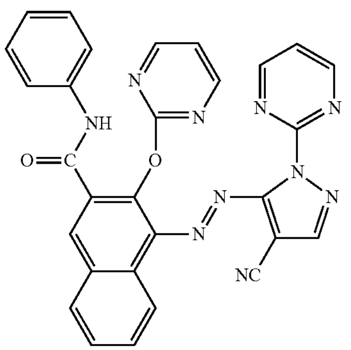
D-157
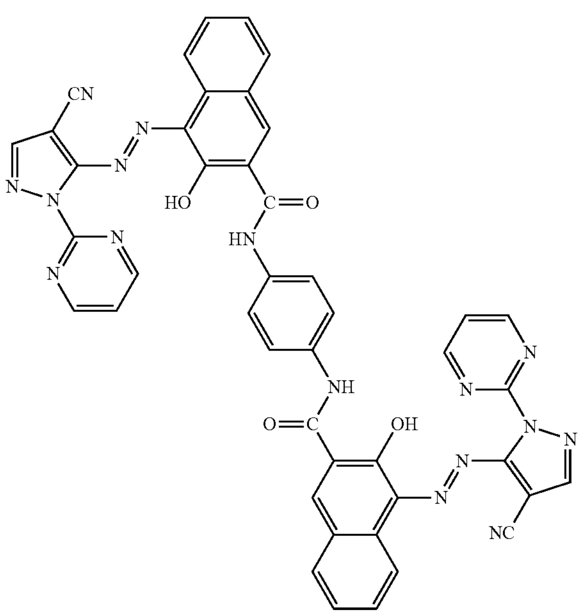
-continued
D-101
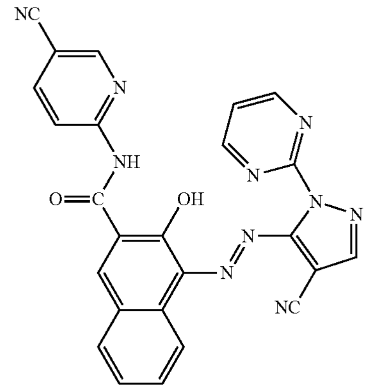
D-102
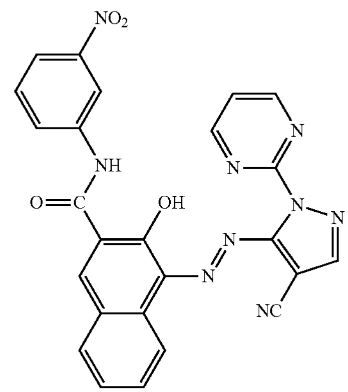
D-103
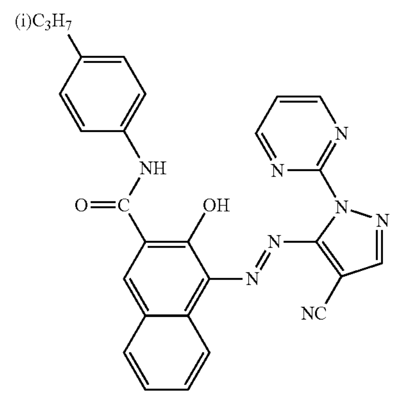
D-104
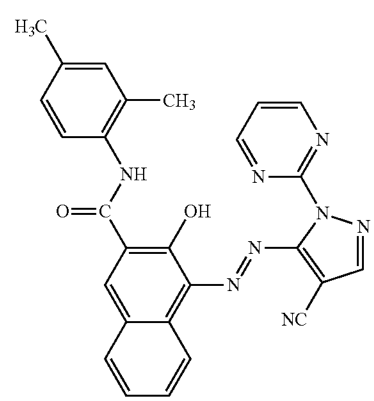

-continued
D-105
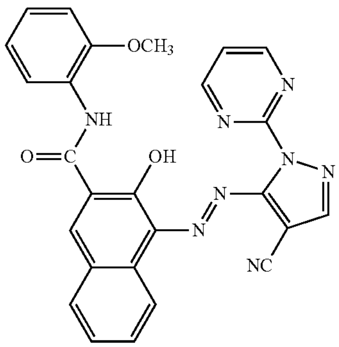
D-106
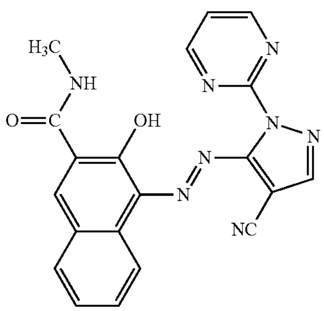
D-107
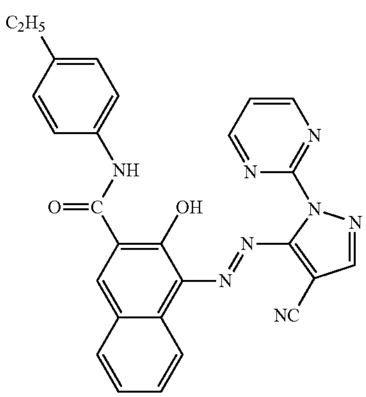
D-108
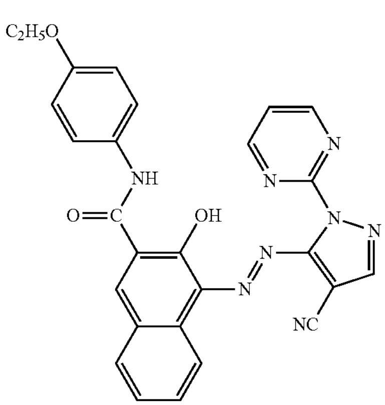
-continued
D-109
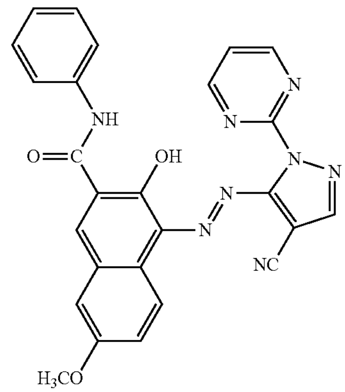
D-110
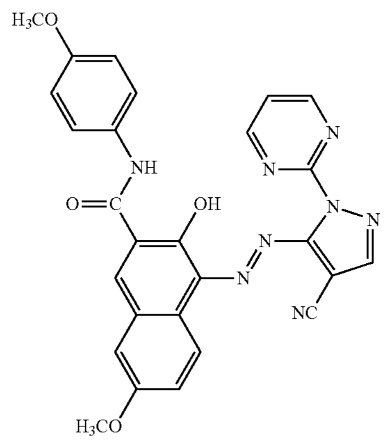
D-111
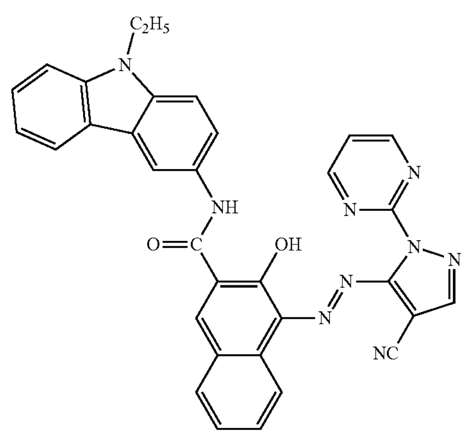
D-112
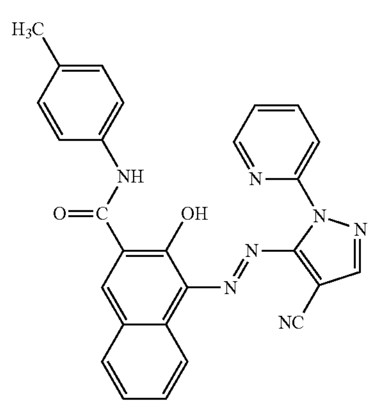

-continued
D-113
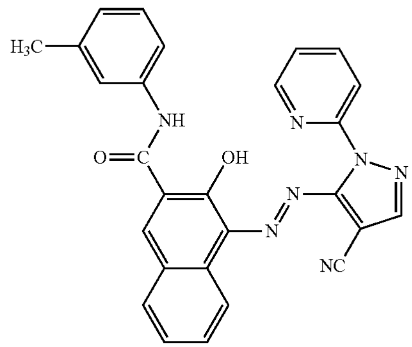
D-114
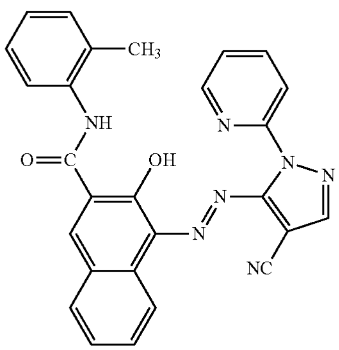
D-115
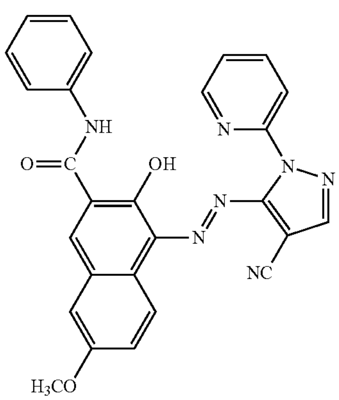
D-116
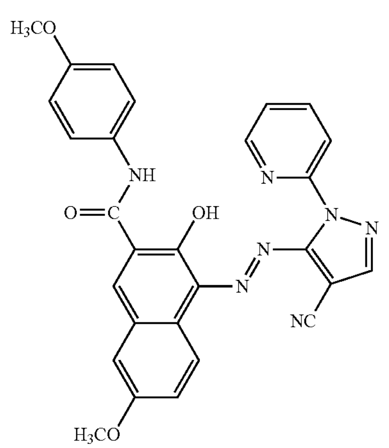
-continued
D-117
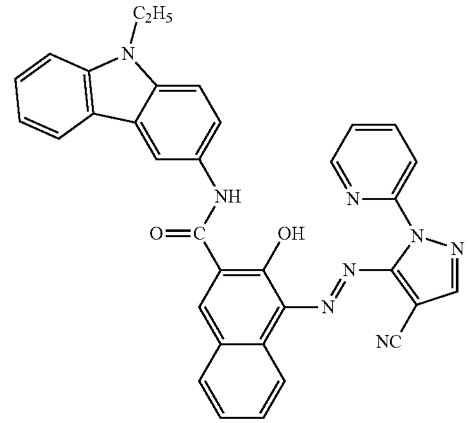
D-118
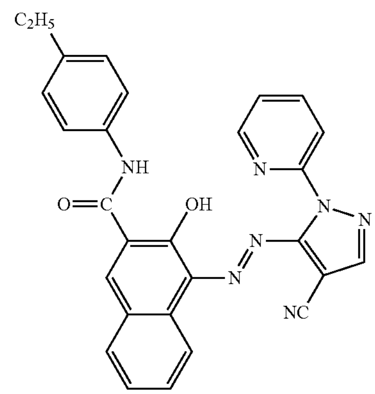
D-119
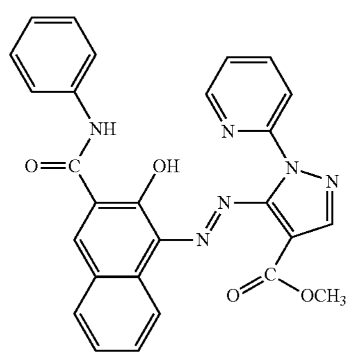
D-120
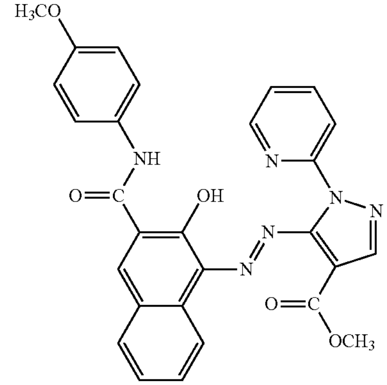

-continued
D-121
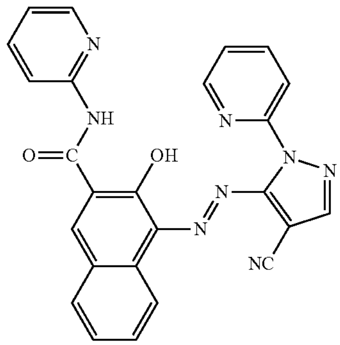
D-122
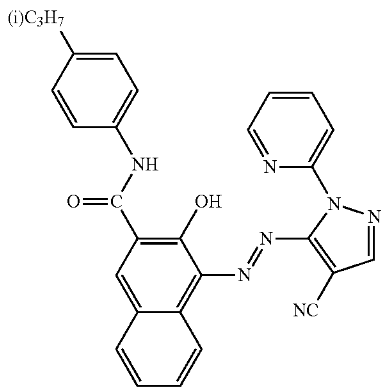
D-123
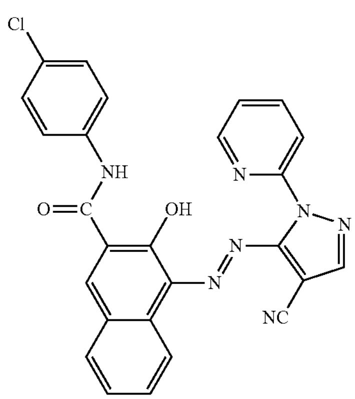
D-124
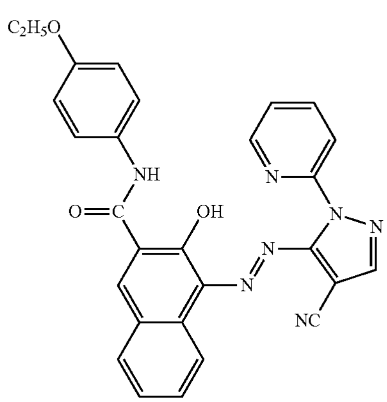
-continued
D-125
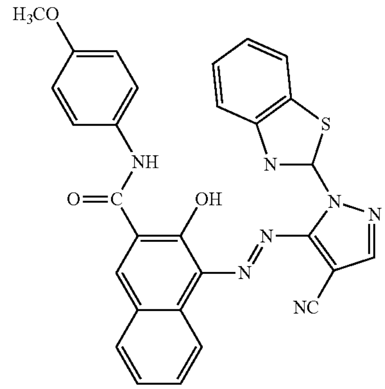
D-126
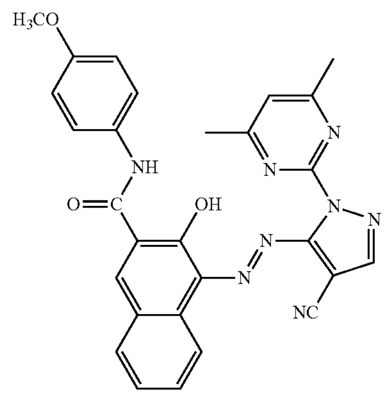
D-127
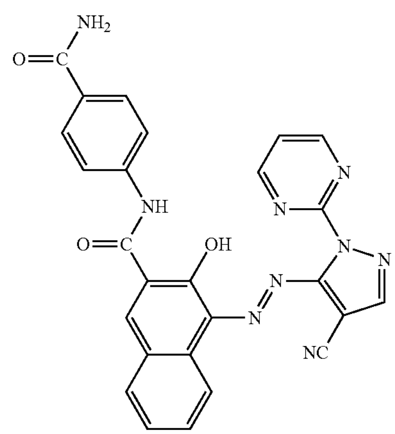
D-128
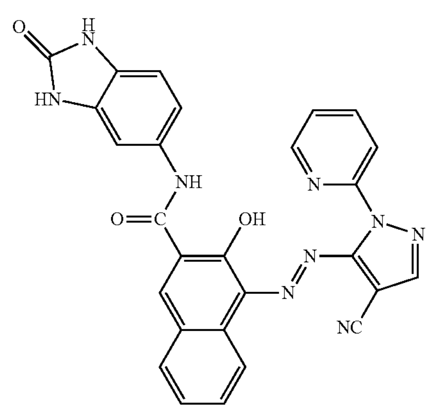

-continued
D-129
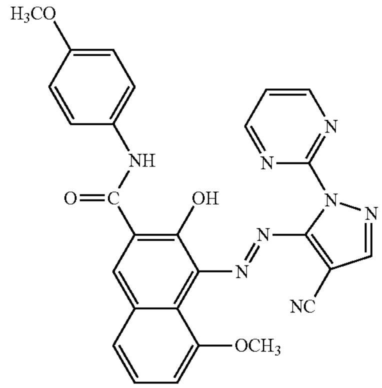
D-130
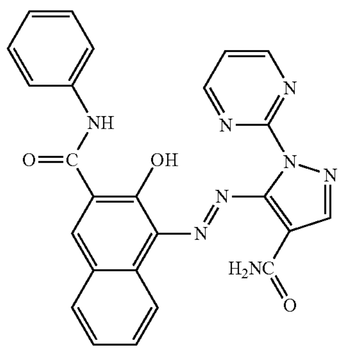
D-131
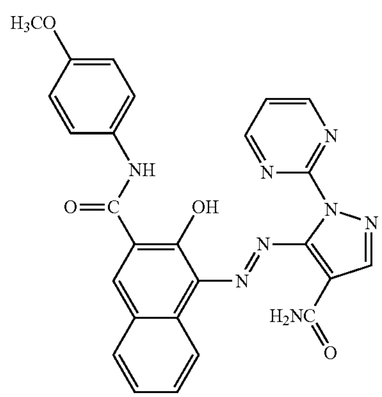
D-132
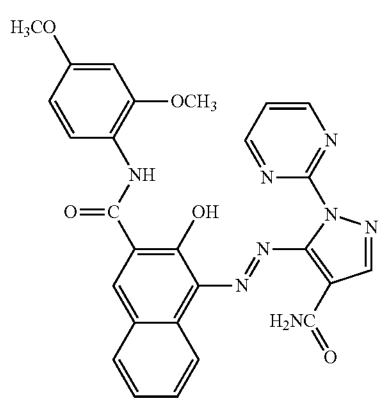
-continued
D-133
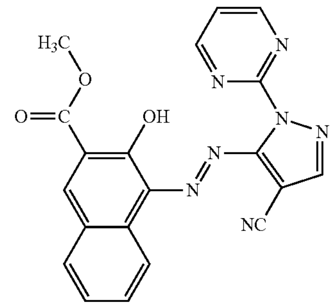
D-134
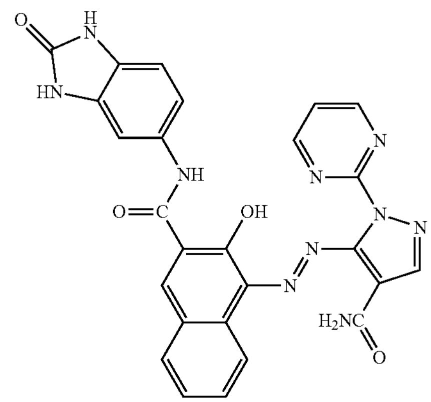
D-135
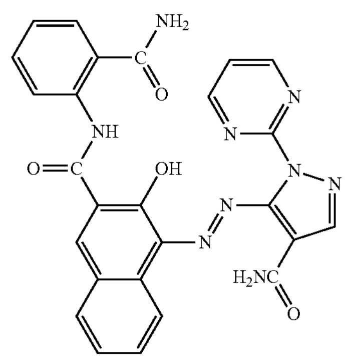
D-136
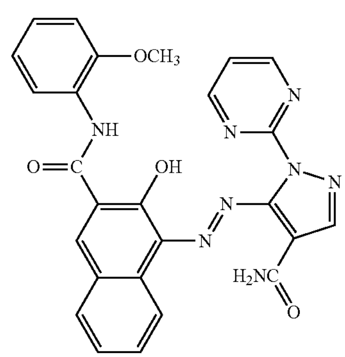

-continued
D-137
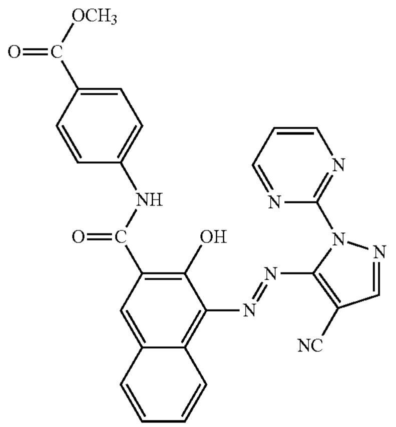
D-138
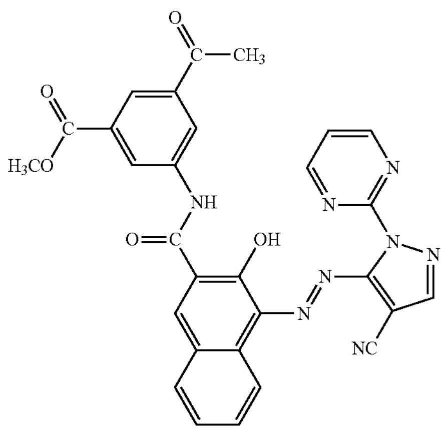
D-139
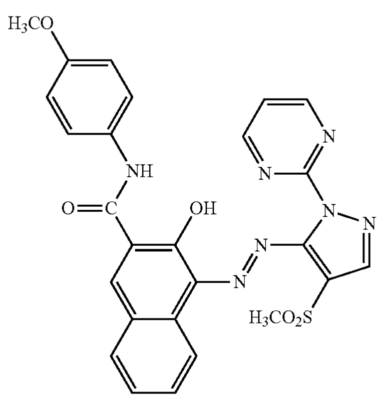
D-140
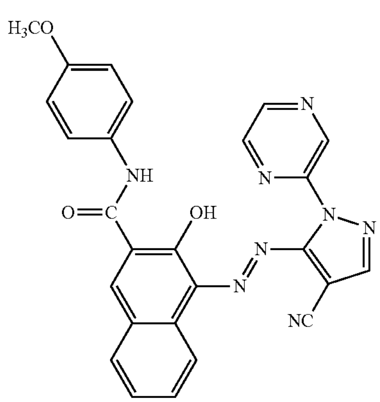
-continued
D-141
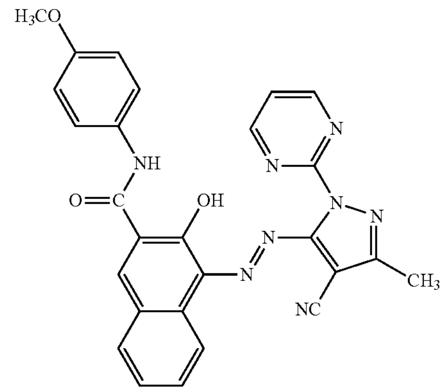
D-142
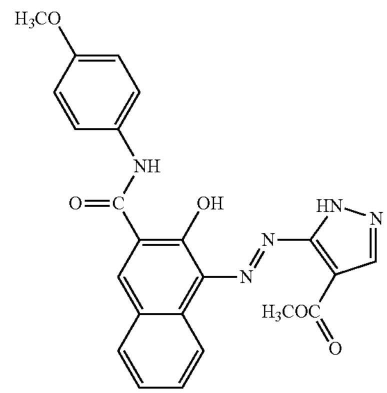
D-143
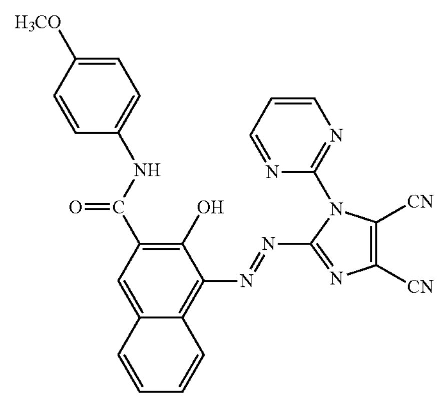
D-144
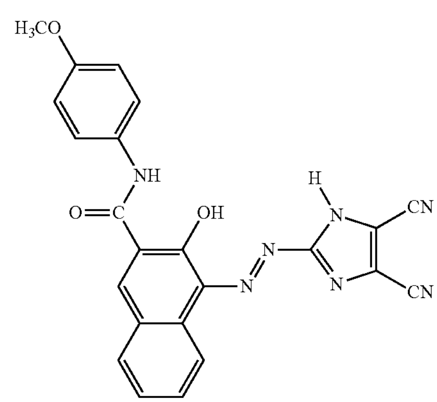

-continued
D-145
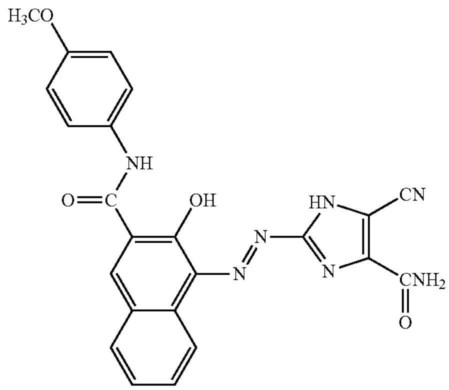
D-146
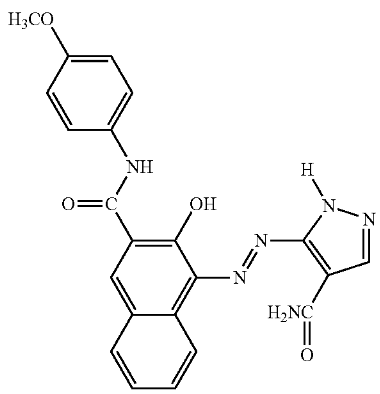
D-147
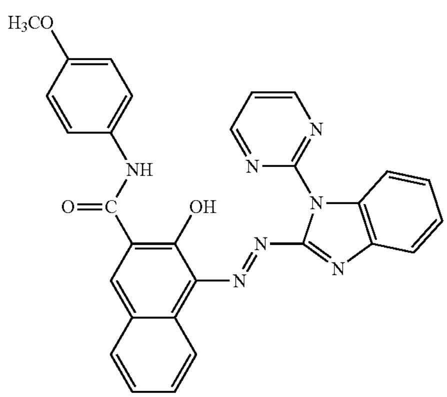
D-148
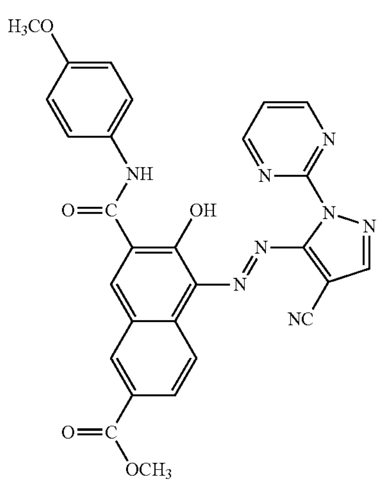
-continued
D-149
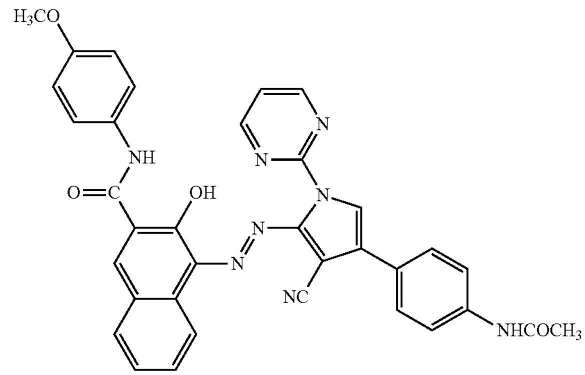
D-150
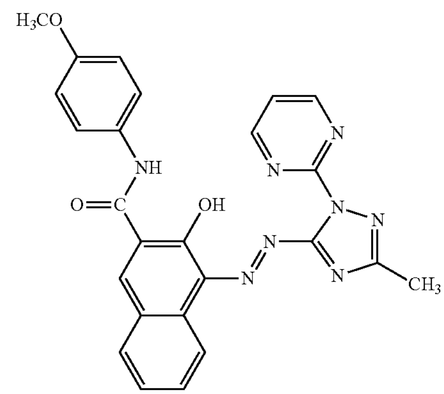
D-171
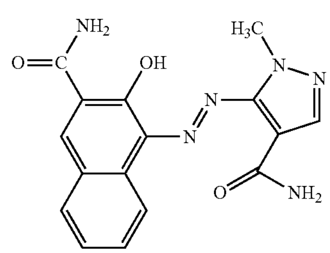
D-172
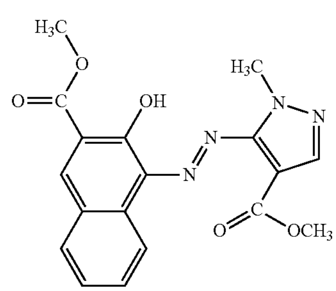

-continued
D-173
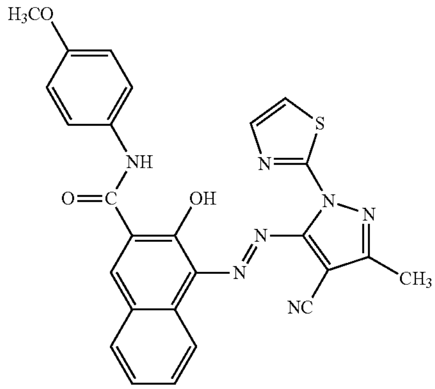
D-174
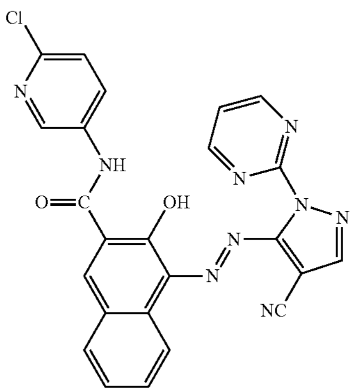
D-175
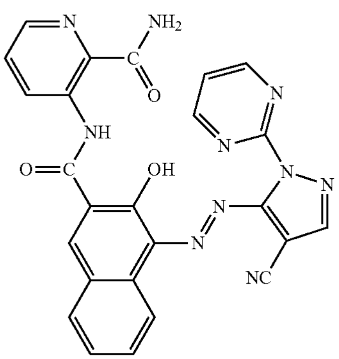
D-176
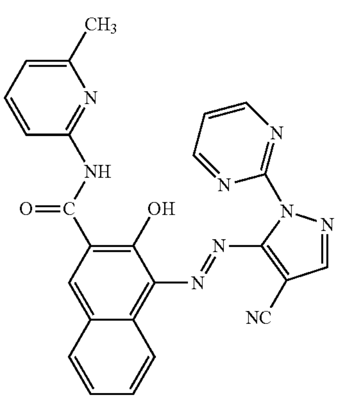
-continued
D-177
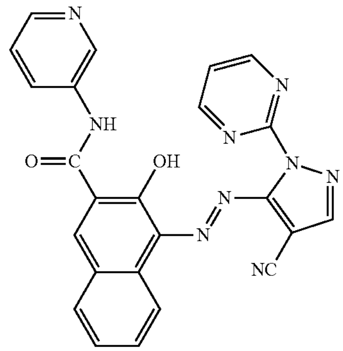
D-178
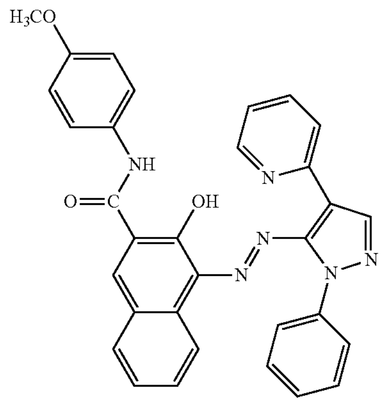
D-201
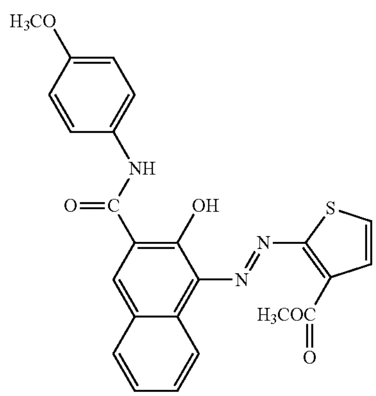
D-202
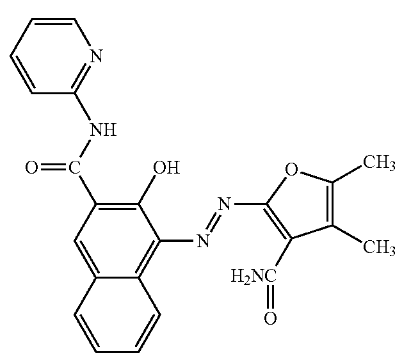

-continued
D-203
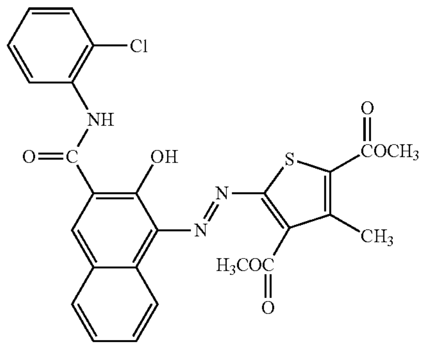
D-204
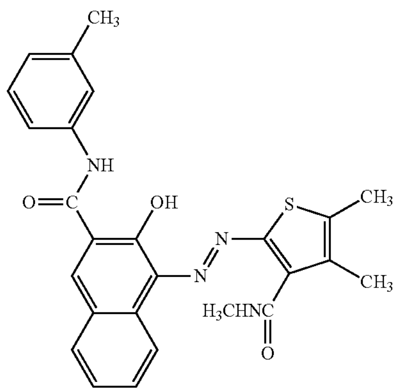
D-205
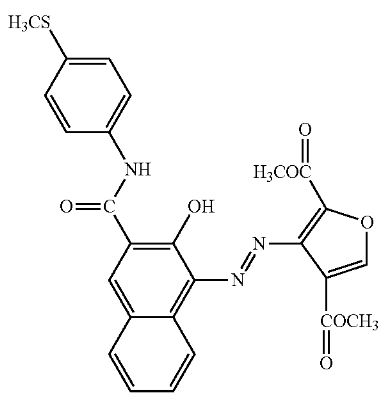
D-206
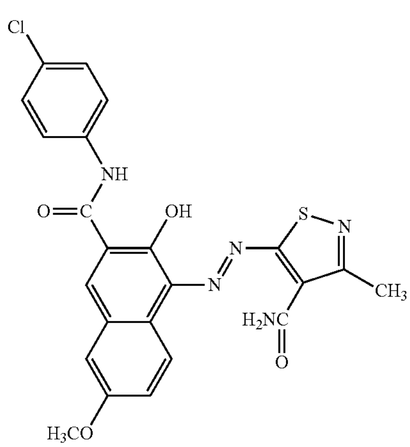
-continued
D-207
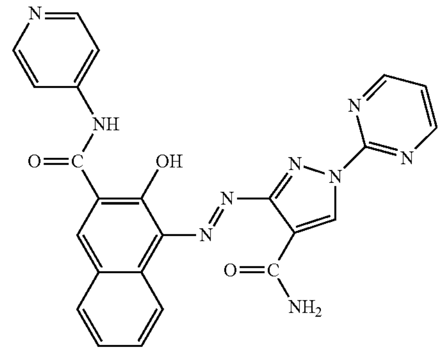
D-208
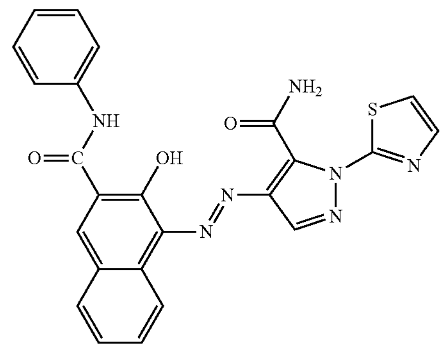
D-209
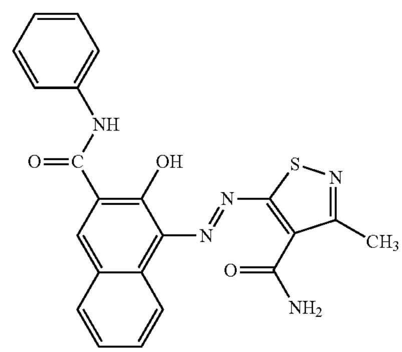
D-210
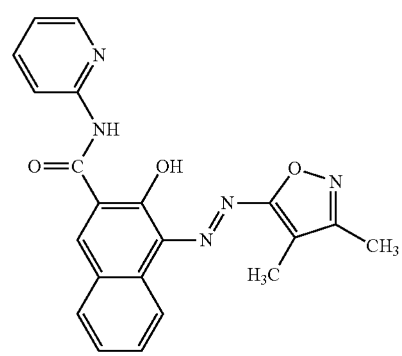

-continued
D-211
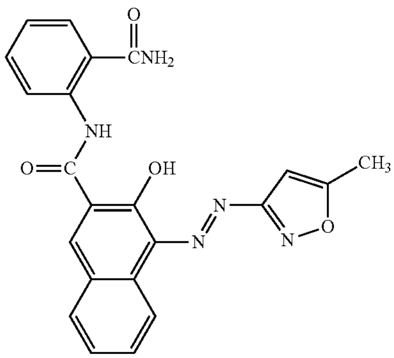
D-212
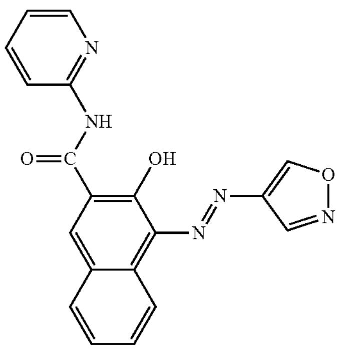
D-213
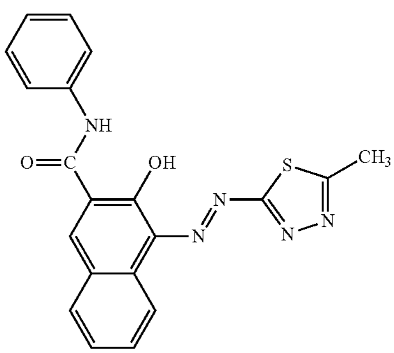
D-214
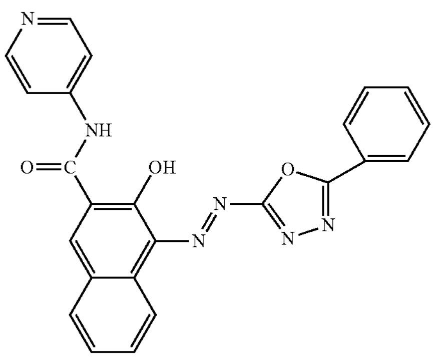
-continued
D-215
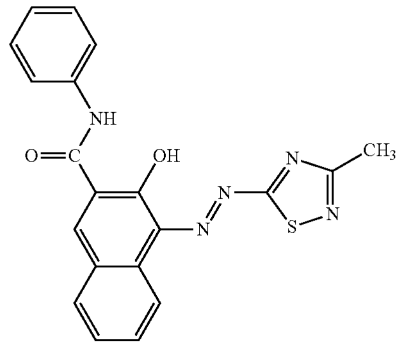
D-216
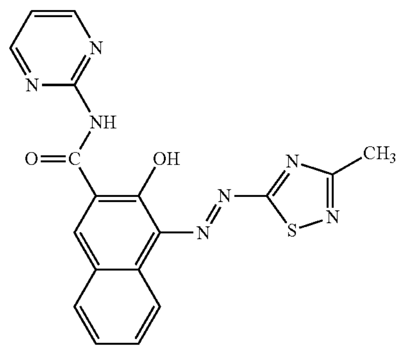
D-217
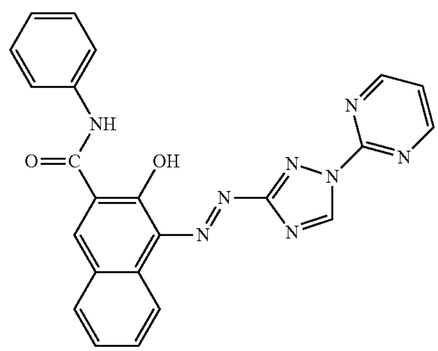
D-218
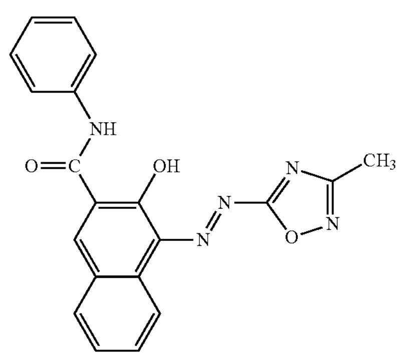

-continued
D-219
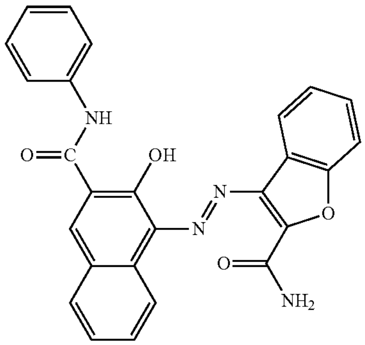
D-220
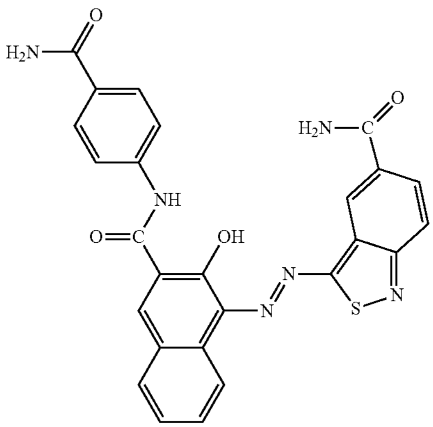
D-221
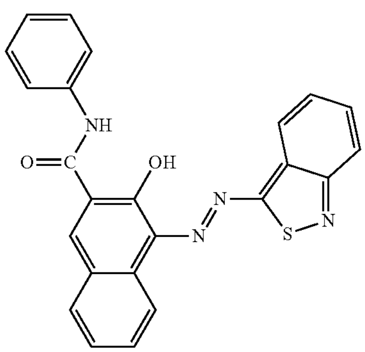
D-222
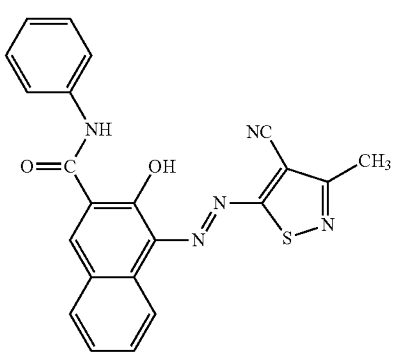
-continued
D-223
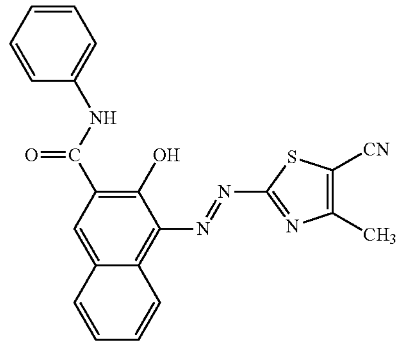
D-224
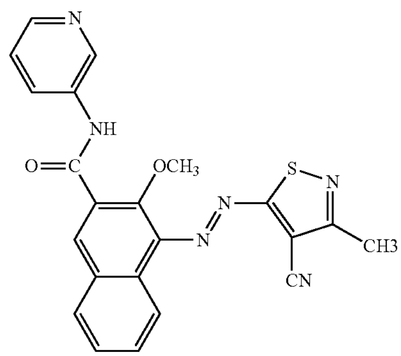
D-225
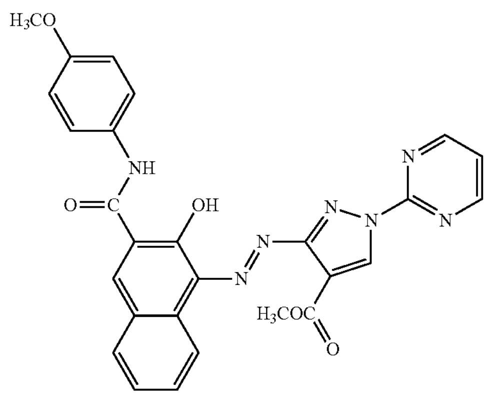
D-226
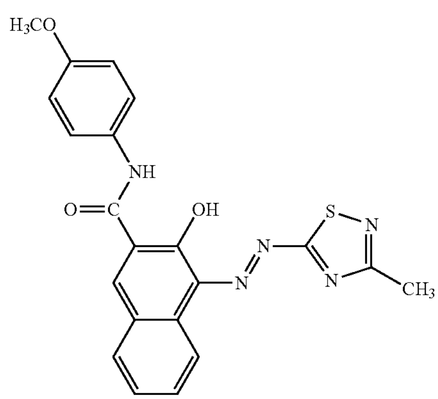

D-227
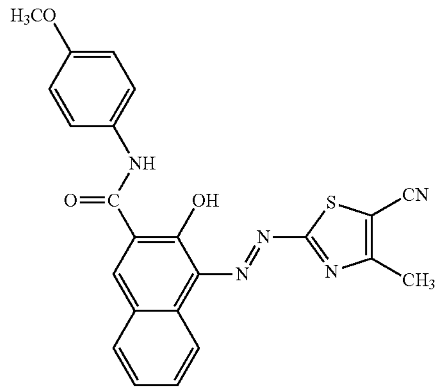
D-228
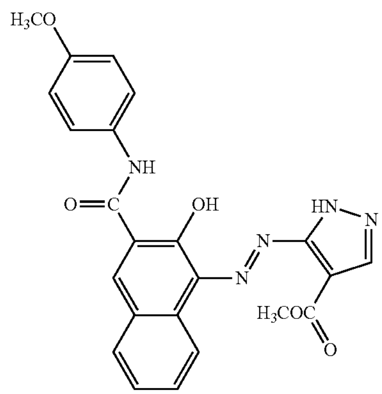
D-229
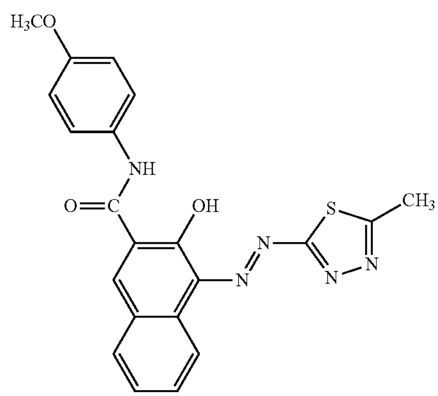
D-230
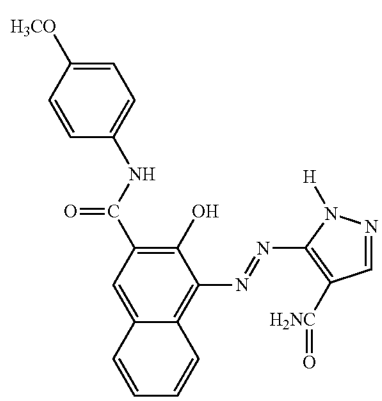
D-231
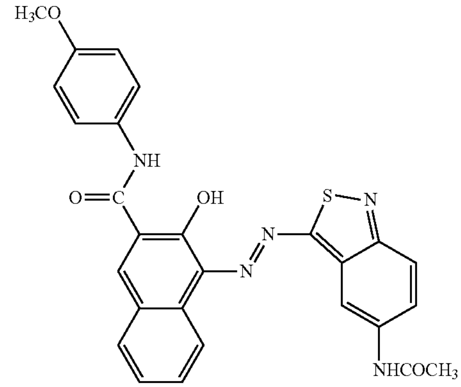
D-232
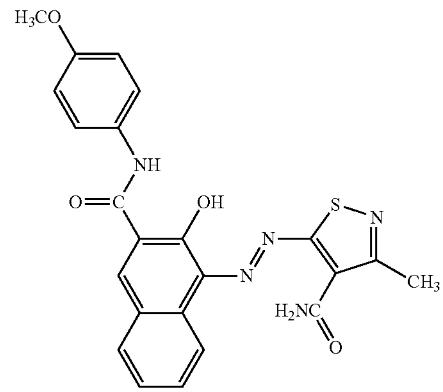
D-233
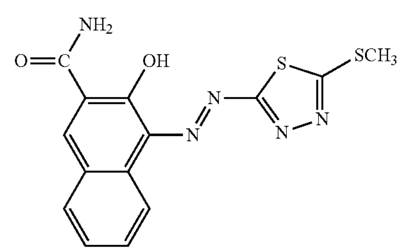
D-234
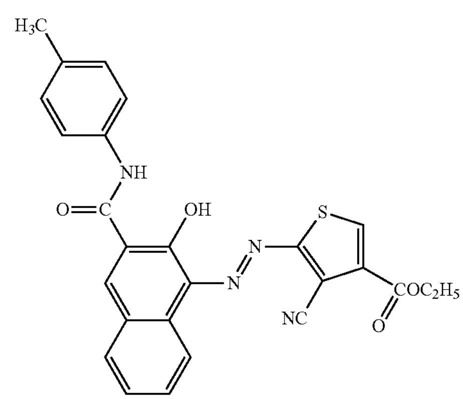

-continued
D-235
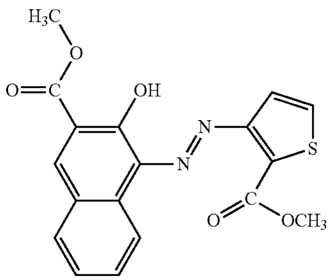
D-236
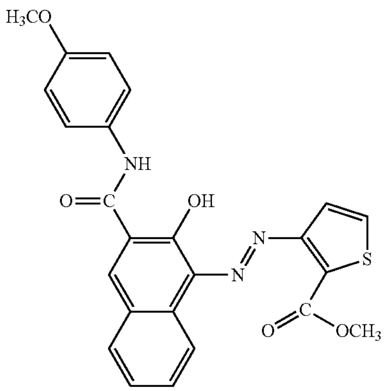
D-237
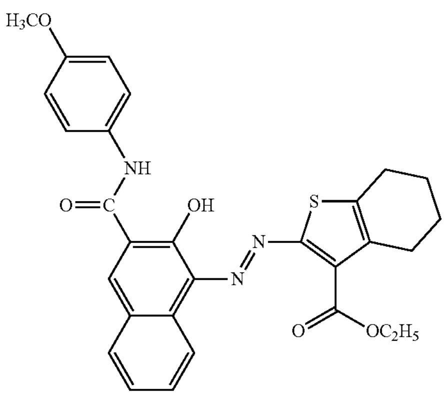
D-238
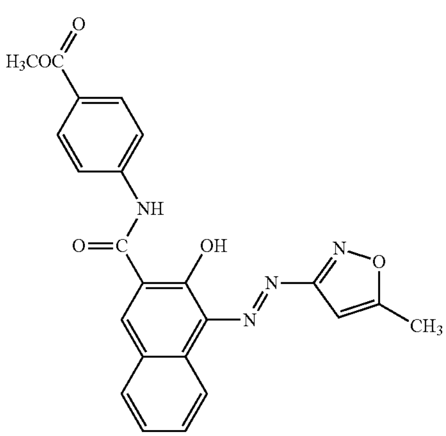
-continued
D-239
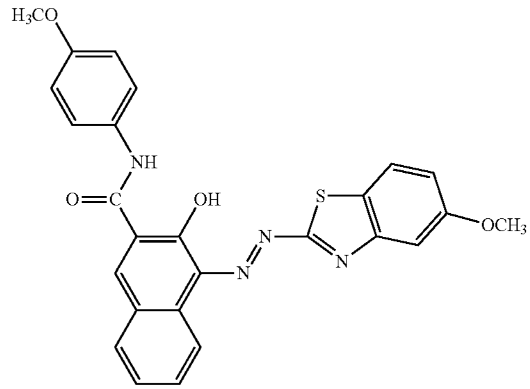
D-240
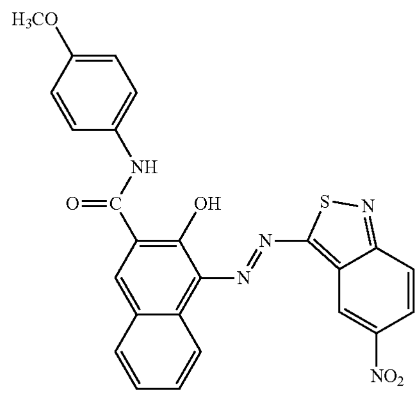
D-241
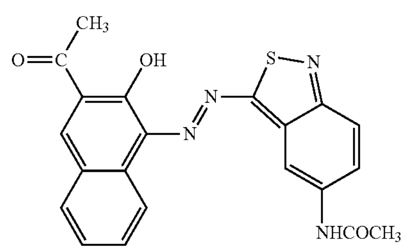
D-242
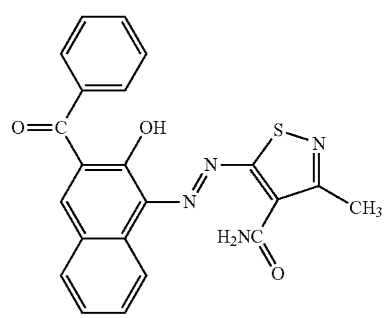

D-243
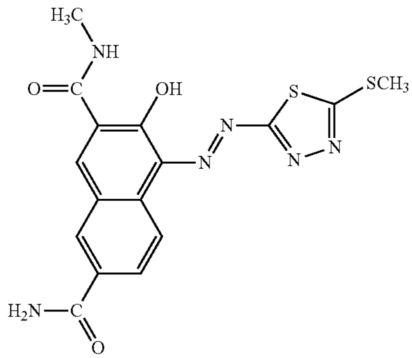
D-244
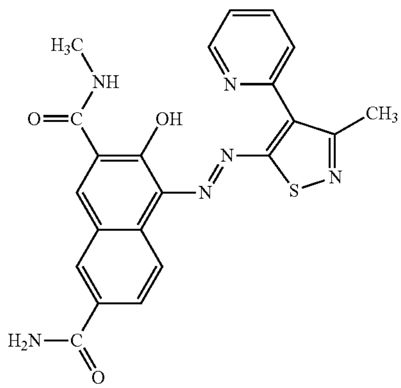
D-245
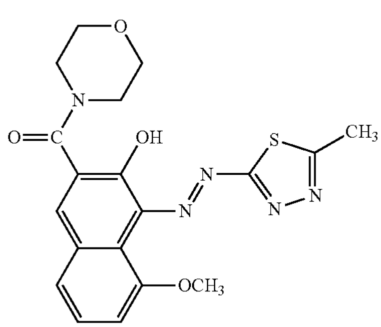
D-246
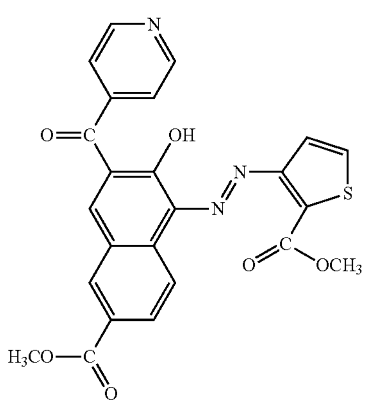
D-247
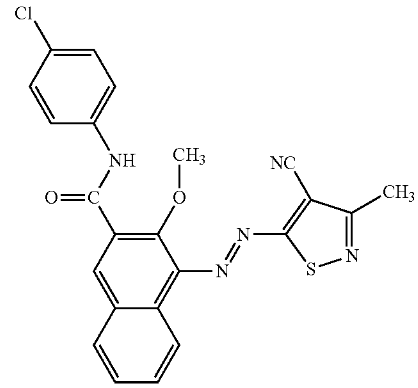
D-251
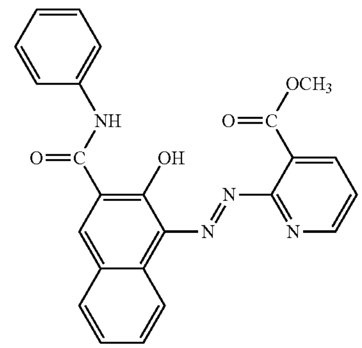
D-252
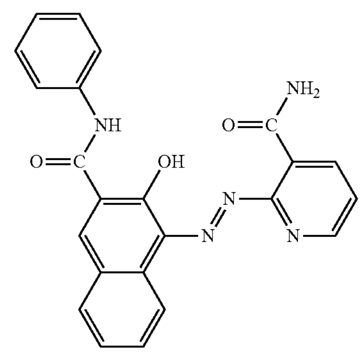
D-253
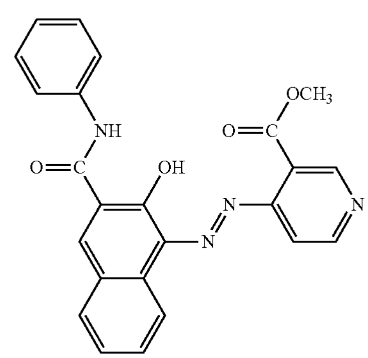

D-254
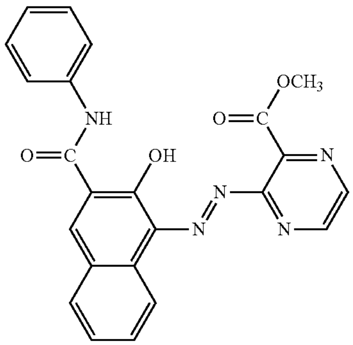
D-255
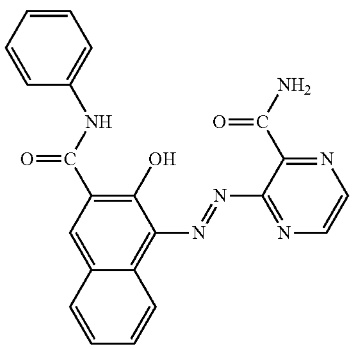
D-256
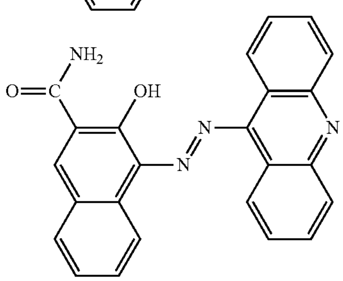
D-257
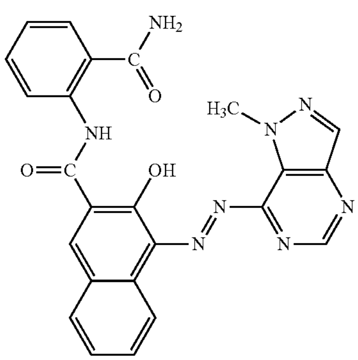
D-258
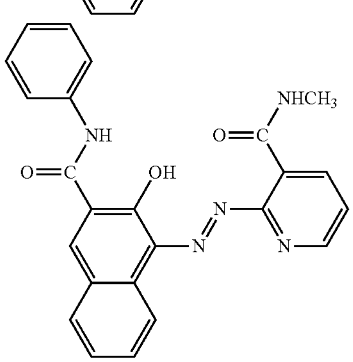
D-259
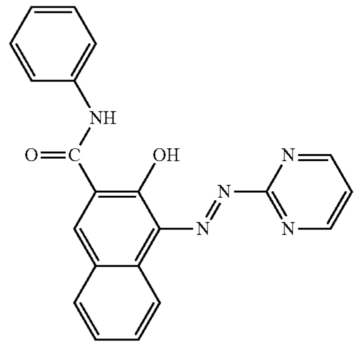
D-260
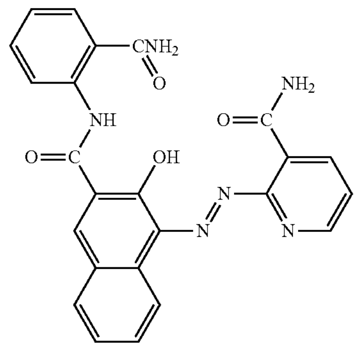
D-261
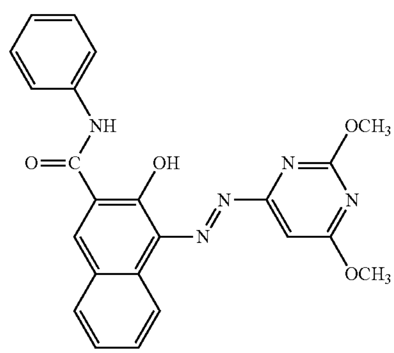
D-262
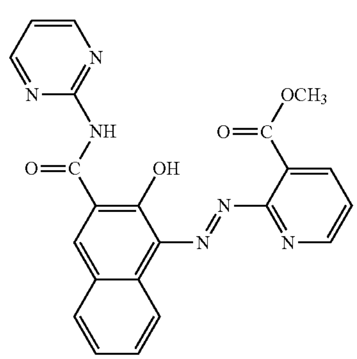

-continued
D-263
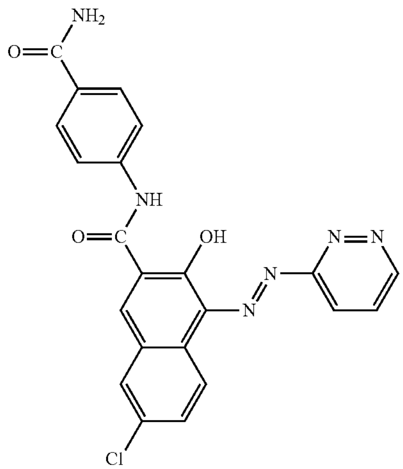
D-264
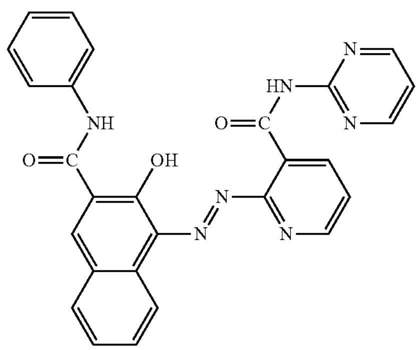
D-265
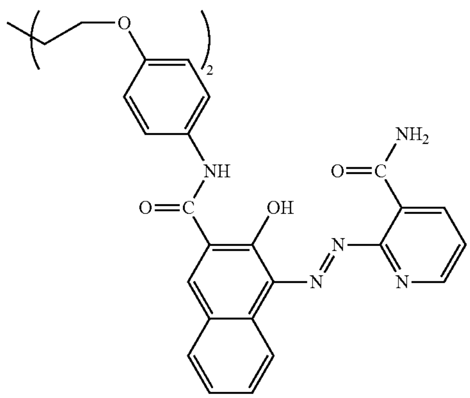
D-266
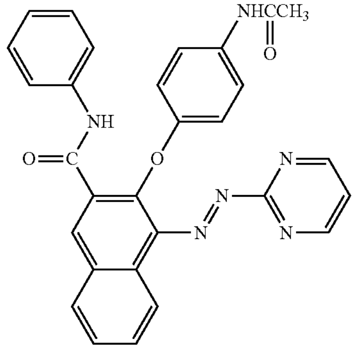
-continued
D-267
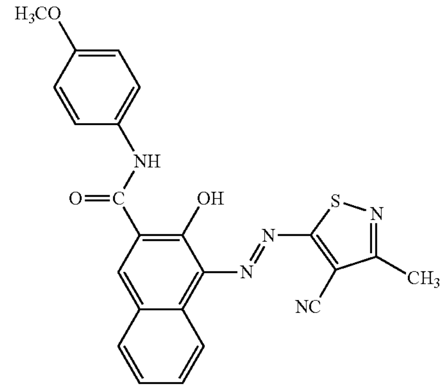
D-268
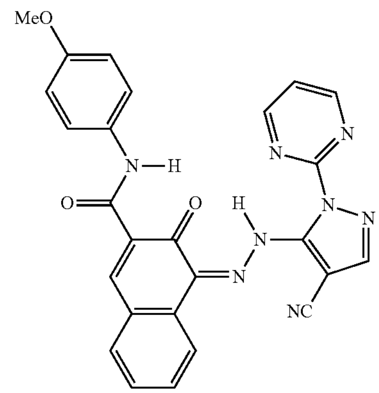
D-269
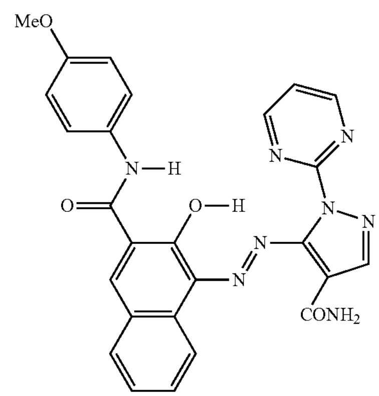
D-270
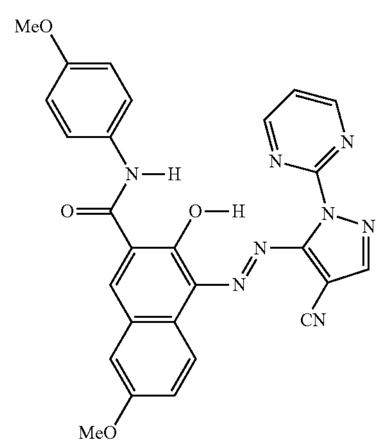
The azo pigment of the present invention represented by the formula (1) may be a pigment having a chemical structure represented by formula (1) or (2), or may be any tautomer of formula (1) or (2). Further, the azo pigment may be a pigment having any crystalline morphology (also referred to as polymorphism).

Crystalline polymorphism means having the same chemical composition but different configurations of building blocks (molecules or ions) in the crystal. The chemical and physical properties of the crystals are determined according to the crystal structure thereof, and each polymorphism can be differentiated from another by its rheology, color and other color characteristics. In addition, different polymorphisms can be identified through X-ray diffraction (powder X-ray diffraction measurement) as well as X-ray analysis (X-ray crystal structure analysis).

In the case in which the azo pigment represented by the formula (1) or (2) exhibits crystalline polymorphism, any of the structures may be used and a mixture of two or more structures may also be used. However, the pigment preferably contains an azo pigment having a monomorphic crystalline structure as a main component. In other words, the pigment preferably does not contain an azo pigment that exhibits crystalline polymorphism. The content of the azo pigment having a monomorphic crystalline structure is preferably from 70% to 100%, more preferably from 80% to 100%, even more preferably from 90% to 100%, still more preferably from 95% to 100%, and particularly preferably 100%, with respect to the total azo pigment. By including an azo pigment having a monophorphic crystalline structure, regularity in colorant molecule alignment can be improved and intermolecular/intramolecular interaction of the pigment can be enhanced, whereby a higher-order three-dimensional network structure can be readily formed. As a result, preferred effects in terms of performances that are necessary for an azo pigment, such as favorable color hue, light fastness, heat hastness, moisture fastness, oxidizing gas hastnsee, or solvent resistance, can be achieved.

The mixed ratio of the azo pigment that exhibits crystalline polymorphism in the azo pigment can be confirmed from physicochemical data obtained by measuring a solid substance by single-crystal X-ray crystallographic analysis, powder X-ray diffractiometry (XRD), crystal photomicroscopy (TEM), or IR (KBr method).

The above-mentioned tautomerization and/or crystalline polymorphism can be controlled by controlling production conditions during a coupling reaction.

When an acidic group exists in the azo pigment of the formula (1), part or all of the acidic groups may be in the form of a salt, or a salt-type pigment and a free acid-type pigment may be used in combination. Examples of the salt include salts of an alkali metal such as Na, Li, K or the like, ammonium salts that may be substituted by an alkyl group or a hydroxyalkyl group, and salts of an organic amine. Examples of the organic amine include a lower alkylamine, a hydroxy-substituted lower alkylamine, a carboxy-substituted lower alkylamine, and a polyamine having from 2 to 10 alkylene-imine units each containing 2 to 4 carbon atoms. The type of the salt is not limited to one, and two or more kinds may exist in combination.

When plural acidic groups are included in the molecule of the pigment used in the present invention, the plural acid groups may exist in the form of either a salt or an acid, and may be different from each other.

The azo pigment represented by the formula (1) may be in the form of a hydrate containing water molecules in the crystal thereof.

The pigment dispersion composition of the present invention may include two or more kinds of the azo pigment represented by the formula (1).

Further, in the present specification, the term "azo pigment represented by the formula (1)" not only refers to a single kind of azo pigment represented by the formula (1), but also a combination of two or more kinds of azo pigment represented by the formula (1) and a combination of the azo pigment represented by the formula (1) and a pigment other than the azo pigment represented by the formula (1), which will be described later.

In the following, an example of a method for producing the azo pigment represented by the formula (1) will be described. The azo pigment, which is represented by the following formula (6), can be produced by, for example, converting a heterocyclic amine represented by the following formula (4) to a diazonium and allowing the same to undergo coupling reaction with a compound represented by the following formula (5) under acidic conditions, and then performing post-treatment by an ordinary method. The azo pigment represented by the formula (1) can be produced by performing similar procedures using a heterocyclic amine corresponding to A of the formula (1) in place of the formula (4).

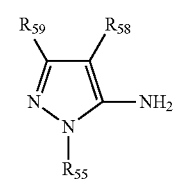

(4)

In the formula, $R_{55}$, $R_{58}$ and $R_{59}$ have the same definitions as that in the formula (2), respectively.

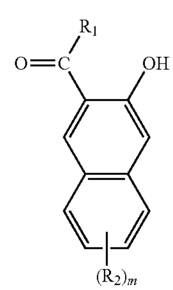

(5)

In the formula, $R_1$, $R_2$ and m have the same definitions as that in the formula (1), respectively.

A reaction scheme will be illustrated below.

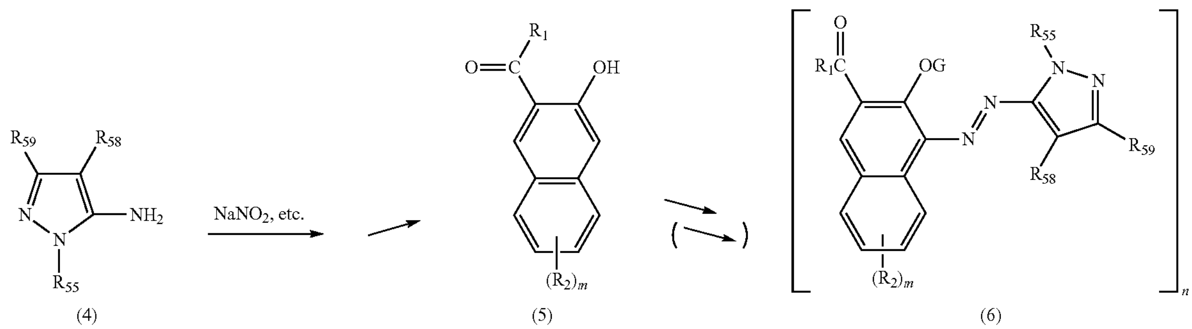

In the formulae, G, $R_1$, $R_2$, $R_{55}$, $R_{58}$, $R_{59}$, m and n have the same definitions as that in the formula (1) or (2), respectively.

Some of the heterocyclic amines represented by an amino body of the formulae (4) and (A-1) to (A-32) are commercially available, but most of them can be produced by a known conventional process, for example, a process described in Japanese Patent No. 4022271. The heterocyclic coupler represented by the formula (5) is commercially available or can be produced by a process described in JP-A No. 2008-13472 or a process similar to the same. The diazotization reaction of a heterocyclic amine, described in the above reaction scheme, can be carried out by, for example, allowing the compound to react with a reagent such as sodium nitrite, nitrosylsulfuric acid or isoamyl nitrite in an acidic solvent such as sulfuric acid, phosphoric acid or acetic acid, at a temperature of 15° C. or lower for from about 10 minutes to about 6 hours. The coupling reaction may be carried out by reacting the diazonium salt obtained by the above process with the compound represented by the formula (5) at a temperature of 40° C. or lower, preferably 25° C. or lower, for from about 10 minutes to about 12 hours.

The synthesis of an azo pigment in which n in the formula (1) or (2) is 2 or more may be carried out in a similar manner to the scheme described above, by synthesizing a raw material in which a substitutable divalent, trivalent or tetravalent substituent is introduced in $R_1$ to $R_2$, $R_{55}$, $R_{59}$, $R_{58}$ or the like in the formula (4) or (5).

The reaction product may form precipitated crystals therein. However, these precipitated crystals can be collected by filteration generally by adding water or an alcoholic solvent to the reaction solution so as to allow the crystals to precipitate. The crystals thus collected by filtration are washed and dried as necessary, whereby an azo pigment represented by the formula (1) is obtained.

The azo pigment represented by the formula (1) or (2) is obtained as a crude azo pigment by the above-described production process. In the invention, the crude azo pigment is preferably used after subjecting the same to post-treatment. The methods of post-treatment include, for example, processes for controlling pigment particles via milling treatment (such as solvent-salt milling, salt milling, dry milling, solvent milling or acid pasting) or solvent heating treatment; and processes of treating surfaces by using, for example, a resin, a surfactant or a dispersant.

The azo pigment of the present invention represented by the formula (1) or (2) is preferably subjected to, as post-treatment, solvent heating treatment and/or solvent-salt milling.

By performing solvent-salt milling, the average primary particle diameter of the azo pigment represented by the formula (1) can be easily controlled to be within the above-stated preferred range.

Examples of the solvent to be used for the solvent heating treatment include water; aromatic hydrocarbon solvents such as toluene and xylene; halogenated hydrocarbon solvents such as chlorobenzene and o-dichlorobenzene; alcoholic solvents such as isopropanol and isobutanol; polar aprotic organic solvents such as N,N-dimethylformamide, N,N-dimethylacetamide, and N-methyl-2-pyrrolidone; glacial acetic acid; pyridine; and mixtures thereof. An inorganic or organic acid or base may be further added to these solvents. The temperature of the solvent heating treatment varies depending upon the size of the primary particles of the pigment to be obtained, but is preferably in the range of from 40° C. to 150° C., and more preferably from 60° C. to 100° C. The treatment time is preferably in the range of from 30 minutes to 24 hours.

One exemplary process of solvent-salt milling includes placing a crude azo pigment, an inorganic salt, and an organic solvent which does not dissolve the crude azo pigment and the inorganic salt in a kneader, and then performing kneading and milling of the mixture.

The inorganic salt to be used is preferably water-soluble inorganic salts, such as sodium chloride, potassium chloride, and sodium sulfate.

The inorganic salt preferably has an average particle diameter of from 0.5 μm to 50 μm. The amount of the inorganic salt to be used is preferably from 3 to 20 times the amount of the crude azo pigment by mass, more preferably from 5 to 15 times by mass.

A water-soluble organic solvent is suitably used as the organic solvent, which preferably has a high boiling point from the viewpoint of safety since the solvent becomes easily vaporizable as the temperatures during kneading increases. Examples of the organic solvents include diethylene glycol, glycerin, ethylene glycol, propylene glycol, liquid polyethylene glycol, liquid polypropylene glycol, 2-(methoxymethoxy)ethanol, 2-butoxyethanol, 2-(isopentyloxy)ethanol, 2-(hexyloxy)ethanol, diethylene glycol monomethyl ether, diethylene glycol monoethyl ether, diethylene glycol monobutyl ether, triethylene glycol, triethylene glycol monomethyl ether, 1-methoxy-2-propanol, 1-ethoxy-2-propanol, dipropylene glycol, dipropylene glycol monomethyl ether, dipropylene glycol monomethyl ether, dipropylene glycol, and mixtures thereof. The amount of the water-soluble organic solvent to be used is preferably from 0.1 to 5 times the amount of the crude azo pigment by mass. The kneading temperature is preferably in the range of from 20° C. to 130°

C., and particularly preferably from 40° C. to 110° C. Exemplary kneaders include a kneader and a mix muller.

Further, a method described in paragraph numbers [0007] to [0071] of JP-A No. 2009-263501 is also preferably used for solvent-salt milling.

This preferred method for solvent-salt milling is a method in which anhydrous sodium sulfate is used as a milling agent, the anhydrous sodium sulfate having an average particle diameter of 5.5 μm or less and containing 5 volume % or less of particles having a particle diameter of 10.0 μm or more.

In the invention, the anhydrous sodium sulfate used for milling a pigment preferably has an average particle diameter of from 2.0 μm to 4.0 μm, and contains 1 volume % or less of particles having a particle diameter of 10.0 μm or more.

Further, the anhydrous sodium sulfate used for milling a pigment preferably has a water content of 1.0% by weight or less. Further, the anhydrous sodium sulfate used for milling a pigment preferably contains an anti-solidifying agent.

<Other Pigments>

The pigment dispersion composition of the present invention may contain a further pigment in addition to the azo pigment represented by the formula (1), as long as the object of the present invention is not impaired.

The other pigments than the azo pigment represented by the formula (1) are not particularly limited, and examples thereof include one or more pigments and/or derivatives thereof selected from an azo pigment, a disazo pigment, a benzimidazolone pigment, a condensed azo pigment, an azo lake pigment, an anthraquinone pigment, a diketopyrrolopyrrole pigment, a quinacridone pigment, an isoindoline pigment, an isoindolinone pigment, a perinone pigment, a perylene pigment, and the like.

Examples of the other pigments include compounds classified into a group of pigments according to the color index (C.I.; issued by The Society of Dyers and Colourists), such as the compounds having the following color index (C.I.) numbers:

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279;

C.I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213 and 214;

C.I. Pigment Orange 2, 5, 13, 16, 17:1, 31, 34, 36, 38, 43, 46, 48, 49, 51, 52, 55, 59, 60, 61, 62, 64, 71 and 73;

C.I. Pigment Green 7, 10, 36 and 37;

C.I. Pigment Blue 1, 2, 15, 15:1, 15:2, 15:3, 15:4, 15:6, 16, 22, 60, 64, 66, 79, 79 in which a Cl substituent is changed to OH, and 80;

C.I. Pigment Violet 1, 19, 23, 27, 32, 37 and 42;

C.I. Pigment Brown 25 and 28; and

C.I. Pigment Black 1 and 7.

However, the present invention is not limited to these pigments.

Among them, examples of the pigment that can be preferably used in the present invention include the following pigments:

C.I. Pigment Yellow 11, 24, 108, 109, 110, 138, 139, 150, 151, 154, 167, 180 and 185;

C.I. Pigment Orange 36 and 71;

C.I. Pigment Red 122, 150, 171, 175, 177, 209, 224, 242, 254, 255 and 264;

C.I. Pigment Violet 19, 23, 29 and 32;

C.I. Pigment Blue 15:1, 15:3, 15:6, 16, 22, 60 and 66;

C.I. Pigment Green 7, 36 and 37; and

C.I. Pigment Black 1 and 7.

Specific examples of the above inorganic pigment include titanium oxide, barium sulfate, calcium carbonate, zinc white, lead sulfate, yellow lead, zinc yellow, iron oxide red (red iron oxide (III)), cadmium red, ultramarine blue, Prussian blue, chromium oxide green, cobalt green, amber, titanium black, synthetic iron black, and carbon black. In the present invention, the pigment may be used alone or in a combination of two or more kinds thereof.

In particularly, from the viewpoint of further improving spectral properties (color hue) as a red pattern (red color filter), the pigment dispersion composition of the present invention preferably contains at least one kind of pigment having a color hue selected from red, yellow, orange, and violet, together with an azo pigment represented by the formula (1). The pigment to be used in combination with the azo pigment represented by the formula (1) may be at least one selected from the pigments having a color index number as described above. In this way, the degree of transmissivity at a short wavelength side (for example, a wavelength of 500 nm or shorter (more preferably, a wavelength of 400 nm or shorter)) can be further suppressed whereby an even favorable red color hue can be obtained.

When a pigment other than the azo pigment represented by the formula (1) (in particular, a pigment having a color hue of red, yellow, orange or violet) is used in combination, the content thereof is preferably 50% by mass or less with respect to the total mass of the pigments in the pigment dispersion composition of the present invention (or the colored curable composition of the present invention), more preferably 40% by mass or less, and particularly preferably 30% by mass or less.

Although the lower limit of the content of the pigment other than the azo pigment represented by the formula (1) (in particular, a pigment having a color hue of red, yellow, orange or violet) is not particularly limited, it is preferably 5% by mass, more preferably 10% by mass, from the viewpoint of controlling the spectral properties.

<Dispersant>

The pigment dispersion composition of the present invention contains at least one kind of dispersant.

The dispersant is not particularly limited, and a known pigment dispersant may be used.

The dispersant used in the present invention may be, for example, a graft copolymer containing a nitrogen atom.

The graft copolymer containing a nitrogen atom preferably has a repeating unit containing a nitrogen atom in its main chain. In particular, the graft copolymer containing a nitrogen atom preferably has a repeating unit represented by the formula (A) or/and a repeating unit represented by the formula (B).

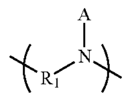

(A)

In the formula (A), $R_1$ represents an alkylene group having 1 to 5 carbon atoms, A represents a hydrogen atom or any one of the following formulae (C) to (E).

In the formula (A), $R_1$ represents a linear or branched alkylene group having 1 to 5 carbon atoms, such as methylene, ethylene or propylene, preferably a linear or branched alkylene group having 2 to 3 carbon atoms, and more preferably an ethylene group. The A in the formula (A) represents a hydrogen atom or any one of the following formulae (C) to (E), but is preferably a group represented by the formula (C).

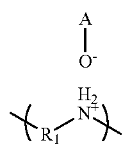

(B)

In the formula (B), $R_1$ and A have the same definitions as $R_1$ and A in the formula (A), respectively.

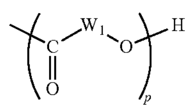

(C)

In the formula (C), $W_1$ represents a linear or branched alkylene group having 2 to 10 carbon atoms; preferably an alkylene group having 4 to 7 carbon atoms, such as butylene, pentylene or hexylene. In the formula (C), p represents an integer of 1 to 20, but is preferably an integer of 5 to 10.

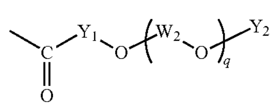

(D)

In the formula (D), $Y_1$ represents a divalent linking group, preferably an alkylene group having 1 to 4 carbon atoms such as ethylene or propylene, or an alkyleneoxy group having 1 to 4 carbon atoms, such as ethyleneoxy or propyleneoxy. $W_2$ represents a linear or branched alkylene group having 2 to 10 carbon atoms, such as ethylene, propylene or butylene; preferably an alkylene group having 2 to 3 carbon atoms, such as ethylene or propylene. $Y_2$ represents a hydrogen atom or —CO—$R_2$ ($R_2$ represents an alkyl group having 1 to 10 carbon atoms, such as ethyl, propyl, butyl, pentyl or hexyl, preferably an alkyl group having 2 to 5 carbon atoms, such as ethyl, propyl, butyl or pentyl). In the formula (D), q represents an integer of 1 to 20; preferably an integer of 5 to 10.

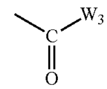

(E)

In the formula (E), $W_3$ represents an alkyl group having 1 to 50 carbon atoms or a hydroxyalkyl group having 1 to 50 carbon atoms and 1 to 5 hydroxy groups; preferably an alkyl group having 10 to 20 carbon atoms, such as stearyl, or a hydroxyalkyl group having 10 to 20 carbon atoms and 1 to 2 hydroxy groups, such as monohydroxystearyl.

The content of the repeating unit represented by the formula (A) or the formula (B) in the "graft copolymer containing a nitrogen atom" is preferably higher, and is typically 50 mol % or more, preferably 70 mol % or more. The graft copolymer containing a nitrogen atom may have both a repeating unit represented by the formula (A) and a repeating unit represented by the formula (B), in which the ratio of these repeating units is not particularly limited. In that case, the graft polymer preferably contains a greater proportion of the repeating unit represented by the formula (A) than the repeating unit represented by the formula (B). The total number of the repeating units represented by the formula (A) or the formula (B) is typically from 1 to 100, preferably from 10 to 70, and more preferably from 20 to 50. The graft copolymer may further contain a repeating unit other than those represented by the formula (A) or the formula (B). Examples of the other repeating units include an alkylene group and an alkyleneoxy group. The above-stated "graft copolymer containing a nitrogen atom" preferably has —$NH_2$ or —$R_1$—$NH_2$ ($R_1$ has the same definition as $R_1$ as previously mentioned) at its terminal end.

Further, the main chain of the "graft copolymer containing a nitrogen atom" may be either linear or branched. The amine value of the graft copolymer is typically in the range of from 5 mgKOH/g to 100 mgKOH/g, preferably from 10 mgKOH/g to 70 mgKOH/g, and more preferably from 15 mgKOH/g to 40 mgKOH/g.

If the amine value is 5 mgKOH/g or more, dispersion stability may be further improved and viscosity may be rendered more stable. If the amine value is 100 mgKOH/g or less, formation of residues may be further suppressed, and deterioration of electrical properties after the formation of a liquid crystal panel may be further suppressed.

The weight average molecular weight of the "graft copolymer containing a nitrogen atom" as measured by GPC is preferably in the range of from 3,000 to 100,000, particularly preferably from 5,000 to 50,000. If the weight average molecular weight is 3,000 or more, aggregation of colorants may be further suppressed, and an increase in viscosity or gelation may be further suppressed. If the weight average molecular weight is 100,000 or less, an increase in viscosity of the copolymer itself may be further suppressed, and insufficiency in solubility with respect to an organic solvent may be further alleviated.

The synthesis of the dispersant may be carried out by a known method, for example, a method described in Japanese Examined Patent Application No. 63-30057.

Further, the dispersant used in the present invention is preferably a high-molecular weight compound containing at least one repeating unit selected from the repeating units represented by the following formulae (1) or (II) (hereinafter, also referred to as "specific polymer"), from the viewpoint of further improving dispersion stability.

(I)

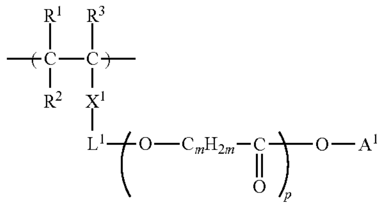

(II)

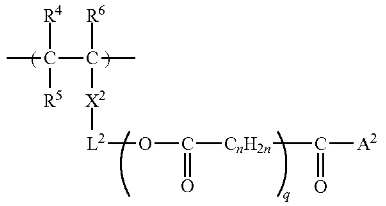

In the formulae (I) and (II), $R^1$ to $R^6$ each independently represents a hydrogen atom or a monovalent organic group, $X^1$ and $X^2$ each independently represents —CO—, —C(═O)O—, —CONH—, —OC(═O)— or a phenylene group, $L^1$ and $L^2$ each independently represents a single bond or a divalent organic linking group, $A^1$ and $A^2$ each independently represents a monovalent organic group, m and n each independently represents an integer of 2 to 8, and p and q each independently represents an integer of 1 to 100.

In the formulae (I) and (II), $R^1$ to $R^6$ each independently represents a hydrogen atom or a monovalent organic group. The monovalent organic group is preferably a substituted or unsubstituted alkyl group. The alkyl group is preferably an alkyl group having 1 to 12 carbon atoms, more preferably an alkyl group having 1 to 8 carbon atoms, and particularly preferably an alkyl group having 1 to 4 carbon atoms.

When the alkyl group has a substituent, examples of the substituent include a hydroxy group and an alkoxy group (preferably having 1 to 5 carbon atoms, more preferably having 1 to 3 carbon atoms), such as a methoxy group, an ethoxy group, and a cyclohexyloxy group.

Specific examples of the preferred alkyl group include a methyl group, an ethyl group, a propyl group, an n-butyl group, an i-butyl group, a t-butyl group, an n-hexyl group, a cyclohexyl group, a 2-hydroxyethyl group, a 3-hydroxypropyl group, a 2-hydroxypropyl group, and a 2-methoxyethyl group.

In the formulae (I) and (II), $R^1$, $R^2$, $R^4$ and $R^5$ preferably represent a hydrogen atom, and $R^3$ and $R^6$ most preferably represent a hydrogen atom or a methyl group, from the viewpoint of adsorption efficiency to a pigment surface.

In the formulae (I) and (II), $X^1$ and $X^2$ each independently represents —CO—, —C(═O)O—, —OC(═O)— or a phenylene group. From the viewpoint of adsorptivity with respect to a pigment, —C(═O)O—, —CONH— or a phenylene group is preferable, and —C(═O)O— is most preferable.

In the formulae (I) and (II), $L^1$ and $L^2$ each independently represents a single bond or a divalent organic linking group. The divalent organic linking group is preferably a substituted or unsubstituted alkylene group, or a divalent organic linking group including an alkylene group and a hetero atom or a partial structure containing a hetero atom. The alkylene group is preferably an alkylene group having 1 to 12 carbon atoms, more preferably an alkylene group having 1 to 8 carbon atoms, and particularly preferably an alkylene group having 1 to 4 carbon atoms. Examples of the hetero atom in a partial structure containing a hetero atom include an oxygen atom, a nitrogen atom, and a sulfur atom. Among these, an oxygen atom or a nitrogen atom is preferable.

Specific examples of the preferred alkylene group include a methylene group, an ethylene group, a propylene group, a trimethylene group, and a tetramethylene group.

When the alkylene group has a substituent, examples of the substituent include a hydroxy group.

The divalent organic linking group preferably has a hetero atom or a partial structure containing a hetero atom, selected from —C(═O)—, —OC(═O)— and —NHC(═O)—, at a terminal end of an alkylene group, and is connected to an adjacent oxygen atom via the hetero atom or the partial structure containing a hetero atom, from the viewpoint of adsorptivity with respect to a pigment. The term "adjacent oxygen atom" as mentioned above refers to an oxygen atom that is bonded to $L^1$ in the formula (I) or $L^2$ in the formula (II) at the side chain side.

In the formula (I) and (II), $A^1$ and $A^2$ each independently represents a monovalent organic group. The monovalent organic group is preferably a substituted or unsubstituted alkyl group, or a substituted or unsubstituted aryl group.

Examples of the preferred alkyl group include linear, branched and cyclic alkyl groups having from 1 to 20 carbon atoms. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbonyl group.

The substituents for the substituted alkyl group include groups formed from a monovalent non-metal atomic group except a hydrogen atom. Preferred examples thereof include a halogen atom (—F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acyloxy group, an acylthio group, an acylamino group, an N-alkylacylamino group, an N-arylacylamino group, an ureido group, an N'-alkyl ureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxy group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and a conjugated base group thereof (hereinafter, referred to as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—$PO_3H_2$) and a conjugated base group thereof (hereinafter, referred to as a phosphonato group), a dialkylphosphono group (—$PO_3$(alkyl)$_2$), a diarylphosphono group (—$PO_3$(aryl)$_2$), an alkylarylphosphono group (—$PO_3$(alkyl)(aryl)), a monoalkylphosphono group (—$PO_3H$(alkyl)) and a conjugated base group thereof (hereinafter, referred to as an alkylphosphonato group), a monoarylphosphono group (—$PO_3H$(aryl)) and a conjugated base group thereof (hereinafter, referred to as an arylphosphonato group), a phosphonoxy group (—$OPO_3H_2$) and a conjugated base group thereof (hereinafter, referred to as a phosphonatoxy group), a dialkylphosphonoxy group (—$OPO_3$(alkyl)$_2$), a diarylphosphonoxy group (—$OPO_3$(aryl)$_2$), an alkylarylphosphonoxy group (—$OPO_3$(alkyl)(aryl)), a monoalkylphosphonoxy group (—$OPO_3H$(alkyl)) and a conjugated base group thereof (hereinafter, referred to as an alkylphosphonatoxy group), a monoarylphosphonoxy group (—$OPO_3H$(aryl)) and a conjugated base group thereof (hereinafter, referred to as an arylphosphonatoxy group), a cyano group, a nitro group, an aryl group, a heteroaryl group, an alkenyl group, an alkynyl group, and a silyl group.

Specific examples of the alkyl group in the substituents as mentioned above include the above-stated alkyl groups which may further have a substituent.

The substituent is preferably an alkoxy group, an aryloxy group, an alkylthio group, an arylthio group, an N,N-dialkylamino group, an N,N-diarylamino group, an N-alkyl-N-arylamino group, an acyloxy group, an aryl group, a heteroaryl group, an alkenyl group, an alkynyl group or a silyl group, from the viewpoint of dispersion stability.

Specific examples of the aryl group include a phenyl group, a biphenyl group, a naphthyl group, a tolyl group, a xylyl group, a mesytyl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a phenyl group, a cyanophenyl group, a sulfophenyl group, a sulfonatophenyl group, a phosphonophenyl group, a phosphonatophenyl group, and the like.

From the viewpoint of dispersion stability and developability, $A^1$ and $A^2$ are preferably a linear alkyl group having from 1 to 20 carbon atoms, a branched alkyl group having from 3 to 20 carbon atoms, or a cyclic alkyl group having from 5 to 20 carbon atoms, more preferably a linear alkyl group having from 4 to 15 carbon atoms, a branched alkyl group having from 4 to 15 carbon atoms, or a cyclic alkyl group having from 6 to 10 carbon atoms, and still more preferably a linear alkyl group having from 6 to 10 carbon atoms, or a branched alkyl group having from 6 to 12 carbon atoms.

In the formulae (I) and (II), m and n each independently represents an integer of 2 to 8. From the viewpoint of dispersion stability and developability, an integer of 4 to 6 is preferable, and 5 is most preferable.

In the formulae (I) and (II), p and q each independently represents an integer of 1 to 100. Two or more kinds of repeating units having different values of p, or two or more kinds of repeating units having different values of q, may be mixed. From the viewpoint of dispersion stability and developability, p and q are preferably in the range of 5 to 60, more preferably 5 to 40, and still more preferably 5 to 20.

From the viewpoint of dispersion stability, the specific polymer preferably contains a repeating unit represented by the formula (1).

Further, the repeating unit represented by the formula (1) is more preferably a repeating unit represented by the following formula (1)-2.

(I)-2

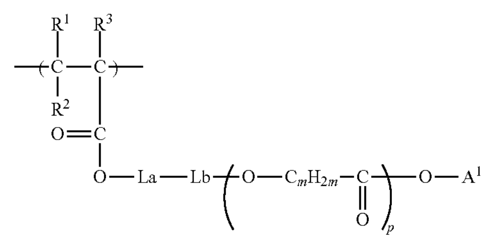

In the formula (I)-2, $R^1$ to $R^3$ each independently represents a hydrogen atom or a monovalent organic group, La represents an alkylene group having 2 to 10 carbon atoms, Lb represents —C(=O)— or —NHC(=O)—, $A^1$ represents a monovalent organic group, m represents an integer of 2 to 8, and p represents an integer of 1 to 100.

The repeating unit represented by the formula (I), (II) or (I)-2 is introduced, as a repeating unit of a high-molecular weight compound, by way of polymerization or copolymerization of a monomer represented by the following formula (i), (ii) or (i)-2, respectively.

(i)

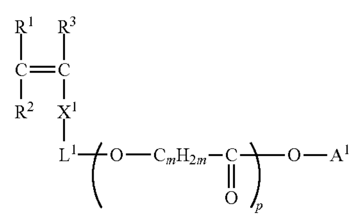

(ii)

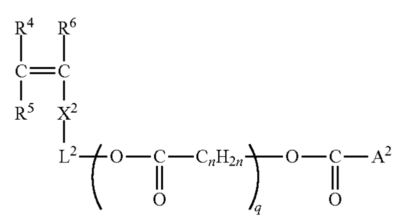

-continued (i)-2

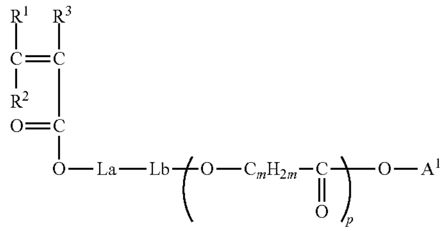

In the formulae (i), (ii) and (i)-2, $R^1$ to $R^6$ each independently represents a hydrogen atom or a monovalent organic group, $X^1$ and $X^2$ each independently represents —CO—, —C(═O)O—, —CONH—, —OC(═O)— or a phenylene group, $L^1$ and $L^2$ each independently represents a single bond or a divalent organic linking group, La represents an alkylene group having 2 to 10 carbon atoms, Lb represents —C(═O)— or —NHC(═O)—, $A^1$ and $A^2$ each independently represents a monovalent organic group, m and n each independently represents an integer of 2 to 8, and p and q each independently represents an integer of 1 to 100.

The following are specific examples of the monomers represented by the formulae (i), (ii) and (i)-2 (monomers (XA-1) to (XA-23)). However, the present invention is not limited to these examples.

(XA-1)

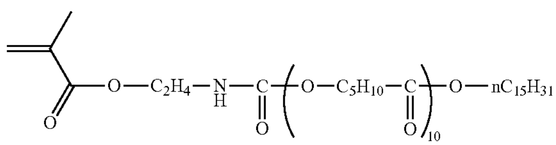

(XA-2)

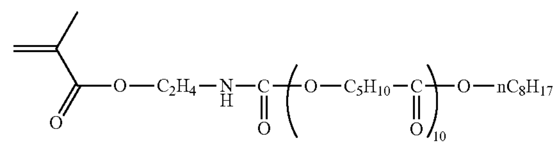

(XA-3)

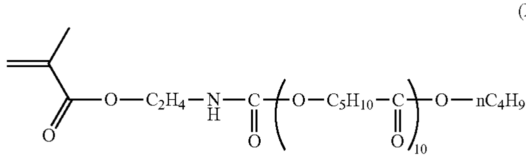

(XA-4)

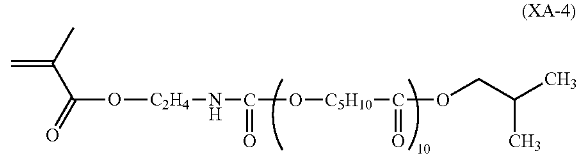

(XA-5)

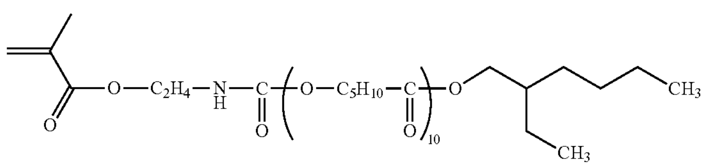

(XA-6)

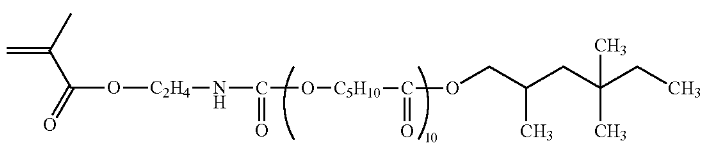

(XA-7)

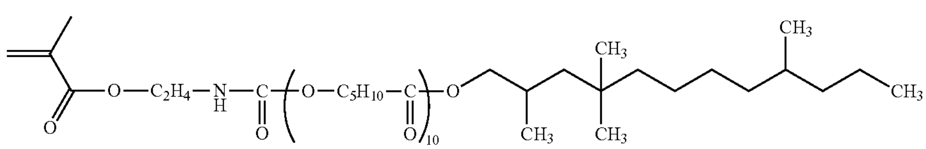

(XA-8)

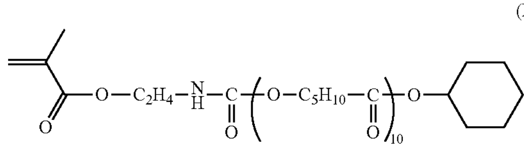

(XA-9)

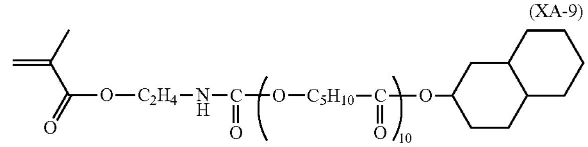

(XA-10)

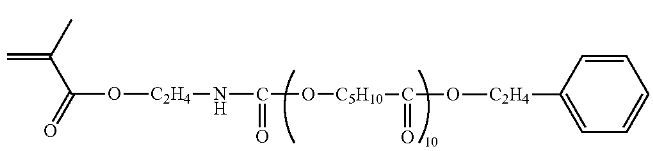

(XA-11)

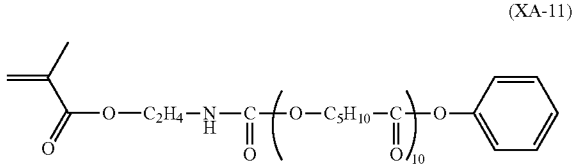

(XA-12)

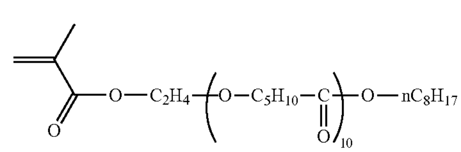

-continued (XA-13)

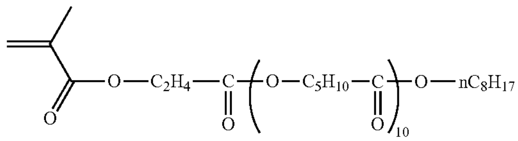

(XA-14)

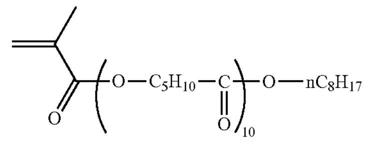

(XA-15)

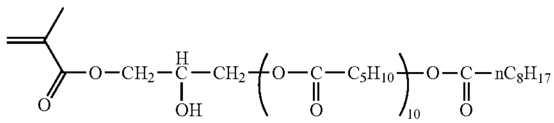

(XA-16)

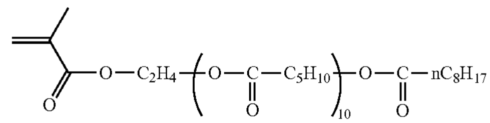

(XA-17)

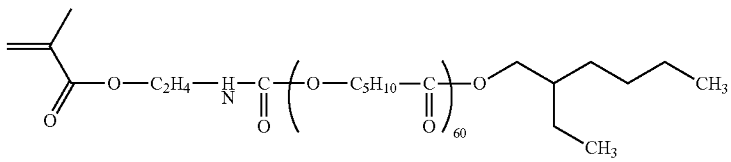

(XA-18)

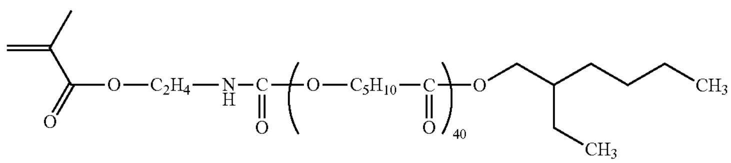

(XA-19)

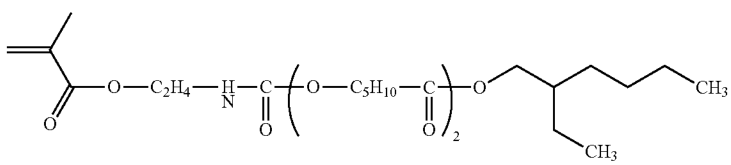

(XA-20)

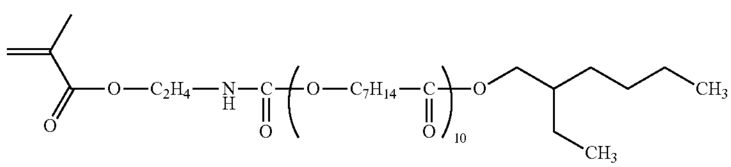

(XA-21)

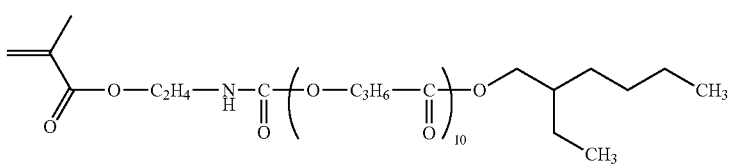

(XA-22)

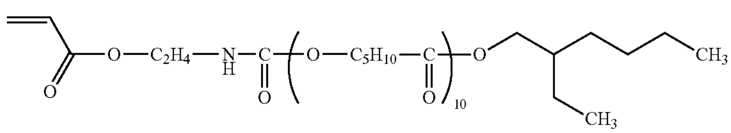

(XA-23)

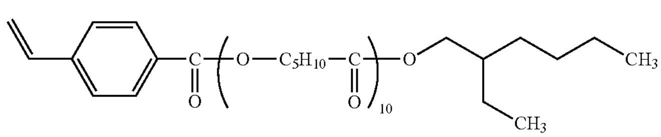

The specific polymer may contain at least one repeating unit selected from the repeating units represented by the formula (1) or (II). The polymer may contain only one type or two or more types of repeating units.

In the specific polymer, the content of the repeating unit represented by the formula (I) or (II) is not particularly limited. However, when the total repeating units contained in the polymer is given as 100% by mass, the content of the repeating unit represented by the formulae (I) or (II) is preferably 5% by mass or more, more preferably 50% by mass or more, and still more preferably from 50% by mass to 80% by mass.

For the purpose of enhancing adsorptivity with respect to a pigment, the specific polymer is preferably a high-molecular weight compound obtained by copolymerizing a monomer having a functional group capable of adsorbing to a pigment and a monomer represented by the formula (i), (ii) or (i)-2.

Specific examples of the monomer having a functional group capable of adsorbing to a pigment include a monomer having an acidic group, a monomer having an organic colorant structure or a heterocyclic ring structure, a monomer having a basic nitrogen atom, and a monomer having an ionic group. From the viewpoint of adsorptivity with respect to a pigment, a monomer having an acidic group and a monomer having an organic colorant structure or a heterocyclic ring structure are preferable.

Examples of the monomer having an acidic group include a vinyl monomer having a carboxy group and a vinyl monomer having a sulfonic acid group.

Examples of the vinyl monomer having a carboxy group include (meth)acrylic acid, vinyl benzoic acid, maleic acid, maleic acid monoalkyl ester, fumaric acid, itaconic acid, crotonic acid, cinnamic acid, an acrylic acid dimer, and the like. It is also possible to use a compound obtained by addition reaction between a monomer having a hydroxy group such as 2-hydroxyethyl(meth)acrylate and a cyclic anhydride such as maleic anhydride, phthalic anhydride, succinic anhydride or cyclohexanedicarboxylic anhydride, and ω-carboxypolycaprolactone mono(meth)acrylate. Further, as a precursor of the carboxy group, an anhydride-containing monomer such as maleic anhydride, itaconic anhydride or citraconic anhydride may be used. From the viewpoint of removing unexposed portions during development, a compound obtained by addition reaction between a monomer having a hydroxyl group such as 2-hydroxyethyl(meth)acrylate and a cyclic anhydride such as maleic anhydride, phthalic anhydride, succinic anhydride or cyclohexanedicarboxylic anhydride is preferred.

Further, examples of the vinyl monomer having a sulfonic acid group include 2-acrylamide-2-methylpropane sulfonic acid, and the like, and examples of the vinyl monomer having a phosphoric acid group include mono(2-acryloyloxy ethylester) phosphate, mono(1-methyl-2-acryloyloxy ethylester) phosphate, and the like.

The specific polymer preferably contains a repeating unit derived from a monomer having an acidic group as described above. By including a repeating unit of this kind, favorable removality of unexposed portions during development may be achieved when the pigment dispersion composition of the present invention is used for a colored curable composition.

The specific polymer may contain only one kind of repeating unit derived from a monomer having an acidic group, or may contain two or more kinds thereof.

In the specific polymer, the content of the repeating unit derived from an acidic group-containing monomer is preferably 50 mgKOH/g or more; particularly preferably in the range of from 50 mgKOH/g to 200 mgKOH/g. Specifically, in terms of suppressing the formation of precipitates in a developer, the content of the repeating unit derived from an acidic group-containing monomer is preferably 50 mgKOH/g or more. In order to effectively suppress the formation of a secondary aggregate, which are an aggregate formed from primary particles of a pigment, or in order to effectively weaken the cohesive force of the secondary aggregate, the content of the repeating unit derived from an acidic group-containing monomer is preferably in the range of from 50 mgKOH/g to 200 mgKOH/g.

Examples of the monomer having an organic colorant structure or a heterocyclic ring structure include those selected from the group consisting of a specific monomer, maleimide, and a maleimide derivative described in paragraph numbers [0048] to [0070] of JP-A No. 2009-256572.

Examples of the monomer having a basic nitrogen atom include the following (meth)acrylates, (meth)acrylamides and styrenes.

Examples of the (meth)acrylates include N,N-dimethylaminoethyl(meth)acrylate, N,N-dimethylaminopropyl (meth)acrylate, 1-(N,N-dimethylamino)-1,1-dimethylmethyl(meth)acrylate, N,N-dimethylaminohexyl(meth) acrylate, N,N-diethylaminoethyl(meth)acrylate, N,N-diisopropylaminoethyl(meth)acrylate, N,N-di-n-butylaminoethyl(meth)acrylate, N,N-di-1-butylaminoethyl (meth)acrylate, morpholinoethyl(meth)acrylate, piperidinoethyl(meth)acrylate, 1-pyrrolidinoethyl(meth) acrylate, N,N-methyl-2-pyrrolidylaminoethyl(meth)acrylate, and N,N-methylphenylaminoethyl(meth)acrylate.

Examples of the (meth)acrylamides include N—(N',N'-dimethylaminoethyl)acrylamide, N—(N',N'-dimethylaminoethyl)methacrylamide, N—(N',N'-diethylaminoethyl) acrylamide, N—(N',N'-diethylaminoethyl)methacrylamide, N—(N',N'-dimethylaminopropyl)acrylamide, N—(N',N'-dimethylaminopropyl)methacrylamide, N—(N',N'-diethylaminopropyl)acrylamide, N—(N',N'-diethylaminopropyl) methacrylamide, 2-(N,N-dimethylamino)ethyl(meth) acrylamide, 2-(N,N-diethylamino)ethyl(meth)acrylamide, 3-(N,N-diethylamino)propyl(meth)acrylamide, 3-(N,N-dimethylamino)propyl(meth)acrylamide, 1-(N,N-dimethylamino)-1,1-dimethylmethyl(meth)acrylamide and 6-(N,N-diethylamino)hexyl(meth)acrylamide, morpholino(meth) acrylamide, piperidino(meth)acrylamide, and N-methyl-2-pyrrolidyl(meth)acrylamide.

Examples of the styrenes include N,N-dimethylaminostyrene and N,N-dimethylaminomethylstyrene.

It is also possible to use a monomer having any one of a urea group, a urethane group, a hydrocarbon group having a coordinating oxygen atom and 4 or more carbon atoms, an alkoxysilyl group, an epoxy group, an isocyanate group, and a hydroxy group. Specific examples of these monomers include those having the following structures.

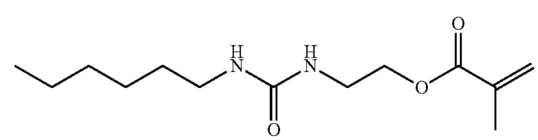

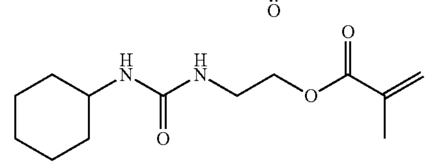

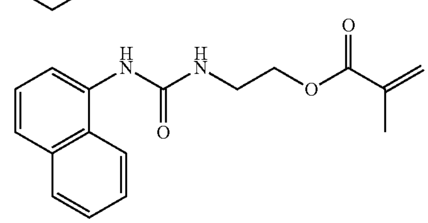

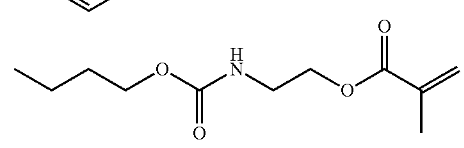

-continued

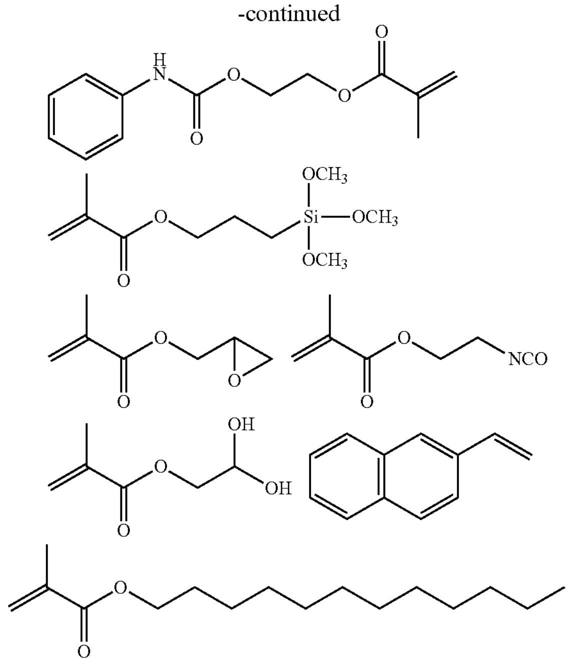

Examples of the monomer having an ionic group include vinyl monomers having an ionic group (anionic vinyl monomers and cationic vinyl monomers). Examples of the anionic vinyl monomer include an alkali metal salt of a vinyl monomer having an acidic group as previously mentioned, and a salt formed with an organic amine (for example, a tertiary amine such as triethylamine or dimethylaminoethanol). Examples of the cationic vinyl monomer include a quaternization product of the nitrogen-containing vinyl monomer with a halogenated alkyl(alkyl group: C1 to C18, halogen atom: chlorine atom, bromine atom or iodine atom); a benzil halide such as benzil chloride or benzil bromide; an alkylsulfonic acid ester such as methane sulfonic acid (alkyl group: C1 to C18); an arylsulfonic acid alkyl ester such as benzene sulfonic acid or toluene sulfonic acid (alkyl group: C1 to C18); a dialkyl sulfate (alkyl group: C1 to C4); and a dialkyldiaryl ammonium salt.

The monomers having a functional group capable of adsorbing to a pigment may be appropriately selected depending on the kind of the pigment to be dispersed. These monomers may be used alone or as a combination of two or more kinds thereof.

The specific polymer may further contain a repeating unit derived from a copolymerizable vinyl monomer, as long as the effect of the polymer is not impaired.

Although there is no particular limitation to the vinyl monomer that can be used in the invention, preferred examples thereof include (meth)acrylic acid esters, crotonic acid esters, vinyl esters, maleic acid diesters, fumaric acid diesters, itaconic acid diesters, (meth)acrylamides, vinyl ethers, vinyl alcohol esters, styrenes, (meth)acrylonitriles, and the like. Specific examples of the vinyl monomer include the following compounds. In the specification, the term "(meth)acrylic" refers to either or both of "acrylic" and "methacylic".

Examples of the (meth)acrylic acid esters include methyl (meth)acrylate, ethyl(meth)acrylate, n-propyl(meth)acrylate, isopropyl(meth)acrylate, n-butyl(meth)acrylate, isobutyl (meth)acrylate, t-butyl(meth)acrylate, n-hexyl(meth)acrylate, cyclohexyl(meth)acrylate, t-butyl cyclohexyl(meth) acrylate, 2-ethylhexyl(meth)acrylate, t-octyl(meth)acrylate, dodecyl(meth)acrylate, octadecyl(meth)acrylate, acetoxyethyl(meth)acrylate, acetoacetoxyethyl(meth)acrylate, phenyl(meth)acrylate, 2-hydroxyethyl(meth)acrylate, 2-methoxyethyl(meth)acrylate, 2-ethoxyethyl(meth)acrylate, 2-(2-methoxyethoxy)ethyl(meth)acrylate, 3-phenoxy-2-hydroxypropyl(meth)acrylate, benzyl(meth)acrylate, diethylene glycol monomethyl ether(meth)acrylate, diethylene glycol monoethyl ether(meth)acrylate, triethylene glycol monomethyl ether(meth)acrylate, triethylene glycol monoethyl ether(meth)acrylate, polyethylene glycol monomethyl ether(meth)acrylate, polyethylene glycol monoethyl ether (meth)acrylate, β-phenoxyethoxyethyl(meth)acrylate, nonyl phenoxy polyethylene glycol(meth)acrylate, dicyclopentenyl (meth)acrylate, dicyclopentenyloxyethyl(meth)acrylate, trifluoroethyl(meth)acrylate, octafluoropentyl(meth)acrylate, perfluorooctylethyl(meth)acrylate, dicyclopentanyl(meth) acrylate, tribromophenyl(meth)acrylate, tribromophenyloxyethyl(meth)acrylate, and 2-(acetoacetyloxy)ethyl ester (meth)acrylate.

Examples of the crotonic acid esters include butyl crotonate, hexyl crotonate, and the like.

Examples of the vinyl esters include vinyl acetate, vinyl propionate, vinyl butyrate, vinyl methoxy acetate, vinyl benzoate, and the like.

Examples of the maleic acid diesters include dimethyl maleate, diethyl maleate, dibutyl maleate, and the like.

Examples of the fumaric acid diesters include dimethyl fumarate, diethyl fumarate, dibutyl fumarate, and the like.

Examples of the itaconic acid diesters include dimethyl itaconate, diethyl itaconate, dibutyl itaconate, and the like.

Examples of the (meth)acrylamides include (meth)acrylamide, N-methyl(meth)acrylamide, N-ethyl(meth)acrylamide, N-propyl(meth)acrylamide, N-isopropyl(meth)acrylamide, N-n-butyl(meth)acrylamide, N-t-butyl(meth) acrylamide, N-cyclohexyl(meth)acrylamide, N-(2-methoxyethyl) (meth)acrylamide, N,N-dimethyl(meth) acrylamide, N,N-diethyl(meth)acrylamide, N-phenyl(meth) acrylamide, N-benzyl(meth)acrylamide, (meth)acryloyl morpholine, diacetone acrylamide, and the like.

Examples of the vinyl ethers include methyl vinyl ether, butyl vinyl ether, hexyl vinyl ether, methoxyethyl vinyl ether, and the like.

Examples of the styrenes include styrene, methylstyrene, dimethylstyrene, trimethylstyrene, ethylstyrene, isopropylstyrene, butylstyrene, hydroxystyrene, methoxystyrene, butoxystyrene, acetoxystyrene, chlorostyrene, dichlorostyrene, bromostyrene, chloromethylstyrene, hydroxystyrene protected by a group deprotectable with an acidic substance (for example, t-Boc or the like), methyl vinyl benzoate, α-methylstyrene, and the like.

One preferred embodiment of the specific polymer is a copolymer formed from at least a monomer represented by the formula (i), (ii) or (i)-2 and a monomer having an acidic group or a monomer having an organic colorant structure or a heterocyclic ring structure, which copolymer is more preferably formed from at least a monomer represented by the formula (i)-2 and a monomer having an acidic group.

The use of a copolymer having the above structure makes it possible to provide a pigment dispersion composition that exhibits even more favorable adsorptivity with respect to a pigment and developability.

The molecular weight of the specific polymer is preferably in the range of from 5,000 to 100,000 in terms of weight average molecular weight (Mw) and in the range of from 2,500 to 50,000 in terms of number average molecular weight (Mn), and more preferably in the range of from 10,000 to 50,000 in terms of weight average molecular weight (Mw) and in the range of from 5,000 to 30,000 in terms of number average molecular weight (Mn).

The molecular weight of the specific polymer is particularly preferably in the range of from 10,000 to 30,000 in terms of weight average molecular weight (Mw) and in the range of from 5,000 to 15,000 in terms of number average molecular weight (Mn).

Specifically, in order to effectively decompose a secondary aggregate, which is an aggregate of primary particles of a pigment, or in order to effectively suppress re-aggregation thereof, the weight average molecular weight (Mw) of the specific polymer is preferably 1,000 or more. Further, from the viewpoint of developability when preparing a color filter using a colored curable composition containing a pigment dispersion composition, the weight average molecular weight (Mw) of the specific polymer is preferably 30,000 or less.

The specific polymer can be prepared from, for example, a monomer represented by the formula (i), (ii) or (i)-2 and a radical polymerizable compound (such as the monomers described above) other than the monomer represented by the formula (i), (ii) or (i)-2 as a copolymerization component, by a conventional radical polymerization method.

The specific polymer is typically produced by a suspension polymerization method, a solution polymerization method, or the like. Examples of the solvent used in the synthesis of the specific polymer include ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethylacetamide, dimethylsulfoxide, toluene, ethyl acetate, methyl lactate, and ethyl lactate. These solvents may be used alone or as a combination of two or more kinds thereof.

Further, when performing radical polymerization, a radical polymerization initiator may be used. Further, a chain transfer agent (for example, 2-mercaptoethanol and dodecyl mercaptan) may also be used.

The content of the dispersant (for example, the specific polymer as mentioned above) in the pigment dispersion composition of the present invention preferably satisfies the mass ratio of pigment (the total pigment at least including the azo pigment represented by the formula (1)): dispersant=1:0.1 to 1:2, more preferably 1:0.2 to 1:1, and even more preferably 1:0.4 to 1:0.7.

Further, a high-molecular weight compound other than the specific polymer may be additionally used as necessary, as long as the effect of the invention is not impaired.

Examples of the high-molecular weight compound other than the specific polymer include a natural resin, a modified natural resin, a synthetic resin, a synthetic resin modified with a natural resin, and the like.

Typical natural resins include rosin, and examples of the modified natural resin include a rosin derivative, a cellulose derivative, a rubber derivative, a protein derivative and oligomers thereof. Examples of the synthetic resin include an epoxy resin, an acrylic resin, a maleic acid resin, a butyral resin, a polyester resin, a melamine resin, a phenol resin, and a polyurethane resin. Examples of the synthetic resin modified with a natural resin include a rosin-modified maleic acid resin, and a rosin-modified phenol resin.

Examples of the synthetic resin include polyamide amine and a salt thereof, polycarboxylic acid and a salt thereof, high-molecular weight unsaturated acid ester, polyurethane, polyester, poly(meth)acrylate, (meth)acrylic copolymers, and naphthalenesulfonic acid-formalin condensate.

<Azo Pigment Derivative>

The pigment dispersion composition of the present invention contains an azo pigment derivative.

The azo pigment derivative may be used alone or as a combination of two or more kinds thereof.

In the present invention, an azo pigment derivative in which a portion having compatibility with a dispersant or a polar group is introduced is adsorbed to a surface of a pigment to be treated, and this is used as an adsorption point with respect to the dispersant. As a result, the pigment can be dispersed as fine particles in the pigment dispersion composition, and re-aggregation thereof can be prevented. In other words, the azo pigment derivative has an effect of promoting adsorption of a polymer dispersant, such as the specific polymer, by modifying the surface of the pigment.

The azo pigment derivative refers to a compound having an azo pigment as a mother skeleton, and having a structure in which a substituent such as an acidic group, a basic group, or an aromatic group is introduced to its side chain.

Examples of the azo pigment derivative that can be used in the present invention include those described in JP-A No. 11-49974, JP-A No. 11-189732, JP-A No. 10-245501, JP-A No. 2006-265528, JP-A No. 8-295810, JP-A No. 11-199796, JP-A No. 2005-234478, JP-A No. 2003-240938, JP-A No. 2001-356210, and JP-A No. 2000-239554.

From the viewpoint of further improving dispersion stability, the azo pigment derivative used in the present invention is particularly preferably a compound represented by the following formula (P1), among the above-stated azo pigment derivatives.

$$A\text{-}N{=}N\text{—}X\text{—}Y \qquad (P1)$$

In the formula (P1), A represents a component that forms an azo pigment together with X—Y. The component A may be any compound as long as it can form an azo pigment via coupling with a diazonium compound. The following are specific examples of A, but the present invention is not limited to these examples.

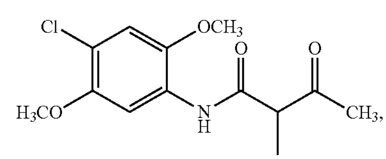

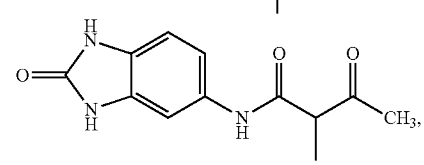

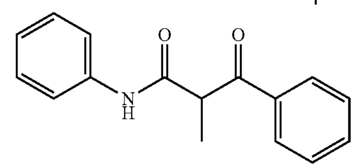

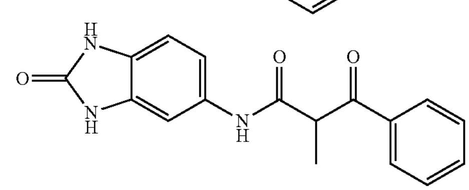

-continued

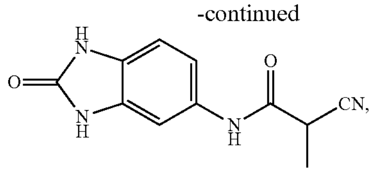

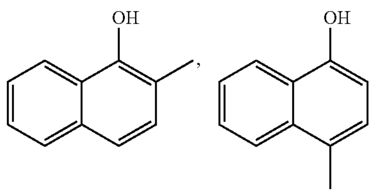

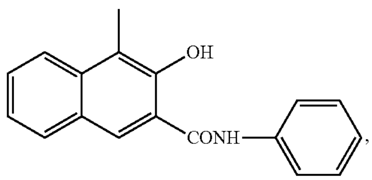

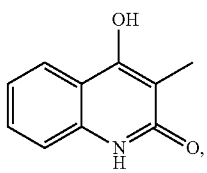

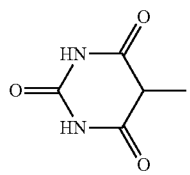

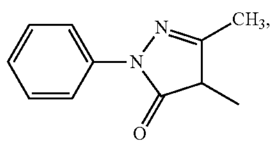

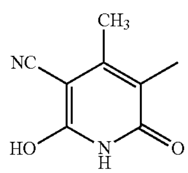

In the formula (P1), X represents a single bond (i.e., Y is directly bonded to —N═N—) or a group selected from the following divalent linking groups.

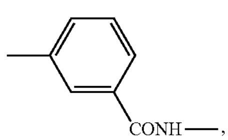

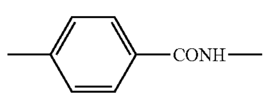

-continued

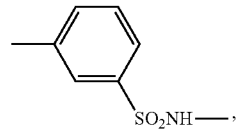

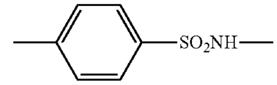

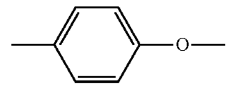

In the formula (P1), Y represents a group represented by the following formula (P2).

(P2)

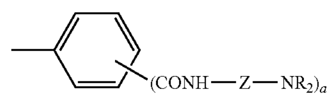

In the formula (P2), Z represents a lower alkylene group represented by —$(CH_2)_b$—, in which b represents an integer of 1 to 5, preferably 2 or 3. In the formula (P2), —$NR_2$ represents a lower alkylamino group or a 5- or 6-membered saturated hetero ring containing a nitrogen atom. When —$NR_2$ is a lower alkylamino group, it is represented by —$N(C_nH_{2n+1})_2$, in which n is an integer of 1 to 4, preferably 1 or 2. When —$NR_2$ is a 5- or 6-membered saturated hetero ring containing a nitrogen atom, it is preferably a hetero ring represented by the following structures.

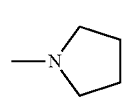

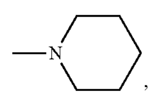

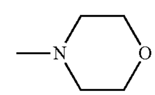

In the formula (P2), Z and —$NR_2$ each independently may have a lower alkyl group or an alkoxy group as a substituent. In the formula (P2), a represents 1 or 2, preferably 2.

The following are specific examples of the compound represented by the formula (P1) (Specific Examples 1 to 22). However, the present invention is not limited to these examples.

1.

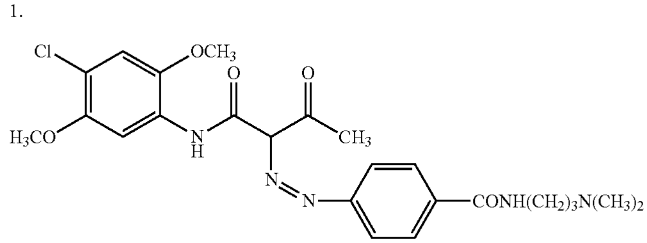

-continued
2.
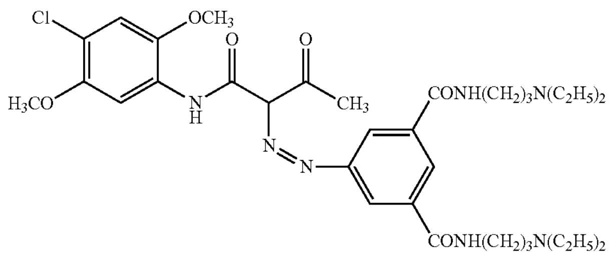
3.
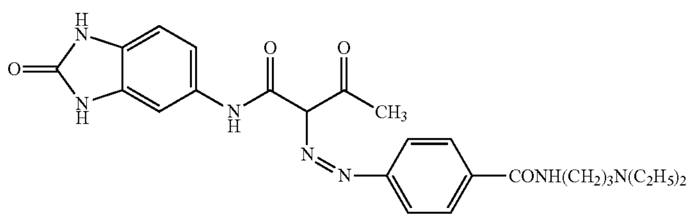
4.
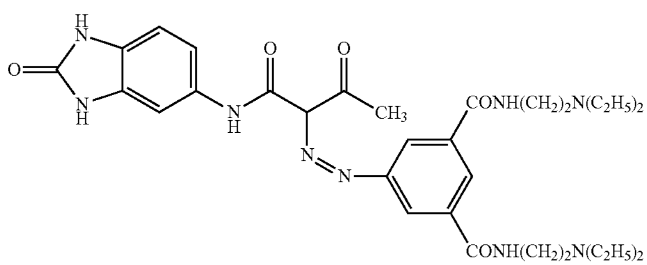
5.
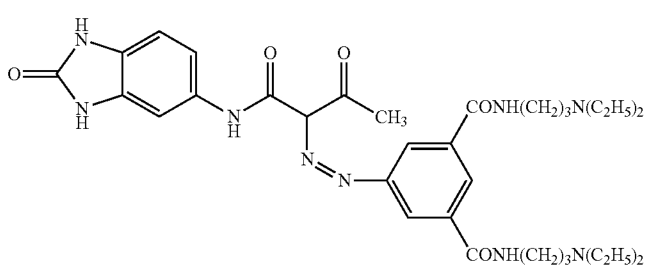
6.
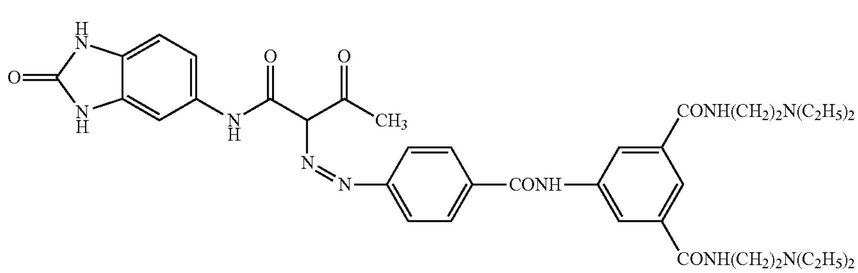

-continued
7.
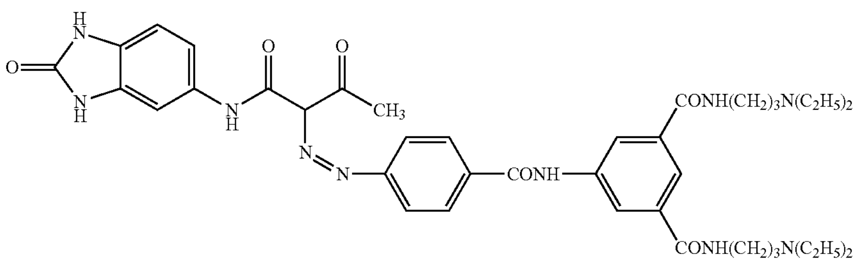
8.
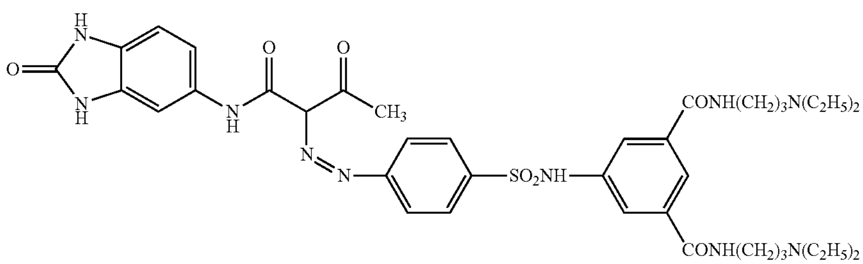
9.
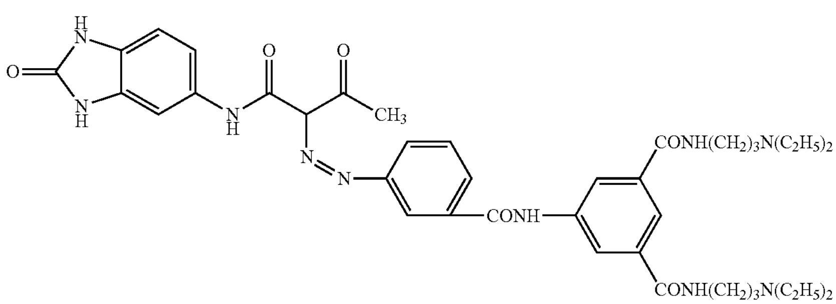
10.
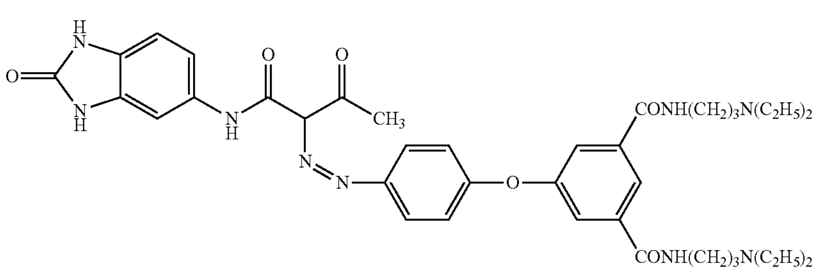
11.
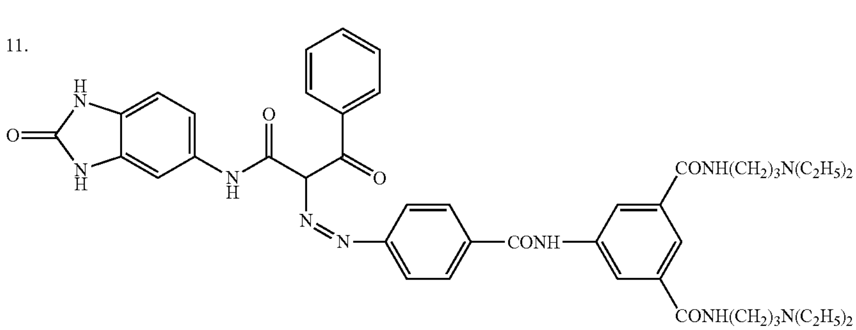

-continued
12.
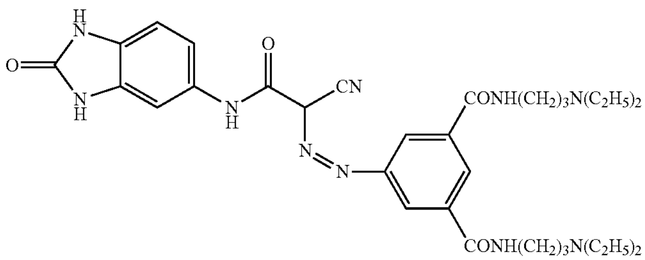
13.
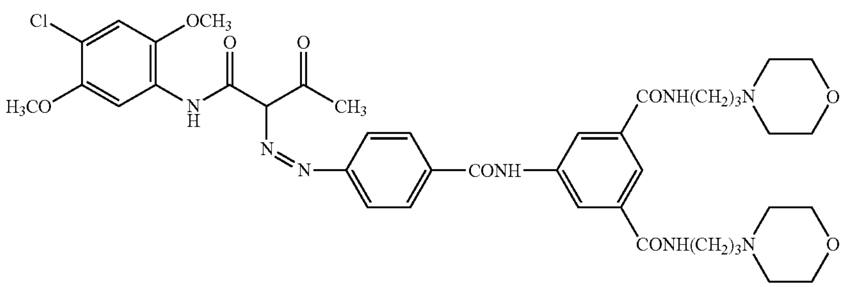
14.
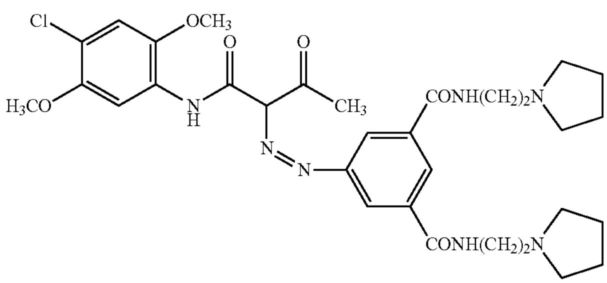
15.
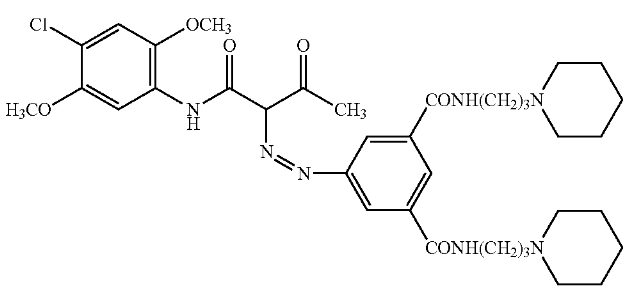
16.
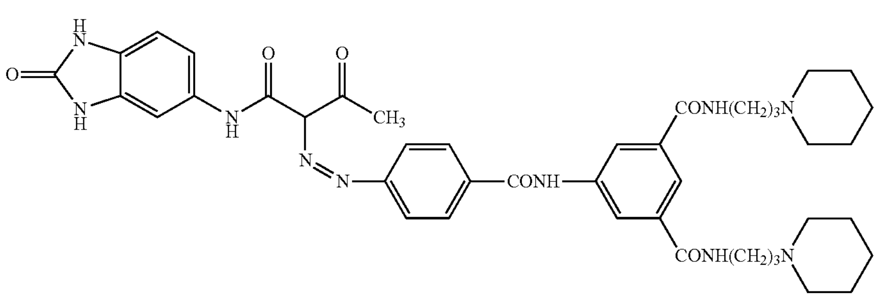

-continued
17.
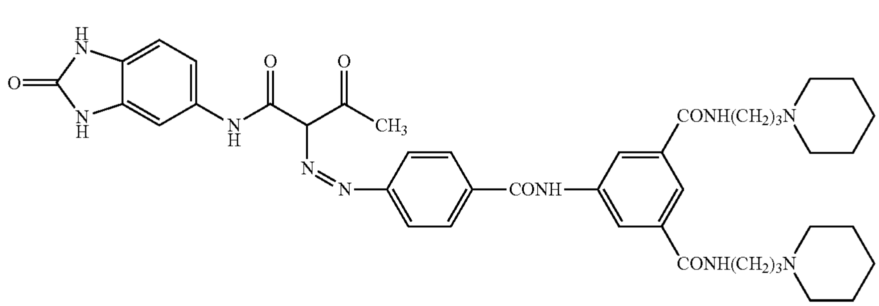
18.
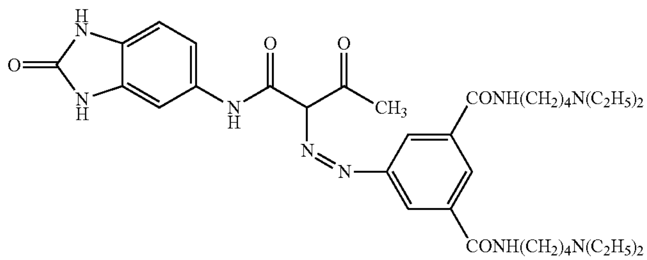
19.
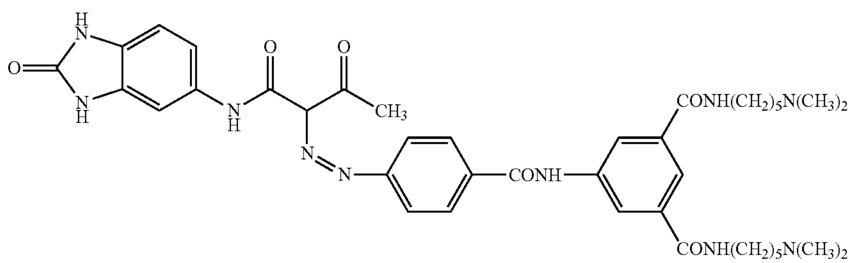
20.
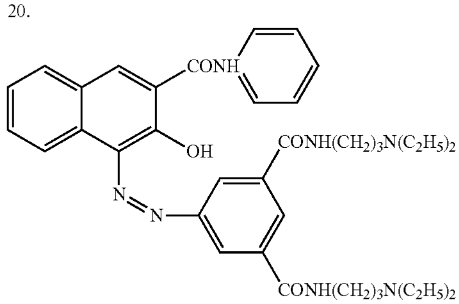
21.
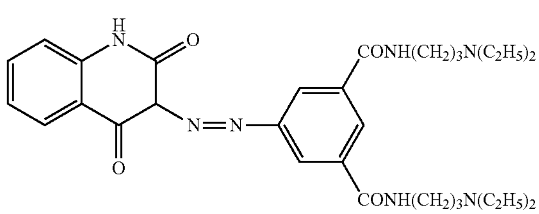
22.
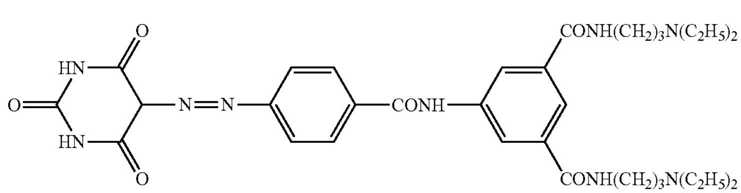

The content of the azo pigment derivative in the pigment dispersion composition of the present invention is preferably in the range of from 0.1% by mass to 80% by mass, more preferably from 1% by mass to 65% by mass, particularly preferably from 3% by mass to 50% by mass, with respect to the total mass of the pigment at least including the azo pigment represented by the formula (1). When the content of the azo pigment derivative is within the above range, the pigment can be favorably dispersed and the dispersion stability can be improved, while maintaining the viscosity at a low level.

By using a pigment dispersion composition as described above for forming a color filter, heat fastness of the color filter can be improved. Further, a color filter that exhibits high transmissivity, favorable color properties and high contrast can be obtained.

<Solvent and Other Components>

The pigment dispersion composition of the present invention can be prepared in a favorable manner by using a solvent.

Examples of the solvent include fatty acid esters, ketones, aromatics, alcohols, glycols, glycerin, alkylene glycol monoalkyl ethers, alkylene glycol dialkyl ethers, ethers, alkanol amines, nitrogen-containing polar organic solvents, and water.

Examples of the fatty acid esters include ethyl acetate, butyl acetate, ethylene glycol monomethyl ether acetate and propylene glycol monomethyl ether acetate.

Examples of the ketones include acetone, methyl ethyl ketone, methyl isobutyl ketone, cyclohexanone and diacetone alcohol.

Examples of the aromatics include benzene, toluene and xylene.

Examples of the alcohols include methanol, ethanol, n-propanol, isopropanol and n-butanol.

Examples of the glycols include ethylene glycol, diethylene glycol, triethylene glycol, tetraethylene glycol, polyethylene glycol, propylene glycol, dipropylene glycol, tripropylene glycol, polypropylene glycol, trimethylene glycol and hexanetriol.

Examples of the alkylene glycol monoalkylethers include ethylene glycol monomethyl ether, ethylene glycol monoethyl ether, diethylene glycol monomethyl ether, diethylene glycol monoethyl ether, propylene glycol monomethyl ether and propylene glycol monoethylether.

Examples of the alkylene glycol dialkyl ethers include triethylene glycol dimethyl ether, triethylene glycol diethyl ether, tetraethylene glycol dimethyl ether and tetraethylene glycol diethyl ether.

Examples of the ethers include tetrahydrofuran, dioxane and diethylene glycol diethylether.

Examples of the alkanol amines include monoethanolamine, diethanolamine and triethanolamine.

Examples of the nitrogen-containing polar organic solvents include N,N-dimethylformamide, N,N-dimethylacetamide, N-methyl-2-pyrrolidone, 2-pyrrolidone, and 1,3-dimethyl-2-imidazolidinone.

Among these solvents, a water-soluble solvent may be mixed with water and used as an aqueous medium. It is also possible to mix two or more kinds of the above solvents except water and use the same as an oil-based medium.

The pigment dispersion composition of the present invention may contain other components as necessary.

The volume-average particle diameter of the pigment (pigment at least including the azo pigment represented by the formula (1)) in the pigment dispersion composition of the present invention is preferably from 1 nm to 250 nm. In the present specification, the term "volume-average particle diameter of pigment particles" refers to the particle diameter of the pigment itself or, if an additive such as a dispersant is attached to the pigment, refers to the diameter of the particle including the additive attached thereto.

In the present invention, a particle size distribution analyzer (trade name: Nanotrac UPA-EX150; manufactured by Nikkiso Co., Ltd.) is used as an apparatus for measuring the volume-average particle diameter of the pigment. The measurement is conducted by placing 3 mL of a pigment dispersion composition in a measuring cell, in accordance with a predetermined measuring method. The viscosity and the density used as the parameters to be input during measurement are the ink viscosity and the pigment density, respectively.

The volume-average particle diameter is more preferably from 1 nm to 200 nm, and further preferably from 1 nm to 150 nm. If the volume-average particle diameter of the particles in the pigment dispersion composition is 250 nm or less, an even higher optical density can be achieved.

From the viewpoint of further improving the dispersion stability, the volume-average particle diameter is particularly preferably from 2 nm to 100 nm, and most preferably from 2 nm to 50 nm.

The total concentration of the pigment contained in the pigment dispersion composition of the present invention is preferably in the range of from 1% by mass to 35% by mass, more preferably from 2% by mass to 25% by mass. When the total concentration of the pigment is within the above-specified range, it is preferable since physical properties of the dispersion, such as surface tension or viscosity, can be easily controlled.

<Preparation of Pigment Dispersion Composition>

The pigment dispersion composition of the present invention can be prepared by performing a mixing and dispersion process in which the composition is mixed and dispersed by using various mixing and dispersing apparatuses.

Although the mixing and dispersion process preferably includes a kneading and dispersion process and a subsequent fine dispersion process, it is possible to omit the kneading dispersion process.

Specifically, the pigment dispersion composition of the present invention is preferably obtained by, for example, dispersing an azo pigment represented by the formula (1), a dispersant, an azo pigment derivative and a solvent, using a dispersing apparatus.

Examples of the dispersing apparatus that can be used include a simple stirrer, an impeller-type stirrer, an in-line-type stirrer, a mill (for example, colloid mill, ball mill, sand mill, beads mill, attritor, roll mill, jet mill, paint shaker, or agitator mill), a ultrasonic wave disperser, a high-pressure emulsion disperser (high-pressure homogenizer; commercially available apparatuses include Gaulin homogenizer, Microfluidizer and DEBEE2000 (trade names)).

More specifically, the pigment dispersion composition of the present invention can be obtained by, for example, subjecting an azo pigment represented by the formula (1), a dispersant, an azo pigment derivative and a solvent to fine dispersion treatment using a vertical or horizontal sand grinder, a pin mill, a slit mill or an ultrasonic dispersing apparatus with beads made of glass, zirconia or the like having a particle diameter of from 0.01 mm to 1 mm.

Before performing fine dispersion with beads, it is also possible to perform a kneading dispersion treatment using a two-roll mill, a three-roll mill, a ball mill, a Tron mill, a disper, a kneader, a co-kneader, a homogenizer, a blender, or a uniaxial or biaxial extruder while applying a strong shear force.

Details of the kneading and dispersion processes are described in T. C. Patton "Paint Flow and Pigment Dispersion" (published by John Wiley and Sons, Inc., 1964) and the like, and the method described therein is applicable to the present invention.

<Colored Curable Composition>

The colored curable composition of the present invention contains the above-described pigment dispersion composition of the present invention, a photopolymerization initiator and a polymerizable compound.

The colored curable composition of the present invention, having the above-described configuration, may achieve improved dispersion stability of the azo pigment represented by the formula (1) and improved heat resistance of a color pattern formed from the composition.

Although it is not clear as to why the heat resistance of the formed color pattern is improved by improving the dispersion stability, it is assumed to be because the decrease in transmissivity due to aggregation of the pigment can be suppressed. However, the present invention is not limited to this assumption.

<Photopolymerization Initiator>

The colored curable composition of the present invention contains a photopolymerization initiator.

For example, the photopolymerization initiator may be at least one selected from a benzophenone photopolymerization initiator, an acetophenone photopolymerization initiator, a benzoin photopolymerization initiator, a benzoin ether photopolymerization initiator, a thioxanthone photopolymerization initiator, an anthraquinone photopolymerization initiator, a naphtoquinone photopolymerization initiator, a triazine photopolymerization initiator, and an oxime photopolymerization initiator. These photopolymerization initiators may be used in combination with a known photosensitizer.

Among these photopolymerization initiators, an oxime photopolymerization initiator is preferable from the viewpoint of improving pattern formation suitability (pattern curability) and suppressing formation of development residues.

The oxime photopolymerization initiator is preferably a compound that decomposes with light, and initiates and promotes the polymerization reaction of a radical polymerizable monomer. The oxime photopolymerization initiator is more preferably one having an absorption in a wavelength region of from 300 nm to 500 nm. The reason why an oxime photopolymerization initiator achieves favorable results is believed to be because it exhibits an extremely high decomposition efficiency with light and that brings high curability, thereby enabling formation of a rectangular pattern after the development process.

Examples of the oxime photopolymerization initiator for use in the present invention include the compounds described in, for example, J. C. S. Perkin II (1979) pp. 1653-1660, J. C. S. Perkin II (1979) pp. 156-162, Journal of Photopolymer Science and Technology (1995) pp. 202-232, JP-A No. 2000-66385, JP-A No. 2000-80068 (paragraph numbers [0004] to [0296]), Japanese Patent Application National Publication No. 2004-534797, JP-A No. 2001-233842, WO-02/100903A1, JP-A No. 2006-342166 (paragraph numbers [0004] to [0264]), and the like.

From the viewpoint of more effectively achieving the effects of improving the pattern formation suitability and suppressing the formation of development residues, the oxime initiator is preferably a compound represented by the following formula (O-I).

(0-I)

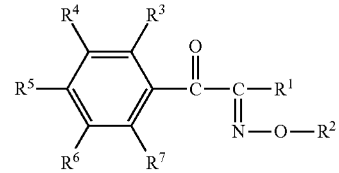

In the formula (O-I), $R^1$ represents an alkyl group which may have a substituent or an aryl group which may have a substituent. $R^2$ represents an acyl group which may have a substituent, an alkyl group which may have a substituent, an aryl group which may have a substituent, an alkenyl group which may have a substituent, an alkynyl group which may have a substituent or an acetyl group which may have a substituent. $R^3$, $R^4$, $R^5$, $R^6$ and $R^7$ each independently represents a hydrogen atom or a monovalent organic group. $R^3$, $R^4$, $R^5$, $R^6$ and $R^7$ may be bonded to each other to form a 5-membered or 6-membered ring.

Further, examples of the substituent that can be introduced into an alkyl group, an aryl group and an acyl group include a methyl group, an ethyl group, an n-propyl group, an n-butyl group, an i-propyl group, a t-butyl group, a chloro group, and a bromo group.

$R^1$ preferably represents an alkyl group having 1 to 12 carbon atoms or a 4-(alkylthio having 1 to 4 carbon atoms) phenyl group. $R^2$ preferably represents an acetyl group or an acyl group.

When $R^3$, $R^4$, $R^5$, $R^6$ and $R^7$ represent a monovalent organic group, examples of the preferred organic group include a methyl group, an ethyl group, a methoxy group, an ethoxy group, a phenoxy group, and a thiophenoxy group. Among them, a phenoxy group or a thiophenoxy group is preferable.

Further, $R^3$, $R^4$, $R^6$ and $R^7$ preferably represent a hydrogen atom. $R^5$ preferably represents a group represented by —$SR^8$, wherein $R^8$ represents a phenyl group which may have a substituent. More preferably, $R^5$ represents a group represented by the following formula.

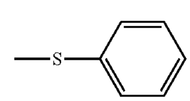

Among the oxime initiators represented by the formula (O-I), a preferred oxime initiator may be a compound represented by the following formula (O-II).

(0-II)

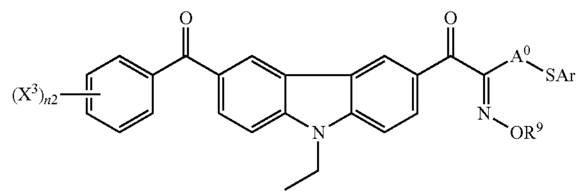

In the formula (O-II), $R^9$ has the same definition as $R^2$ in the formula (O-I). $X^3$ represents a monovalent substituent, and when n2 represents an integer of 2 to 5, the two to five of $X^3$ may be the same or different from each other. $A^0$ represents a divalent organic group, and Ar represents an aryl group. n2 represents an integer of 1 to 5.

In the formula (O-II), examples of the monovalent organic group represented by $X^3$ include a methyl group, an ethyl group, an n-propyl group, an n-butyl group, an i-propyl group, a t-butyl group, a methoxy group, and an ethoxy group.

In the formula (O-II), examples of the divalent organic group represented by $A^0$ include alkylene having from 1 to 12 carbon atoms, cyclohexylene and alkynylene.

In the formula (O-II), the aryl group represented by Ar is preferably an aryl group having from 6 to 30 carbon atoms, and the aryl group may have a substituent. Examples of the substituent that can be introduced into the aryl group include a methyl group, an ethyl group, an n-propyl group, an n-butyl group, an i-propyl group, a t-butyl group, a methoxy group, and an ethoxy group.

Ar preferably represents a substituted or unsubstituted phenyl group, from the viewpoint of enhancing sensitivity and suppressing coloration due to heat or time.

The following are specific examples of the oxime photoinitiator (I-1) to (I-6), in which compounds (I-2) to (I-6) that are encompassed by the formula (O-I) are particularly preferred, and compound (I-2) is most preferred since the amount of development residues formed during pattern formation is significantly small.

(I-1)

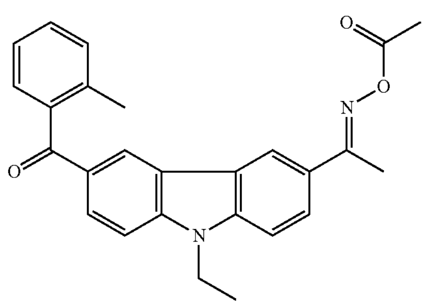

(I-2)

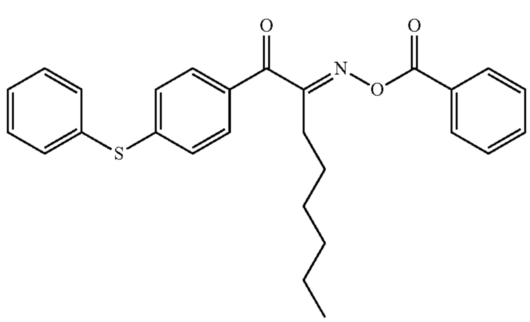

(I-3)

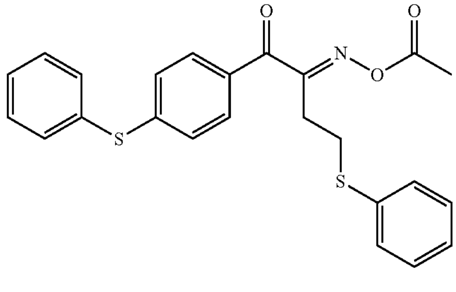

-continued (I-4)

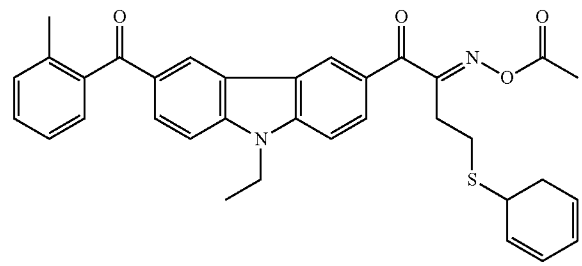

(I-5)

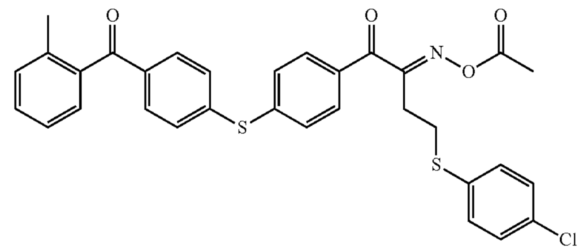

(I-6)

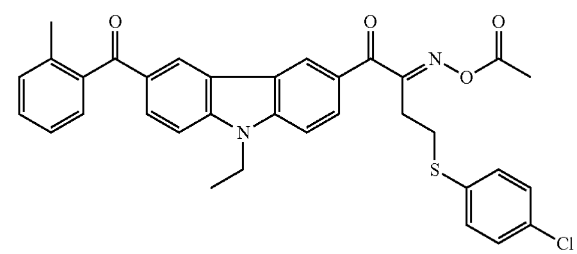

Examples of specific compound names of the oxime photopolymerization initiator that can be used in the present invention include 2-(O-benzoyloxime)-1-[4-(phenylthio)phenyl]-1,2-butanedione, 2-(O-benzoyloxime)-1-[4-(phenylthio)phenyl]-1,2-pentanedione, 2-(O-benzoyloxime)-1-[4-(phenylthio)phenyl]-1,2-hexanedione, 2-(O-benzoyloxime)-1-[4-(phenylthio)phenyl]-1,2-heptanedione, 2-(O-benzoyloxime)-1-[4-(phenylthio)phenyl]-1,2-octanedione, 2-(O-benzoyloxime)-1-[4-(methylphenylthio)phenyl]-1,2-butanedione, 2-(O-benzoyloxime)-1-[4-(ethylphenylthio)phenyl]-1,2-butanedione, 2-(O-benzoyloxime)-1-[4-(butylphenylthio)phenyl]-1,2-butanedione, 1-(O-acetyloxime)-1-[9-ethyl-6-(2-methylbenzoyl)-9H-carbazol-3-yl]ethanone, 1-(O-acetyloxime)-1-[9-methyl-6-(2-methylbenzoyl)-9H-carbazol-3-yl]ethanone, 1-(O-acetyloxime)-1-[9-propyl-6-(2-methylbenzoyl)-9H-carbazol-3-yl]ethanone, 1-(O-acetyloxime)-1-[9-ethyl-6-(2-ethylbenzoyl)-9H-carbazol-3-yl]ethanone, and 1-(O-acetyloxime)-1-[9-ethyl-6-(2-butylbenzoyl)-9H-carbazol-3-yl]ethanone. However, the present invention is not limited to these examples.

Particularly preferred specific examples of the oxime photopolymerization initiator include 2-(O-benzoyloxime)-1-[4-(phenylthio)phenyl]-1,2-octanedione and 1-(O-acetyloxime)-1-[9-ethyl-6-(2-methylbenzoyl)-9H-carbazol-3-yl]ethanone. Examples of these oxime photopolymerization initiators include CGI-124 and CGI-242 (trade name, manufactured by BASF Japan, Ltd.)

The content of the photopolymerization initiator (for example, an oxime photopolymerization initiator) in the colored curable composition of the present invention is preferably in the range of from 1.0% by mass to 15.0% by mass based on the total solid content, more preferably from 1.0% by mass to 12.5% by mass, even more preferably from 1.0% by mass to 10.0% by mass, and particularly preferably from 1.0% by mass to 5.0% by mass.

When the content of the photopolymerization initiator is within the above range, favorable sensitivity and pattern formation suitability, as well as coating film uniformity, may be realized.

<Polymerizable Compound>

The colored curable composition of the present invention contains at least one kind of polymerizable compound.

The polymerizable compound may be a known polymerizable compound, and may be a monofunctional polymerizable compound. However, from the viewpoint of further improving pattern formation suitability, a polyfunctional polymerizable compound is preferable, and a tri- or higher-functional polymerizable compound is more preferable.

Further, the polymerizable compound is preferably an addition-polymerizable compound having at least one ethylenically unsaturated double bond, more preferably a compound having at least one terminal ethylenically unsaturated bond, further preferably a compound having two or more terminal ethylenically unsaturated bonds. These compounds are widely known in the related industry field, and therefore may be used in the present invention without being particularly limited. The polymerizable compound has various chemical forms including a monomer, a prepolymer (i.e., a dimer or a trimer), an oligomer, or a mixture or a copolymer thereof.

Examples of the monomer and the copolymer thereof include unsaturated carboxylic acids (for example, acrylic acid, methacrylic acid, itaconic acid, crotonic acid, isocrotonic acid, or maleic acid), esters thereof, and amides thereof. Among these, esters of unsaturated carboxylic acid with an aliphatic polyhydric alcohol compound, and amides of unsaturated carboxylic acid with an aliphatic polyvalent amine compound are preferably used. Further, a compound obtained from addition reaction between an unsaturated carboxylic acid ester or amide having a nucleophilic substituent such as a hydroxyl group, an amino group or a mercapto group and a monofunctional or polyfunctional isocyanate or an epoxy compound, and a compound obtained from dehydration/condensation reaction with a mono- or polyfunctional carboxylic acid. Further suitable examples include a compound obtained from addition reaction between an unsaturated carboxylic acid ester or amide having an electrophilic substituent such as an isocyanate group or an epoxy group and a mono- or polyfunctional alcohol, amine or thiol; and a compound obtained from substitution reaction between an unsaturated carboxylic acid ester or amide having a leaving substituent such as a halogen group or a tosyloxy group and a mono- or polyfunctional alcohol, amine or thiol. Other examples include compounds in which the aforementioned unsaturated carboxylic acid is substituted with an unsaturated phosphonic acid, styrene, vinylether or the like.

It is also possible to use the polymerizable compounds described in paragraph numbers [0118] to [0128] of JP-A No. 2009-256572 as the polymerizable compound.

From the viewpoint of pattern formation suitability or the like, the polymerizable compound used in the present invention is also preferably at least one polymerizable compound selected from the photocurable compounds (polymerizable compounds) described in paragraph numbers [0029] to [0056] of JP-A No. 2009-244807 or in paragraph numbers [0038] to [0051] of JP-A No. 2009-229761, for example, compounds represented by the following formula (M-i) or (M-ii).

(M-i)

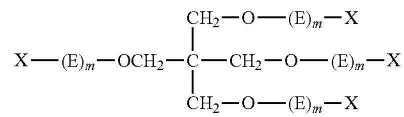

(M-ii)

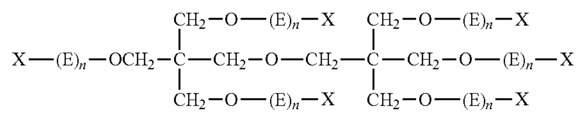

In the formulae (M-i) and (M-ii), E each independently represents —$((CH_2)_yCH_2O)$—, or —$((CH_2)_yCH(CH_3)O)$—, y each independently represents an integer of 0 to 10, X each independently represents an acryloyl group, a methacryloyl group, a hydrogen atom, or a carboxy group.

In the formula (M-i), the total number of the acryloyl group and the methacryloyl group is 3 or 4, m each independently represents an integer of 0 to 10, and the sum of m is an integer of 0 to 40. When the sum of m is 0, any one of X represents a carboxy group.

In the formula (M-ii), the total number of the acryloyl group and the methacryloyl group is 5 or 6, n each independently represents an integer of 0 to 10, and the sum of n is an integer of 0 to 60. When the sum of n is 0, any one of X represents a carboxy group.

In the formula (M-i), m preferably represents an integer of 0 to 6, more preferably an integer of 0 to 4. The sum of m preferably represents an integer of 2 to 40, more preferably an integer of 2 to 16, and particularly preferably an integer of 4 to 8.

In the formula (M-ii), n preferably represents an integer of 0 to 6, more preferably an integer of 0 to 4. The sum of n preferably represents an integer of 3 to 60, more preferably an integer of 3 to 24, and particularly preferably an integer of 6 to 12.

Further, in the formula (M-i) or (M-ii), —$((CH_2)_yCH_2O)$— or —$((CH_2)_yCH(CH_3)O)$— preferably has its terminal end at the oxygen atom side be bonded to X.

The compounds represented by the formula (M-i) or (M-ii) may be used alone or as a combination of two or more kinds thereof. It is particularly preferred that all of the six of X in the formula (M-ii) are an acryloyl group.

The compound represented by the formula (M-i) or (M-ii) can be synthesized by a conventional known method, i.e., bonding the ring-opened skeletons of pentaerythritol or dipentaerythritol with ethylene oxide or propylene oxide via ring-opening addition reaction, and introducing a (meth)acryloyl group thereto by allowing the terminal hydroxy group of the ring-opened skeleton to react with, for example, (meth)acryloyl chloride. Each of these processes are widely known, and those skilled in the art can easily synthesize the compound represented by the formula (M-i) or (M-ii).

Among the compounds represented by formula (M-i) or (M-ii), a pentaerythritol derivative and/or a dipentaerythritol derivative is more preferable. Specific examples of these derivatives include compounds represented by the following formulae (a) to (f) (hereinafter, also referred to as exemplary compounds (a) to (f)). Among them, exemplary compounds (a), (b), (c) and (f) are preferable.

(a)

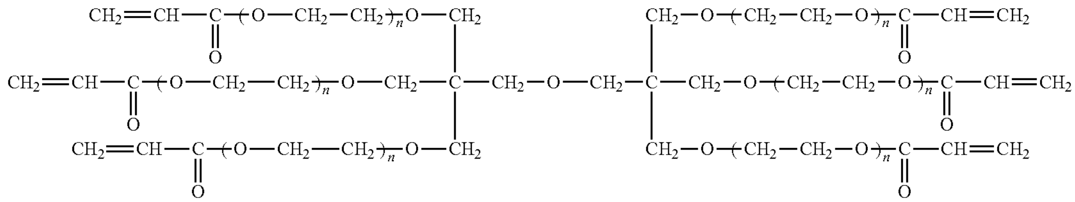

(sum of n: 6)

(b)

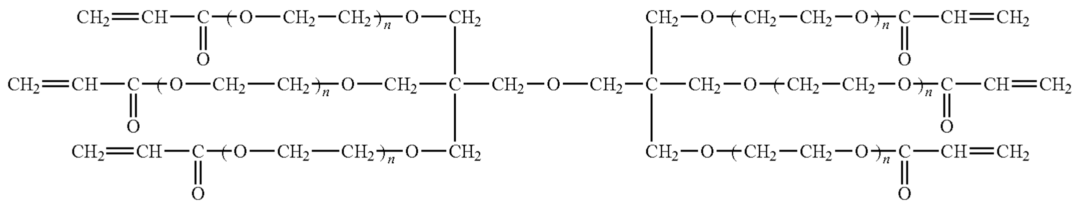

(sum of n: 12)

(c)

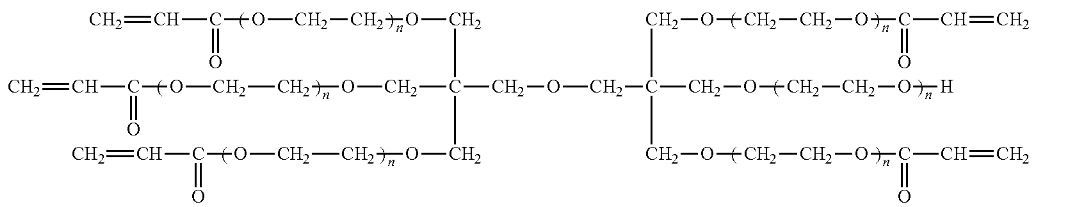

(sum of n: 12)

(d)

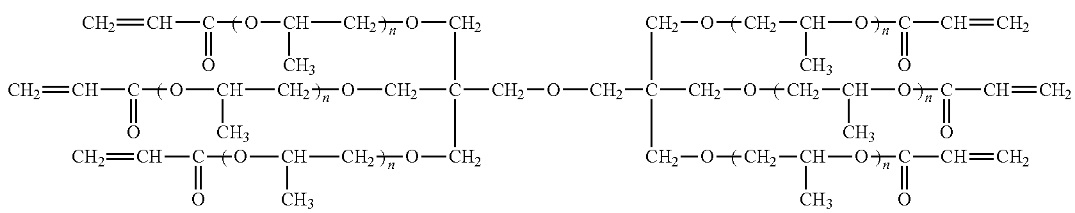

(sum of n: 6)

(e)

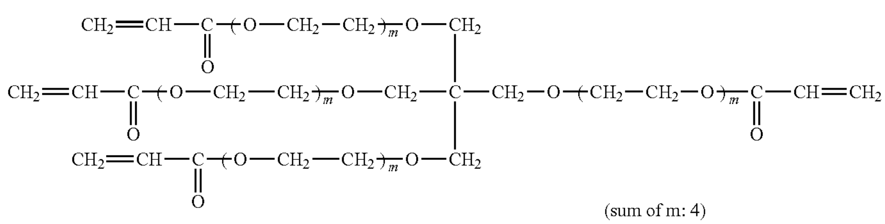

(sum of m: 4)

(f)

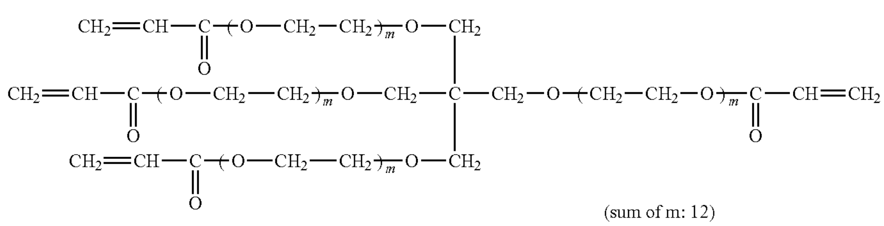

(sum of m: 12)

Examples of the commercially available products of the specific photocurable compound represented by the formula (M-i) or (M-ii) include SR-494 (trade name, manufactured by Sartomer Company, Inc.), which is a tetrafunctional acrylate having 4 ethyleneoxy groups, DPCA-60 (trade name, manufactured by Nippon Kayaku Co., Ltd.), which is a hexafunctional acrylate having 6 pentyleneoxy groups, and TPA-330, which is a trifunctional acrylate having 3 isobutyleneoxy groups.

The content of the polymerizable compound in the colored curable composition of the present invention is preferably in the range of from 5% by mass to 70% by mass, more preferably from 10% by mass to 60% by mass, based on the total solid content.

<Alkali Soluble Resin>

The colored curable composition of the present invention may contain an alkali soluble resin. If the colored curable composition contains an alkali soluble resin, pattern formation suitability can be further improved when the colored curable composition is used for forming a pattern by photolithography.

The alkali soluble resin is a linear organic polymer, and may be suitably selected from alkali soluble resins having at least one group that enhances alkali solubility (such as a carboxy group, a phosphoric acid group, or a sulfonic acid group) in the molecule (preferably a molecule having a main chain formed from an acrylic copolymer or a styrene copolymer). Among these, resins which are soluble in an organic solvent and developable by a weak alkali aqueous solution are further preferable.

A known radical polymerization method, for example, can be applied to the production of an alkali soluble resin. One skilled in the art can easily determine the polymerization conditions during manufacturing an alkali soluble resin by a radical polymerization method, such as the temperature, the pressure, the type or the amount of a radical initiator, the type of a solvent or the like, and these conditions can be determined through experiments.

The linear organic polymer is preferably a polymer having carboxylic acid in a side chain, and examples thereof include a methacrylic acid copolymer, an acrylic acid copolymer, an itaconic acid copolymer, a crotonic acid copolymer, a maleic acid copolymer and a partially esterified maleic acid copolymer, such as those described in JP-A No. 59-44615, Japanese Examined Patent Publication (JP-B) No. 54-34327, JP-B No. 58-12577, JP-B No. 54-25957, JP-A No. 59-53836 and JP-A No. 59-71048; acidic cellulose derivatives having carboxylic acid in a side chain thereof, polymers obtained by adding an acid anhydride to a polymer having a hydroxy group, and polymers having a (meth)acryloyl group in a side chain thereof.

Among them, a benzyl(meth)acrylate/(meth)acrylic acid copolymer or a multicomponent copolymer formed from benzyl(meth)acrylate, (meth)acrylic acid and a further monomer is particularly preferable.

A copolymer formed by using 2-hydroxyethyl methacrylate is also useful.

In addition, there are also a 2-hydroxypropyl(meth)acrylate/polystyrene macromonomer/benzylmethacrylate/methacrylic acid copolymer, a 2-hydroxy-3-phenoxypropylacrylate/polymethylmethacrylate macromonomer/benzylmethacrylate/methacrylic acid copolymer, a 2-hydroxyethylmethacrylate/polystyrene macromonomer/methylmethacrylate/methacrylic acid copolymer, and a 2-hydroxyethylmethacrylate/polystyrene macromonomer/benzylmethacrylate/methacrylic acid copolymer, which compounds are described in JP-A No. 7-140654.

The compound suitable as an alkali soluble resin used in the present invention may be, in particular, a copolymer of (meth)acrylic acid and a further monomer copolymerizable with the copolymer of (meth)acrylic acid. In the present specification, the term (meth)acrylic includes acrylic acid and methacrylic acid.

Examples of the monomer copolymerizable with (meth) acrylic acid include alkyl(meth)acrylate, aryl(meth)acrylate, and a vinyl compound. In these monomers, hydrogen atoms of the alkyl group or the aryl group may be substituted with a substituent.

Specific examples of the alkyl(meth)acrylate and the aryl (meth)acrylate include methyl(meth)acrylate, ethyl(meth) acrylate, propyl(meth)acrylate, butyl(meth)acrylate, isobutyl (meth)acrylate, pentyl(meth)acrylate, hexyl(meth)acrylate, octyl(meth)acrylate, phenyl(meth)acrylate, benzyl(meth) acrylate, tolyl(meth)acrylate, naphthyl(meth)acrylate, and cyclohexyl(meth)acrylate.

Examples of the vinyl compound include styrene, α-methyl styrene, vinyl toluene, glycidylmethacrylate, acrylonitrile, vinyl acetate, N-vinylpyrrolidone, tetrahydrofurfuryl methacrylate, polystyrene macromonomer, polymethylmethacrylate macromonomer, $CH_2{=}CR^1R^2$, and $CH_2{=}C(R^1)(COOR^3)$ (wherein $R^1$ represents a hydrogen atom or an alkyl group having 1 to 5 carbon atoms, $R^2$ represents an aromatic hydrocarbon ring having 6 to 10 carbon atoms, $R^3$ represents an alkyl group having 1 to 8 carbon atoms or an aralkyl group having 6 to 12 carbon atoms.)

These copolymerizable another monomers may be used alone or in a combination of two or more thereof.

The preferred copolymerizable another monomer is at least one selected from $CH_2{=}CR^1R^2$, $CH_2{=}C(R^1)(COOR^3)$, phenyl(meth)acrylate, benzyl(meth)acrylate and styrene, particularly preferably $CH_2{=}CR^1R^2$ and/or $CH_2{=}C(R^1)(COOR^3)$.

When an alkali soluble resin is used, the content of the alkali soluble resin in the colored curable composition is preferably in the range of from 1% by mass to 30% by mass with respect to the total solid content of the composition, more preferably from 1% by mass to 25% by mass, and particularly preferably from 2% by mass to 20% by mass.

<Solvent>

Generally, the colored curable composition of the present invention is preferably prepared by using a solvent in combination with the above-mentioned components.

Examples of the solvent to be used include esters such as ethyl acetate, n-butyl acetate, isobutyl acetate, amyl formate, isoamyl acetate, isobutyl acetate, butyl propionate, isopropyl butyrate, ethyl butyrate, butyl butyrate, alkyl esters, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate; alkyl 3-oxypropionates such as methyl 3-oxypropionate and ethyl 3-oxypropionate; methyl 3-methoxypropionate, ethyl 3-methoxypropionate, methyl 3-ethoxypropionate, ethyl 3-ethoxypropionate, methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, methyl pyruvate, ethyl pyruvate, propyl pyruvate, methyl acetoacetate, ethyl acetoacetate, methyl 2-oxobutanoate and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol methyl ether acetate, propylene glycol ethyl ether acetate and propylene glycol propyl ether acetate; ketones such as methyl ethyl ketone, cyclohexanone, 2-heptanone and 3-heptanone; and aromatic hydrocarbons such as toluene and xylene.

Among these solvents, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, propylene glycol methyl ether acetate, and the like are preferred.

These solvents may be used alone or as a combination of two or more kinds thereof.

<Surfactant>

Various kinds of surfactants may be added to the colored photosensitive composition of the present invention from the viewpoint of improving the coatability thereof. Various surfactants such as fluorine-containing surfactants, nonionic surfactants, cationic surfactants, and anionic surfactants may be used as the surfactant.

In particular, when the colored photosensitive composition of the present invention contains a fluorine-containing surfactant, liquid properties (in particular, fluidity) of the coating solution formed from the composition can be improved, the uniformity in the coating thickness can be improved, and the more amount of the coating solution can be saved.

Specifically, when a film is formed from a coating solution including a colored photosensitive composition that contains a fluorine-containing surfactant, the surface tension at an interface of the surface to be coated and the coating solution is decreased, whereby wettability of the coating solution with respect to the surface to be coated is improved, and the coatability of the coating solution is improved. This is effective in that a film having a uniform whickness with suppressed irregularities can be formed more suitably even when a film having a thickness of as thin as around several micrometers is formed with a small amount of coating solution.

The content of fluorine in the fluorine-containing surfactant is preferably in the range of from 3% by mass to 40% by mass, more preferably from 5% by mass to 30% by mass, and particularly preferably from 7% by mass to 25% by mass. When the fluorine content falls within the above range, it is effective in terms of achieving favorable uniformity in the film thickness and saving the amount of coating solution to be used, as well as achieving favorable solubility in the composition.

Examples of the fluorine-containing surfactant include MEGAFAC F171, MEGAFAC F172, MEGAFAC F173, MEGAFAC F176, MEGAFAC F177, MEGAFAC F141, MEGAFAC F142, MEGAFAC F143, MEGAFAC F144, MEGAFAC $R^{30}$, MEGAFAC F437, MEGAFAC F475, MEGAFAC F479, MEGAFAC F482, MEGAFAC F780, MEGAFAC F781 (trade name, all manufactured by DIC corporation), FLUORAD FC430, FLUORAD FC431, FLUORAD FC171 (trade name, all manufactured by Sumitomo 3M, Ltd.), SURFLON S-382, SURFLON SC-101, SURFLON SC-103, SURFLON SC-104, SURFLON SC-105, SURFLON SC-1068, SURFLON SC-381, SURFLON SC-383, SURFLON SC393, SURFLON KH-40 (trade name, all manufactured by Asahi Glass Co., Ltd.), and the like.

A fluorine-containing surfactant is particularly effective in terms of suppressing coating unevenness or thickness unevenness, when forming a thin coating film from the colored photosensitive composition of the present invention. The fluorine-containing surfactant is also effective when the colored photosensitive composition of the present invention is used for slit coating in which the coating solution tends to become insufficient.

The amount of the fluorine-containing surfactant is preferably in the range of from 0.001% by mass to 2.0% by mass with respect to the total mass of the colored photosensitive composition, more preferably from 0.005% by mass to 1.0% by mass.

Specific examples of the cationic surfactant include phthalocyanine derivatives (commercially available product: EFKA-745, trade name, manufactured by Morishita & Co., Ltd.), organosiloxane polymers (KP341, trade name, manufactured by Shin-Etsu Chemical Co., Ltd.), (meth)acrylic (co)polymers (POLYFLOW No. 75, No. 90 and No. 95, trade name, manufactured by Kyoeisha Chemical Co., Ltd.) and W001 (trade name, available from Yusho Co., Ltd.).

Specific examples of the nonionic surfactant include polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid ester (for example, PLURONIC L10, L31, L61, L62, 10R5, 17R2, 25R2, TETRONIC 304, 701, 704, 901, 904, 150R1, trade name, all manufactured by BASF).

Specific examples of the anionic surfactant include W004, W005 and W017 (trade name, available from Yusho Co., Ltd.)

<Thermal Polymerization Inhibitor>

A thermal polymerization inhibitor (polymerization inhibitor) may be added to the colored photosensitive composition of the present invention.

Examples of the usable thermal polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and 2-meracptobenzoimidazole.

<Other Components>

The colored curable composition of the present invention may optionally contain various additives, for example a sensitizing colorant, an epoxy resin, a fluorine-based organic compound, a thermal polymerization initiator, a thermal polymerization component, a filler, a high-molecular weight compound other than the above-mentioned alkali soluble resin, an adhesion promoter, an antioxidant, an ultraviolet absorbent, an aggregation inhibitor, and the like.

Examples of the other components include components described in, for example, paragraphs [0155] to [0217] of JP-A No. 2009-256572.

The colored curable composition of the present invention can be prepared by adding a polymerizable compound and a photopolymerization initiator, and further adding optional additives such as an alkali soluble resin, a solvent or a surfactant, to the above-mentioned pigment dispersion composition of the present invention.

The colored curable composition of the present invention, which includes a pigment dispersion composition containing an azo pigment represented by the formula (1) exhibits excellent pigment dispersibility and color characteristics.

Therefore, the colored curable composition of the present invention is suitably used for forming a colored region of a color filter that requires favorable color characteristics (in particular, a color filter for solid-state image sensors).

<Color Filter for Solid-State Image Sensors and Method of Producing the Same>

The method for producing a color filter for solid-state image sensors according to the present invention includes applying the colored curable composition of the present invention onto a support to form a colored curable composition layer (hereinafter, also referred to as "colored curable composition layer formation step"); exposing the colored curable composition layer to light via a mask (hereinafter, also referred to as "exposure step"); and developing the exposed colored curable composition layer to form a color pattern (hereinafter, also referred to as "color pixels") (hereinafter, also referred to as "development step").

Further, the color filter for solid-state image sensors according to the present invention is produced by the above method for producing a color filter for solid-state image sensors according to the present invention.

The color filter for a solid-state image sensors according to the present invention at least has a red pattern (red pixel) formed by the method of producing a color filter for solid-state image sensors according to the present invention. Specifically, the color filter for solid-state image sensors according to the present invention preferably has, for example, a configuration of a multi-color filter in which a red pattern is combined with a further color pattern (for example, a color filter having three or more colors in which at least a red pattern, a blue pattern and a green pattern are combined).

Hereinafter, the color filter for solid-state image sensors is also referred to as "color filter" sometimes.

<Colored Curable Composition Layer Formation Step>

In the colored curable composition layer formation step, the colored curable composition of the present invention is applied onto a support to form a colored curable composition layer.

The support used in this step may be, for example, a substrate for solid-state image sensors formed by providing an image pick-up device (light-receiving device) such as CCD (charge coupled device) or CMOS (complementary metal-oxide semiconductor) on a substrate (for example, a silicon substrate).

The color pattern of the present invention may be formed on the side of the support to which an image sensor is formed (front surface) or on the side of the support to which an image pick-up device is not formed (rear side).

A light-shielding film may be formed between the solid-state image sensors formed on the support, or on the rear surface of the support.

As necessary, an undercoat layer may be provided on the support for the purpose of improving adhesion to an upper layer, preventing diffusion of substances, or flattening the support surface.

The colored curable composition of the invention may be applied onto a support by various methods such as slit coating, ink jetting, rotary coating, cast coating, roll coating or screen printing.

The coating thickness of the colored curable composition is preferably from 0.1 μm to 10 μm, more preferably from 0.2 μm to 5 μm, and even more preferably from 0.2 μm to 3 μm.

The drying (prebaking) of the colored curable composition layer that has been formed on the support may be carried out by using a hot plate or an oven at a temperature of from 50° C. to 140° C. for from 10 seconds to 300 seconds.

<Exposure Step>

In the exposure step, the colored curable composition layer formed in the colored curable composition layer formation step is exposed to light in a patterned manner through a mask having a specific mask pattern, using an exposure apparatus such as a stepper.

The radiation (light) useful for the exposure is preferably ultraviolet radiation such as g-line or i-line (i-line is particularly preferred). The radiation (exposure) amount is preferably from 30 $mJ/cm^2$ to 1500 $mJ/cm^2$, more preferably from 50 $mJ/cm^2$ to 1000 $mJ/cm^2$, and most preferably from 80 $mJ/cm^2$ to 500 $mJ/cm^2$.

<Development Step>

Subsequently, the alkali development is carried out to allow the unexposed portion to elute to an alkaline aqueous solution so that the exposured portion that has been cured with light remains.

The developer is preferably an organic alkaline developer that does not damage the image pick-up device or a circuit formed underneath. The development temperature is normally from 20° C. to 30° C., and the development time is normally from 20 seconds to 90 seconds.

Examples of the alkaline chemical used for the developer include organic alkaline compounds such as ammonia water, ethylamine, diethylamine, dimethylethanolamine, tetramethyl ammonium hydroxide, tetraethyl ammonium hydroxide, choline, pyrrole, piperidine, and 1,8-diazabicyclo-[5.4.0]-7-undecene. An aqueous alkaline solution prepared by diluting an alkaline chemical with pure water, such that the concentration thereof is from 0.001% by mass to 10% by mass, preferably 0.01% by mass to 1% by mass, is suitably used as the developer. When an aqueous alkaline solution as prepared by the above process is used as the developer, rinsing with pure water is typically carried out after the development.

Subsequently, the coated layer is washed to remove excessive developer and dried, and then subjected to heat treatment (postbaking). These steps are repeated for the number of times corresponding to the number of colors, thereby producing cured films of respective colors. A color filter is thus obtained.

The postbaking is heat treatment that is carried out after performing development for the purpose of achieving completed curing, and this is carried out normally at from 100° C. to 240° C., preferably from 200° C. to 240° C.

The postbaking treatment may be carried out in a continuous manner or a batch manner, while using a heating means such as a hot plate, a convection oven (hot air circulating dryer) or a high-frequency heater so as to satisfy the above conditions.

As necessary, the method of the present invention may include other steps known as a production method of a color filter for solid-state image sensors. For example, the method of the present invention may include a curing step for curing the formed color patterns through heating and/or exposing to light, after forming the colored curable composition layer, exposing the same to light, and then developing the same.

When the colored curable composition of the present invention is used, there may be cases in which clogging in nozzles or pipings at an ejection port of the application device or contamination due to adherance, deposition or drying of the colored curable composition or pigment to the application device is caused. In order to effectively remove the contamination caused by the colored curable composition of the present invention, the solvents previously mentioned with respect to the composition of the present invention are preferably used as a cleaning liquid. The cleaning liquids described in JP-A No. 7-128867, JP-A No. 7-146562, JP-A No. 8-278637, JP-A No. 2000-273370, JP-A No. 2006-85140, JP-A No. 2006-291191, JP-A No. 2007-2101, JP-A No. 2007-2102 and JP-A No. 2007-281523 may also be suitably used for cleaning and removing the colored curable composition of the present invention.

Among these cleaning liquids, alkylene glycol monoalkyl ether carboxylate and alkylene glycol monoalkyl ether are preferably used.

These solvents may be used alone or as a combination of two or more kinds thereof. When two or more kinds of solvents are used in combination, it is preferred to mix a solvent having a hydroxy group and a solvent not having a hydroxy group. The mass ratio of the solvent with having a hydroxy group with respect to the solvent not having a hydroxy group is preferably from 1/99 to 99/1, more preferably from 10/90 to 90/10, and further preferably from 20/80 to 80/20. A particularly preferred solvent is a mixed solvent of propylene glycol monomethyl ether acetate (PGMEA) and propylene glycol monomethyl ether (PGME) with a mixed ratio of 60/40. In order to enhance the permeability of the cleaning liquid to the contaminants, the cleaning liquid may contain a surfactant as previously mentioned with respect to the curable composition of the present invention.

Since the color filter for solid-state image sensors according to the present invention uses the colored curable composition of the present invention, its color pattern exhibits favorable heat fastness. Further, since the color filter for solid-state image sensors according to the present invention is formed by using an azo pigment represented by the formula (1), it exhibits excellent spectral properties of a red color.

The color filter for solid-state image sensors according to the present invention is suitably used for solid-state image sensors such as CCD or CMOS image sensors, and particularly suitably used for CCD or CMOS image sensors having a resolution of as high as over 1,000,000 pixels. The color filter for solid-state image sensors according to the present invention is useful as, for example, a color filter disposed between light-receiving portions of respective pixels of CCD or CMOS image sensors and a microlens for collecting light.

The film thickness of a color pattern (color pixel) in the color filter for solid-state image sensors is preferably 2.0 μm or less, more preferably 1.0 μm.

The size (pattern width) of the color pattern (color pixel) is preferably 2.5 μm or less, more preferably 2.0 μm or less, and particularly preferably 1.7 μm or less.

<Solid-State Image Sensors>

The solid-state image sensors of the present invention include the above-described color filter for solid-state image sensors according to the present invention.

The configuration of the solid-state image sensor according to the present invention is not particularly limited as long as it includes the color filter for solid-state image sensors according to the present invention and functions as a solid-state image sensor, and the following is one exemplary configuration of the solid-state image sensor according to the present invention.

Specifically, the solid-state image sensor may have, on a support, plural photodiodes that form the light-receiving area of the solid-state image sensor (such as a CCD image sensor or a CMOS image sensor) and a transfer electrode made of polysilicon or the like; a light-shielding film made of tungsten or the like with openings formed at positions corresponding to the light-receiving portions of the photodiodes; a device protecting film made of silicon nitride or the like that covers the entire surface of the light-shielding film and the light-receiving portions of the photodiodes; and the color filter for solid-state image sensors according to the present invention disposed on the device protecting film.

Further, the solid-state image sensor may have a configuration in which a light-condensing unit (such as a microlens) is provided under the color filter (the side closer to the support) but above the device protecting layer, or a configuration in which a light-condensing unit is formed on the color filter.

EXAMPLES

Hereinafter, the present invention will be further described in detail with reference to the following examples. The materials, reagents, ratios, instruments, operations, and the like shown in the following examples may be appropriately modified without departure from the gist of the present invention. Accordingly, the present invention is not limited to the following specific examples. In the following examples, the terms "%" and "part(s)" refer to "% by mass" and "part(s) by mass", respectively, and the molecular weight refers to weight average molecular weight, unless otherwise specifically indicated.

Example 1

<Preparation of Pigment Dispersion Composition P>

(Preparation of Glauber's Salt (Pulverized Sodium Sulfate))

Dry air was supplied to a 0.65 MPa jet mill (manufactured by Nisshin Engineering Inc., an air-flow type pulverizer, SUPER JET MILL, trade name), and Glauber's salt (manufactured by Mitajiri Chemical Industry Co., Ltd., neutral anhydrous Glauber's salt, average particle diameter: 20 μm) as a raw material was supplied at a rate of 20 kg/hr, and was continuously pulverized. The pulverized Glauber's salt discharged from the pulverizer was collected with a bug filter.

The pulverized Glauber's salt was added to isobutyl alcohol, and dispersed with ultrasonic waves for 1 minute. The particle size distribution was measured with a particle diameter analyzer (Microtrac particle size distribution analyzer: MT-3300 II, trade name, manufactured by Nikkiso Co., Ltd.) to calculate an average particle diameter D50, and the result was 3.19 μm. Further, the volume % of the large-sized particles having a particle diameter of 10 μm or greater was calculated from the particle size distribution data, and the result was 0.00 volume %.

(Solvent-Salt Milling of Pigment)

The following pigment 1 (red pigment), which is an azo pigment represented by the formula (1), was micronized by solvent-salt milling. Details of the pigment are described hereinbelow.

-Pigment 1-

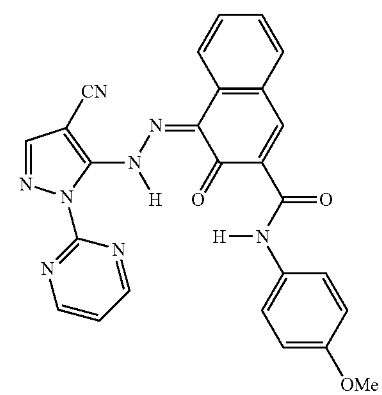

The solvent-salt milling of pigment 1 was carried out in accordance with the following procedure.

First, 3,000 g of the pulverized Glauber's salt were added to a twin-screw kneader (manufactured by Moriyama Co., Ltd., 5 L kneader Σ type, trade name, hereinafter referred to as "kneader") and 300 g of pigment 1 was further added thereto, and mixed for 5 minutes. Subsequently, 900 g of diethylene glycol (DEG) (manufactured by Nippon Shokubai Co., Ltd.) were added to the mixture and kneaded. The temperature of the kneaded material in the kneader was controlled to 50° C., and this was further kneaded for 10 hours (hereinafter, the kneaded material is referred to as "magma"). The micronization was performed through these steps.

Next, the micronized magma was taken out and transferred to a tank capable of controlling the temperature thereof, which had been previously filled with 20 L of deionized water. The magma was dispersed by stirring with a stirrer at 150 rpm for 2 hours. The resulting dispersion was transferred to Nutsche, and subjected to filteration. Thereafter, the filtrate was washed with deionized water until the drainage had an electrical conductivity of 3 μS/cm or lower (the washed micronized pigment containing a large amount of water is referred to as a pigment paste.)

The pigment paste after being washed with water was taken out and placed on a drying shelf (made of SUS304), and was transferred to a drier and dried at a temperature of from 80° C. to 105° C. for 15 hours (the micronized pigment after being dried is referred to as a dried block.)

The dried block was pulverized with a pulverizer (manufactured by Kyoritsu Riko), a small-sized pulverizing machine, SAMPLE MILL SK-M2, trade name).

The solvent-salt milling of pigment 1 was carried out by the above process. The thus obtained pigment 1 after being subjected to solvent-salt milling was used for the preparation of the following pigment dispersion composition P.

(Preparation of Pigment Dispersion Composition P)

A mixture of the following composition was mixed and dispersed by a bead mill for 2 hours, thereby preparing a red pigment dispersion composition P.

<Composition>

| | |
|---|---|
| Mixture of pigment 1 after being subjected to solvent-salt milling and Pigment Yellow 139 (PY139) (mass ratio [pigment 1/PY139] = 100/30) | 11.80 parts |
| Pigment derivative 1 (following structure, azo pigment derivative) | 1.31 parts |
| Dispersant 1 (following structure, weight average molecular weight: 35,000, acid value: 100 mgKOH/g) | 6.59 parts |
| Propylene glycol monomethyl ether acetate (PGMEA) | 80.29 parts |

In the above pigment mixture, pigment 1 is a major pigment, and Pigment Yellow 139 is a minor pigment.

The volume-average particle diameter of the resulting red pigment dispersion composition P was measured using a particle size distribution analyzer (NANOTRAC UPA-EX150, trade name, manufactured by Nikkiso Co., Ltd.), and the result was 10 nm.

<Evaluation of Dispersion Stability>

The dispersion stability of the red pigment dispersion composition P was evaluated by the following manner.

Specifically, the amount of increase in viscosity (η2−η1) was calculated from the viscosity η1 (mPa·s), which was measured immediately after the composition was dispersed, and the viscosity η2 (mPa·s), which was measured after the composition was allowed to stand at room temperature (25° C., the same as follows) for one week after the dispersion. The measurement was carried out by using an E-type viscometer (trade name: RE-85L, manufactured by Toki Sangyo Co., Ltd.)

The dispersion stability was evaluated based on the amount of increase in viscosity in accordance with the following evaluation criteria. The results are given in Table 1.

The smaller the amount of increase in viscosity is, the better the dispersion stability of the composition is.

—Evaluation Criteria—

A: the amount of increase in viscosity is equal to or less than 3 mPa·s

B: the amount of increase in viscosity is from more than 3 mPa·s to 6 mPa·s

C: the amount of increase in viscosity is greater than 6 mPa·s

<Preparation of Red Colored Curable Composition R>

The above pigment dispersion composition P was mixed and stirred to give the following composition, thereby preparing a red colored curable composition R.

Pigment derivative 1

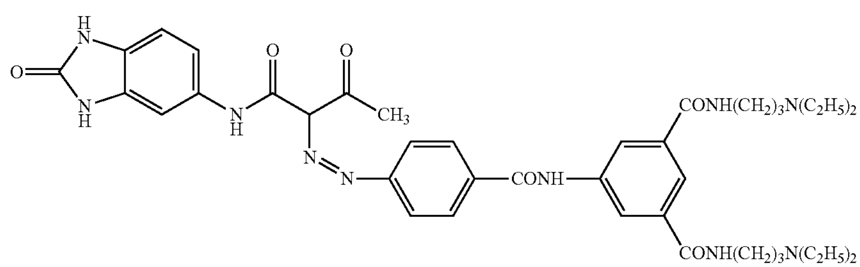

Dispersant 1

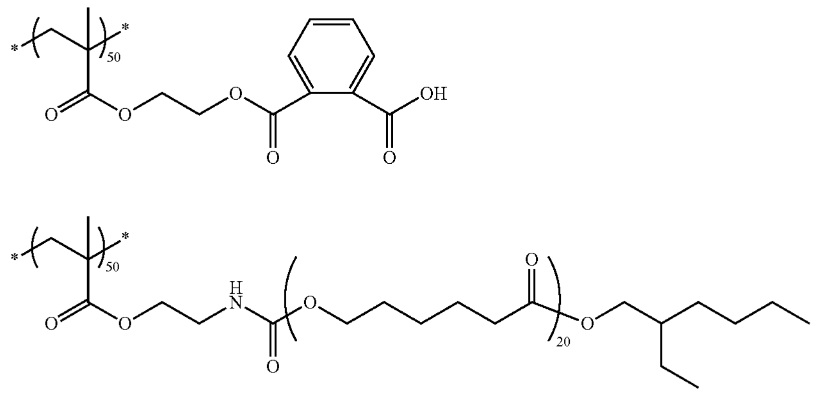

(Composition)

| | |
|---|---|
| Pigment dispersion composition P: | 10.28 parts |
| Polymerizable compound (exemplary compound (b)): | 0.15 parts |
| Oxime photopolymerization initiator (trade name: CGI-124, manufactured by BASF Japan Ltd.) (Initiator 1) | 0.07 parts |
| Polymerization inhibitor (p-methoxyphenol): | 0.01 parts |
| Resin (benzyl methacrylate/methacrylic acid/2-hydroxyethyl methacrylate copolymer, mole ratio: 60/22/18, weight average molecular weight: 15,000)) | 1.14 parts |
| Fluorine-containing surfactant (MEGAFAC F781, trade name, manufactured by DIC Corporation, 1.0% PGMEA solution): | 0.63 parts |
| Solvent (propylene glycol monomethylether acetate): | 2.73 parts |

The resin (benzyl methacrylate/methacrylic acid/2-hydroxyethyl methacrylate copolymer) was synthesized according to the following procedure.

Specifically, 53.0 g (0.300 mol) of benzyl methacrylate, 11.7 g (0.090 mol) of 2-hydroxyethyl methacrylate, 7.92 g (0.110 mol) of methacrylic acid, and 50 g of propylene glycol monomethylether acetate were placed in a 300 ml four-necked flask and stirred at 80° C. under a nitrogen atmosphere. A solution of 0.3118 g ($1.91\times10^{-3}$ mol) of a thermal polymerization initiator (2,2'-azobisisobutylnitrile, AIBN) dissolved in 10 g of propylene glycol monomethylether acetate was added thereto, and stirred for 6 hours. Then, the supply of nitrogen was stopped, and a solution prepared by dissolving 0.22 g ($1.5\times10^{-3}$ mol) of p-methoxyphenol in 15 g of propylene glycol monomethylether acetate was added thereto, and the temperature was elevated to 95° C. and stirred for 2 hours, thereby obtaining the resin (benzyl methacrylate/methacrylic acid/2-hydroxyethyl methacrylate copolymer). The resulting resin had an acid value of 30 mgKOH/g and a weight average molecular weight of 15,000.

<Fabrication of Red Color Filter>

The red colored curable composition R prepared as described above was applied to a surface of an 8-inch silicon wafer on which a device was formed and hexamethyldisilazane was sprayed (a substrate for solid-state image sensor) at the side on which the device was formed, whereby a photocurable coating film was formed. The substrate was heated for 120 seconds using a hot plate at 100° C. (prebaking) such that the dried thickness of the coating film was 1.0 μm.

Subsequently, the assembly was exposed to light in a patterned manner at a wavelength of 365 nm with an exposure amount of 150 mJ/cm$^2$, through a photomask for forming red pixels having the size of 1.0 μm square, using an i-line stepper exposure apparatus (FPA-3000i5+, trade name, manufactured by Canon, Inc.)

Thereafter, the silicon wafer with the exposured coating film was placed on a horizontal rotary table of a spin-shower developing machine (DW-30, trade name, manufactured by Chemitronics Co., Ltd.) and subjected to paddle development at 23° C. for 180 seconds using a 40% diluted solution of a developer (CD-2000, trade name, manufactured by Fuji Film Electronics Materials Co., Ltd.), thereby forming a red pattern on the silicon wafer.

The silicon wafer on which a red pattern was formed was fixed to the horizontal rotary table by vacuum chucking, and while the silicon wafer was rotated by a rotating apparatus at 50 rpm, it was subjected to rinsing treatment by supplying pure water in a shower from ejection nozzles placed above the rotational center of the silicon wafer, and then the silicon wafer was spray-dried.

Then, the silicon wafer was heated with a hot plate at 200° C. for 5 minutes, thereby obtaining a red pattern (red color filter) on the silicon wafer.

The silicon wafer on which a red color filter was formed was examined with a scanning electron microscope (SEM) (×20,000). As a result, it was proved that formation of development residues was suppressed in a region at which a color pattern was not formed.

Further, the pattern shape of the red color filter was examined with an optical microscope (×1,000) and a scanning electron microscope (SEM) (×20,000). As a result, the pattern shape was favorable and it was proved that the pattern formability was favorable.

Next, in the fabrication of the red color filter, the 8-inch silicon wafer on which a device was formed was changed to a glass substrate, and a red film was formed by subjecting the entire surface thereof to pattern exposure and the spectral characteristics of the red film (transmissivity at respective wavelengths) were measured with a spectrophotometer (MCPD-3000, trade name, manufactured by Otsuka Electronics Co., Ltd.) The measured spectral characteristics exhibited a decrease in transmissivity in a wavelength region of from 350 nm to 400 nm, a sharp rise in the transmissivity curve in a wavelength region of 540 nm or longer, and a high transmissivity in a wavelength region of from 650 nm to 750 nm.

As a result, favorable spectral characteristics as a red color were achieved.

<Evaluation of Heat Fastness>

In the fabrication of the red color filter, the 8-inch silicon wafer on which a device was formed was changed to a glass substrate, and a red film was formed by subjecting the entire surface thereof to pattern exposure.

The color difference (ΔE*ab) of the resulting film before and after exposing the same to air at 220° C. for 60 minutes was measured by a spectrophotometer (MCPD-3000, trade name, manufactured by Otsuka Electronics Co., Ltd.) Based on the measured color difference (ΔE*ab), the heat fastness of the red film was evaluated in accordance with the following evaluation criteria. The evaluation results are shown in Table 1 below.

<Evaluation Criteria>

A: ΔE*ab is not greater than 3

B: ΔE*ab is greater than 3 but not greater than 10

C: ΔE*ab is greater than 10

Examples 2 to 21 and Comparative Examples 1 to 3

A pigment dispersion composition, a colored curable composition, and a red color filter were prepared in a similar manner to Example 1, except that the type of a major pigment, a minor pigment, a pigment derivative, a dispersant, and an initiator was changed as shown in Table 1. The evaluation was performed in a similar manner to Example 1, and the evaluation results are shown in Table 1.

Example 22

<Preparation of Red Colored Curable Composition R22

A pigment dispersion composition P22 was prepared in a similar manner to Example 1, except that the type of a major pigment, a minor pigment, a pigment derivative, a dispersant, and a dispersant was changed as shown in Table 1. The evaluation was performed in a similar manner to Example 1. In addition, a red colored curable composition R22 was prepared by mixing and stirring the pigment dispersion composition P22 with the following composition.

(Composition)

| | |
|---|---|
| Pigment dispersion composition P22 | 12.30 parts |
| Polymerizable compound (exemplary compound (b)): | 0.21 parts |
| Oxime photopolymerization initiator (trade name: CGI-242, manufactured by BASF Japan, Ltd.) (Initiator 2) | 0.06 parts |
| Polymerization inhibitor (p-methoxyphenol) | 0.01 parts |
| Fluorine-containing surfactant (MEGAFAC F781, trade name, manufactured by DIC Corporation, 1.0% PGMEA solution) | 0.63 parts |
| Solvent (propylene glycol monomethylether acetate) | 1.79 parts |

By using the resulting colored curable composition, a red color filter was prepared in a similar manner to Example 1. The evaluation was performed in a similar manner to Example 1. The evaluation results are shown in Table 1.

Example 23

<Preparation of Red Colored Curable Composition R23>

A pigment dispersion composition P23 was prepared in a similar manner to Example 1, except that the type of a major pigment, a minor pigment, a pigment derivative, and a dispersant was changed as shown in Table 1. The evaluation was performed in a similar manner to Example 1. In addition, a red colored curable composition R23 was prepared by mixing and stirring the pigment dispersion composition P23 with the following composition.

(Composition)

| | |
|---|---|
| Pigment dispersion composition P23 | 12.30 parts |
| Polymerizable compound (exemplary compound (b)) | 0.21 parts |
| Oxime photopolymerization initiator (trade name: CGI-242, manufactured by BASF Japan, Ltd.) (Initiator 2) | 0.06 parts |
| Polymerization inhibitor (p-methoxyphenol) | 0.01 parts |
| Fluorine-containing surfactant (MEGAFAC F781, trade name, manufactured by DIC Corporation, 1.0% PGMEA solution) | 0.63 parts |
| Solvent (propylene glycol monomethylether acetate) | 1.79 parts |

By using the resulting colored curable composition, a red color filter was prepared in a similar manner to Example 1. The evaluation was performed in a similar manner to Example 1. The evaluation results are shown in Table 1.

TABLE 1

| | Colored Curable Composition | | | | | Measurement Results | | Evaluation Results | |
|---|---|---|---|---|---|---|---|---|---|
| | Pigment Dispersion Composition | | | | | Increase in Viscosity | Color Difference | Dispersion | Heat |
| | Major Pigment | Minor Pigment | Compound | Dispersant | Initiator | (mPa · s) | (ΔE* ab) | Stability | Fastness |
| Example 1 | Pigment 1 | Pigment 4 | Pigment Derivative 1 | Dispersant 1 | Initiator 1 | 1 | 2 | A | A |
| Example 2 | Pigment 1 | Pigment 4 | Pigment Derivative 1 | Dispersant 2 | Initiator 1 | 1 | 1 | A | A |
| Example 3 | Pigment 1 | Pigment 4 | Pigment Derivative 1 | Dispersant 3 | Initiator 1 | 2 | 5 | A | B |
| Example 4 | Pigment 1 | Pigment 4 | Pigment Derivative 1 | Dispersant 4 | Initiator 1 | 2 | 4 | A | B |
| Example 5 | Pigment 1 | Pigment 4 | Pigment Derivative 1 | Dispersant 5 | Initiator 1 | 2 | 4 | A | B |
| Example 6 | Pigment 1 | Pigment 4 | Pigment Derivative 1 | Dispersant 6 | Initiator 1 | 2 | 8 | A | B |
| Example 7 | Pigment 1 | Pigment 4 | Pigment Derivative 1 | Dispersant 7 | Initiator 1 | 4 | 6 | B | B |
| Example 8 | Pigment 2 | Pigment 4 | Pigment Derivative 1 | Dispersant 1 | Initiator 1 | 1 | 5 | A | B |
| Example 9 | Pigment 2 | Pigment 4 | Pigment Derivative 1 | Dispersant 2 | Initiator 1 | 1 | 9 | A | B |
| Example 10 | Pigment 3 | Pigment 4 | Pigment Derivative 1 | Dispersant 1 | Initiator 1 | 1 | 7 | A | B |
| Example 11 | Pigment 3 | Pigment 4 | Pigment Derivative 1 | Dispersant 2 | Initiator 1 | 1 | 8 | A | B |
| Example 12 | Pigment 1 | Pigment 5 | Pigment Derivative 1 | Dispersant 1 | Initiator 1 | 5 | 4 | B | B |
| Example 13 | Pigment 1 | Pigment 6 | Pigment Derivative 1 | Dispersant 1 | Initiator 1 | 2 | 4 | A | B |
| Example 14 | Pigment 1 | Pigment 7 | Pigment Derivative 1 | Dispersant 1 | Initiator 1 | 2 | 6 | A | B |
| Example 15 | Pigment 1 | Pigment 8 | Pigment Derivative 1 | Dispersant 1 | Initiator 1 | 4 | 5 | B | B |
| Example 16 | Pigment 1 | Pigment 9 | Pigment Derivative 1 | Dispersant 1 | Initiator 1 | 3 | 4 | A | B |
| Example 17 | Pigment 1 | not used | Pigment Derivative 1 | Dispersant 1 | Initiator 1 | 4 | 3 | B | A |
| Example 18 | Pigment 1 | Pigment 4 | Pigment Derivative 2 | Dispersant 1 | Initiator 1 | 3 | 7 | A | B |
| Example 19 | Pigment 1 | Pigment 4 | Pigment Derivative 1 | Dispersant 2 | Initiator 2 | 2 | 1 | A | A |
| Example 20 | Pigment 1 | Pigment 4 | Pigment Derivative 1 | Dispersant 8 | Initiator 2 | 1 | 2 | A | A |
| Example 21 | Pigment 1 | Pigment 4 | Pigment Derivative 1 | Dispersant 9 | Initiator 2 | 1 | 2 | A | A |
| Example 22 | Pigment 1 | Pigment 4 | Pigment Derivative 1 | Dispersant 2 | Initiator 2 | 2 | 2 | A | A |
| Example 23 | Pigment 1 | Pigment 4 | Pigment Derivative 1 | Dispersant 8 | Initiator 2 | 1 | 1 | A | A |
| Comp. Ex. 1 | Pigment 1 | Pigment 4 | Comparative Pigment Derivative 1 | Dispersant 1 | Initiator 1 | 7 | 10 or greater | C | C |
| Comp. Ex. 2 | Pigment 1 | Pigment 4 | Comparative Pigment Derivative 1 | Dispersant 2 | Initiator 1 | 8 | 10 or greater | C | C |
| Comp. Ex. 3 | Pigment 1 | Pigment 4 | not used | Dispersant 1 | Initiator 1 | 10 | 10 or greater | C | C |

The following are details of the compositions shown in Table 1.
Pigment 2
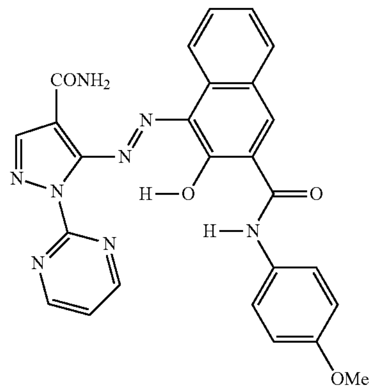
Pigment 3
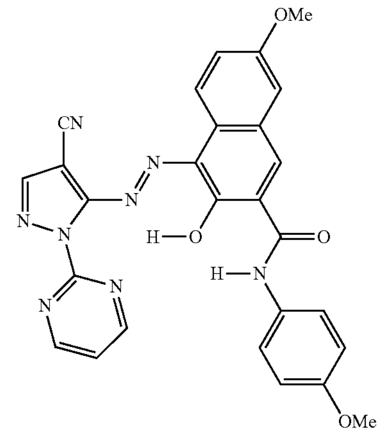
Pigment 4:
Pigment Yellow 139
Pigment 5:
Pigment Yellow 150
Pigment 6:
Pigment Yellow 185
Pigment 7:
Pigment Red 254
Pigment 8:
Pigment Orange 71
Pigment 9:
Pigment Violet 29
Pigment Derivative 2
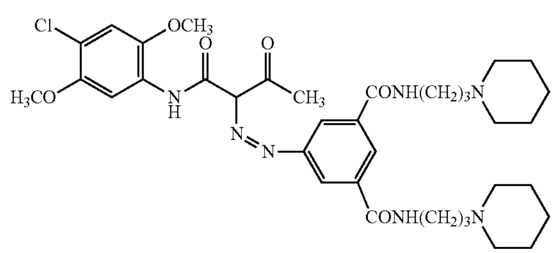
Comparative Pigment Derivative 1
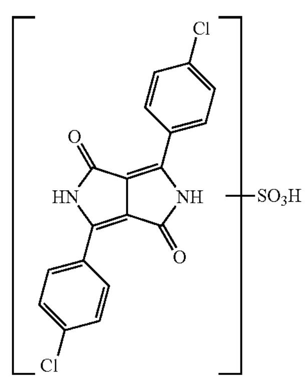
Dispersant 2
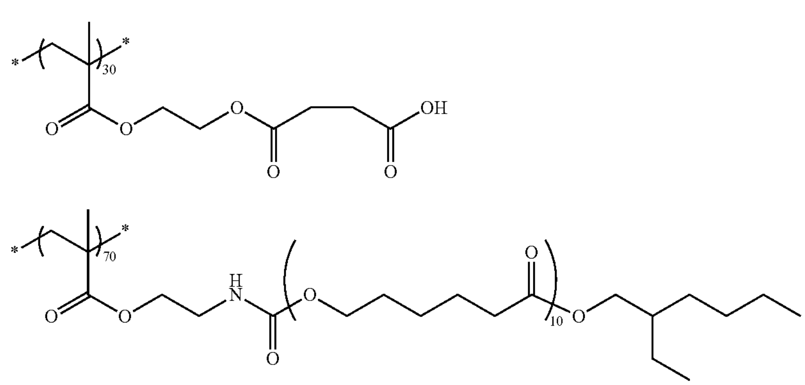

-continued

Dispersant 3

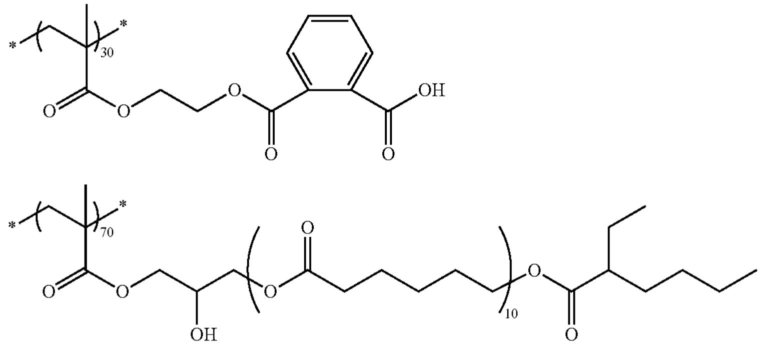

The dispersant 2 had a weight average molecular weight of 28,500 and an acid value of 73 mgKOH/g.

The dispersant 3 had a weight average molecular weight of 30,000 and an acid value of 60 mgKOH/g.

Dispersant 4: a dispersant obtained by the following method.

50 parts by mass of polyethyleneimine having a molecular weight of about 5,000, and 40 parts by mass of polycaprolactone (n=5) were mixed with 300 parts by mass of propylene glycol monomethylether acetate, and stirred at 150° C. for 3 hours under a nitrogen atmosphere, thereby obtaining dispersant 4. The dispersant 4 had a weight average molecular weight Mw as measured by GPC of about 9,000.

Dispersant 5: DISPERBYK-110, trade name, manufactured by BYK JAPAN K.K.

Dispersant 6: DISPERBYK-111, trade name, manufactured by BYK JAPAN K.K.

Dispersant 7: DISPERBYK-2091, trade name, manufactured by BYK JAPAN K.K.

Dispersant 8: a dispersant represented by the following structural formula, having a weight average molecular weight of 23,000 and an acid value of 75 mgKOH/g.

Dispersant 8

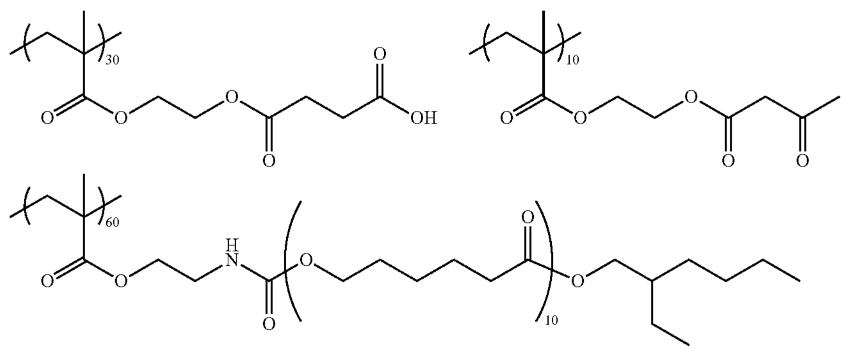

Dispersant 9: a dispersant represented by the following structural formula, having a weight average molecular weight of 21,000 and an acid value of 80 mgKOH/g.

Dispersant 9

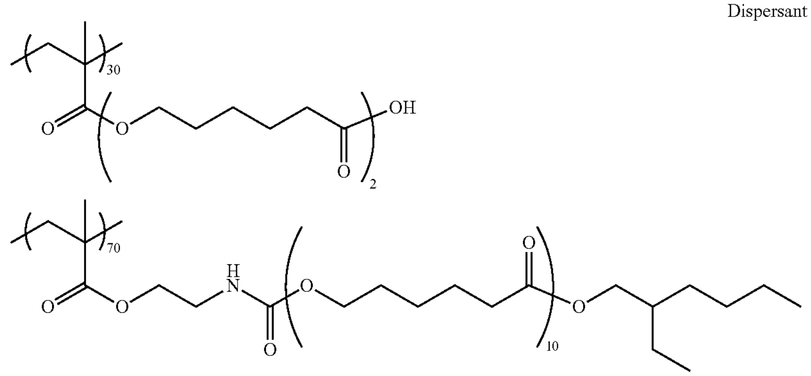

As shown in Table 1, the pigment dispersions prepared in Examples 1 to 23, containing a specific azo pigment, a dispersant and an azo pigment derivative, exhibited a suppressed amount of increase in viscosity and favorable dispersion stability. Further, the color patterns of the color filters prepared by using these pigment dispersions exhibited favorable heat fastness.

On the other hand, the pigment dispersions prepared in Comparative Examples 1 and 2, in which the azo pigment derivative was changed to comparative pigment derivative 1, and Comparative Example 3, in which a pigment derivative was not added, exhibited a large amount of increase in viscosity and lowered dispersion stability. Moreover, the color patterns prepared in Comparative Examples 1 to 3 exhibited inferior heat fastness.

Example 24

(Preparation of Green Pigment Dispersion Composition G1)

A mixture of the following composition was mixed and dispersed by a bead mill for 2 hours, thereby preparing a green pigment dispersion composition G1.

—Composition—

| | |
|---|---|
| Mixture of Pigment Green 36 (PG36) and Pigment Yellow 139(PY139) (mass ratio [PG36/PY139] = 100/55): | 12.60 parts |
| Dispersant (trade name: DISPERBYK 2001, manufactured by BYK Japan K.K.): | 11.00 parts |
| Propylene glycol monomethyl ether acetate (PGMEA) | 80.29 parts |

(Preparation of Blue Pigment Dispersion Composition B1)

A mixture of the following composition was mixed and dispersed by a bead mill for 2 hours, thereby preparing a blue pigment dispersion composition B1.

—Composition—

| | |
|---|---|
| Mixture of Pigment Blue 15:6 (PB15:6) and Pigment Violet 23 (PV23) (mass ratio [PB15:6/PV23] = 100/25): | 14.00 parts |
| Dispersant (trade name: DISPERBYK 2001, manufactured by BYK Japan K.K.): | 10.10 parts |
| Propylene glycol monomethyl ether acetate (PGMEA) | 76.40 parts |

(Preparation of Green Colored Curable Composition G2)

A green colored curable composition G2 was prepared in a similar manner to the preparation of the red colored curable composition R in Example 1, except that the pigment dispersion composition P was changed to the green pigment dispersion composition G1.

(Preparation of Blue Colored Curable Composition B2)

A blue colored curable composition B2 was prepared in a similar manner to the preparation of the red colored curable composition R in Example 1, except that the pigment dispersion composition P was changed to the blue pigment dispersion composition B1.

(Fabrication of Full-Color Filter)

The green colored curable composition G2 as prepared in the above process was applied to an 8-inch silicon wafer (solid-state image sensor substrate) with a device formed thereon and hexamethyldisylazane was previously sprayed, on the surface to which the device was formed, whereby a photocurable coating film. Then, the silicon wafer was heated (prebaked) for 120 seconds using a hot plate at 100° C. such that the dried thickness of the coating film was 1.0 μm. Subsequently, the assembly was exposed to light at a wavelength of 365 nm with an exposure amount of 150 mJ/cm$^2$, through a Bayer pattern mask having a size of 1.0 μm square, using an i-line stepper exposure apparatus (FPA-3000i5+, trade name, manufactured by Canon, Inc.) Thereafter, the silicon wafer with the exposed coating film was placed on a horizontal rotary table of a spin-shower developing machine (trade name, DW-30, manufactured by Chemitronics Co., Ltd.) and subjected to paddle development at 23° C. for 180 seconds using a 40% diluted solution of a developer (CD-2000, trade name, manufactured by Fuji Film Electronics Materials Co., Ltd.) The silicon wafer was further heated with a hot plate at 200° C. for 8 minutes, thereby forming a color pattern on the silicon wafer.

The above process was repeated by using the red colored curable composition R prepared in Example 1 and the blue colored curable composition B2, respectively, except that the exposure was performed by using an island pattern mask having a size of 1.0 μm square. A color filter having patterns of red, blue and green was thus obtained.

Example 25

(Fabrication of Solid-State Image Sensor)

A solid-state image sensor was fabricated by using the color filter obtained in Example 24. It was proved that the solid-state image sensor exhibited favorable heat fastness and favorable spectral properties.

All publications, patent applications, and technical standards mentioned in this specification are herein incorporated by reference to the same extent as if each individual publication, patent application, or technical standard was specifically and individually indicated to be incorporated by reference.

This application claims priority under 35 USC 119 from Japanese Patent Applications No. 2010-7490 filed Jan. 15, 2010 and No. 2010-102596 filed Apr. 27, 2010, the disclosure of which is incorporated by reference herein.

The invention claimed is:

1. A pigment dispersion composition comprising an azo pigment represented by formula (1), in which the azo pigment represented by formula (1) does not have an ionic hydrophilic group, an azo pigment derivative and a dispersant:

(1)

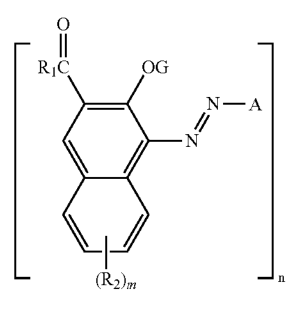

wherein in formula (1), G represents a hydrogen atom, an aliphatic group, an aryl group or a heterocyclic group; $R_1$ represents an amino group, an aliphatic oxy group, an aliphatic group, an aryl group or a heterocyclic group; $R_2$ represents a substituent; A represents any one of the following formulae (A-1) to (A-32); m represents an integer of 0 to 5; and n represents an integer of 1 to 4, wherein:

when n=2, the azo pigment is a dimer formed via $R_1$, $R_2$, A or G; when n=3, the azo pigment is a a trimer formed via $R_1$, $R_2$, A or G; and when n=4, the azo pigment is a tetramer formed via $R_1$, $R_2$, A or G:
(A-1)
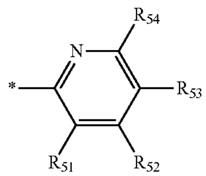
(A-2)
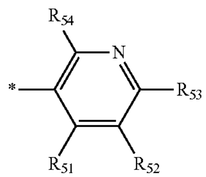
(A-3)
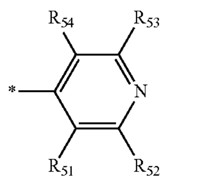
(A-4)
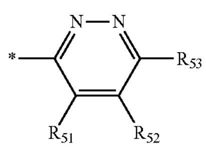
(A-5)
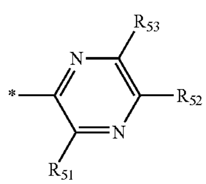
(A-6)
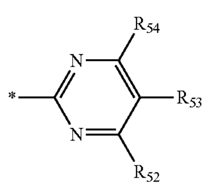
(A-7)
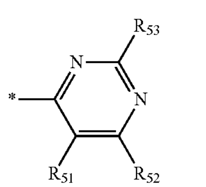
(A-8)
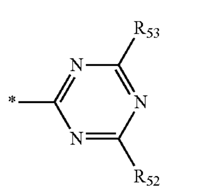
-continued
(A-9)
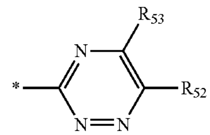
(A-10)
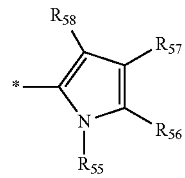
(A-11)
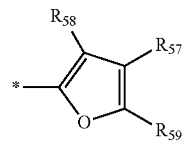
(A-12)
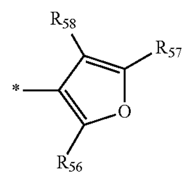
(A-13)
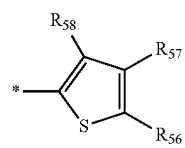
(A-14)
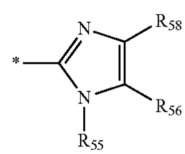
(A-15)
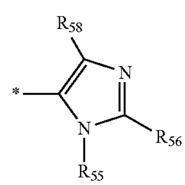
(A-16)
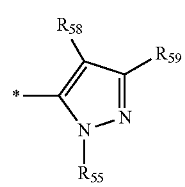
(A-17)
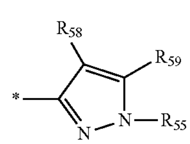

-continued (A-18)

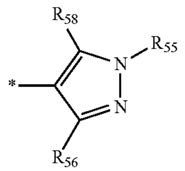

(A-19)

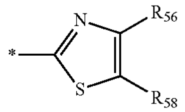

(A-20)

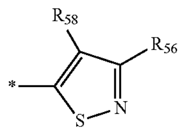

(A-21)

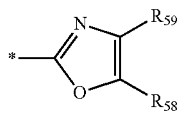

(A-22)

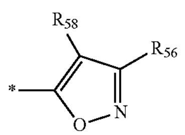

(A-23)

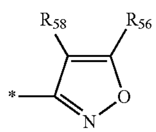

(A-24)

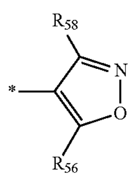

(A-25)

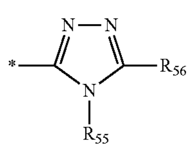

(A-26)

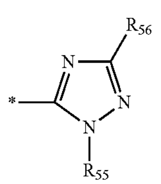

(A-27)

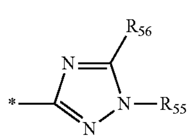

(A-28)

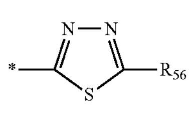

-continued (A-29)

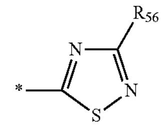

(A-30)

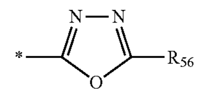

(A-31)

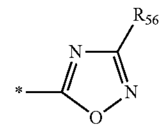

(A-32)

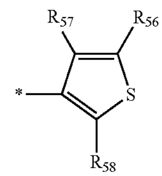

wherein in formulae (A-1) to (A-32), $R_{51}$ to $R_{59}$ each independently represents a hydrogen atom or a substituent that may be bonded to an adjacent substituent to form a 5- or 6-membered ring, and * represents a position to be bonded to the azo group in formula (1).

2. The pigment dispersion composition according to claim 1, wherein the azo pigment represented by formula (1) comprises an azo pigment represented by formula (2), in which the azo pigment represented by formula (2) does not have an ionic hydrophilic group:

(2)

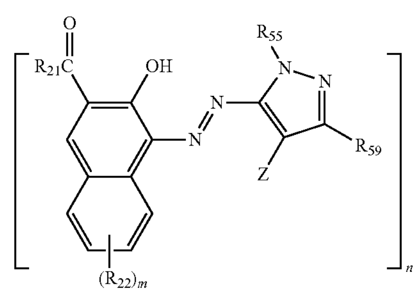

wherein in formula (2), $R_{21}$ represents an amino group, an aliphatic oxy group, an aliphatic group, an aryl group or a heterocyclic group; $R_{22}$ represents a substituent; $R_{55}$ and $R_{59}$ each independently represents a hydrogen atom or a substituent; m represents an integer of 0 to 5; n represents an integer of 1 to 4; and Z represents an electron-withdrawing group having a Hammett's σp value of 0.2 or more, wherein:

when n=2, the azo pigment is a dimer formed via $R_{21}$, $R_{22}$, $R_{55}$, $R_{59}$ or Z; when n=3, the azo pigment is a trimer formed via $R_{21}$, $R_{22}$, $R_{55}$, $R_{59}$ or Z; and when n=4, the azo pigment is a tetramer formed via $R_{21}$, $R_{22}$, $R_{55}$, $R_{59}$ or Z.

3. The pigment dispersion composition according to claim 1, wherein the dispersant comprises a polymer compound including at least one selected from repeating units represented by formula (I) or formula (II):

(I)

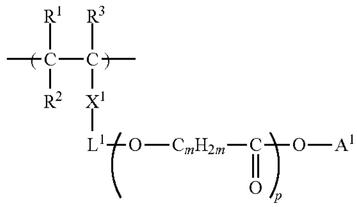

(II)

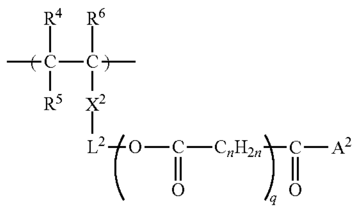

wherein in formula (I) and formula (II), $R^1$ to $R^6$ each independently represents a hydrogen atom or a monovalent organic group; $X^1$ and $X^2$ each independently represents —CO—, —C(=O)O—, —CONH—, —OC(=O)— or a phenylene group; $L^1$ and $L^2$ each independently represents a single bond or a divalent organic linking group; $A^1$ and $A^2$ each independently represents a monovalent organic group; m and n each independently represents an integer of 2 to 8; and p and q each independently represents an integer of 1 to 100.

4. The pigment dispersion composition according to claim 3, wherein the polymer compound has an acid value of from 50 mgKOH/g to 200 mgKOH/g.

5. The pigment dispersion composition according to claim 1, wherein the azo pigment represented by formula (1) is micronized by solvent salt milling.

6. The pigment dispersion composition according to claim 1, further comprising a pigment having a color hue selected from red, yellow, orange or violet.

7. A colored curable composition comprising the pigment dispersion composition according to claim 1, a photopolymerization initiator and a polymerizable compound.

8. The colored curable composition according to claim 7, wherein the photopolymerization initiator comprises an oxime photopolymerization initiator.

9. A method of producing a color filter for a solid-state image sensor, the method comprising;

forming a colored curable composition layer by applying the colored curable composition according to claim 7 to a support;

exposing the colored curable composition layer to light via a mask; and forming a color pattern by developing the exposed colored curable composition layer.

10. A color filter for a solid-state image sensor produced by the method according to claim 9.

11. A solid-state image sensor comprising the color filter according to claim 10.

* * * * *